(12) United States Patent
Ahn et al.

(10) Patent No.: US 11,251,196 B2
(45) Date of Patent: Feb. 15, 2022

(54) INTEGRATED CIRCUIT DEVICE AND METHOD OF FABRICATING THE SAME

(71) Applicant: Samsung Electronics Co., Ltd., Suwon-si (KR)

(72) Inventors: Jaeho Ahn, Hwasung-si (KR); Woosung Yang, Gwangmyeong-si (KR); Joonsung Lim, Hwasung-si (KR); Sungmin Hwang, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 67 days.

(21) Appl. No.: 16/749,255

(22) Filed: Jan. 22, 2020

(65) Prior Publication Data

US 2020/0365617 A1   Nov. 19, 2020

(30) Foreign Application Priority Data

May 17, 2019  (KR) ......................... 10-2019-0058311

(51) Int. Cl.
*H01L 27/11582* (2017.01)
*H01L 27/11556* (2017.01)
(Continued)

(52) U.S. Cl.
CPC ...... *H01L 27/11582* (2013.01); *H01L 23/528* (2013.01); *H01L 23/5226* (2013.01); *H01L 24/32* (2013.01); *H01L 24/83* (2013.01); *H01L 25/0657* (2013.01); *H01L 27/11526* (2013.01); *H01L 27/11556* (2013.01); *H01L 27/11573* (2013.01); *H01L 2224/32225* (2013.01); *H01L 2225/06541* (2013.01); *H01L 2225/06548* (2013.01); *H01L 2225/06572* (2013.01)

(58) Field of Classification Search
CPC ........... H01L 27/11582; H01L 23/5226; H01L 25/0657
See application file for complete search history.

(56) References Cited

U.S. PATENT DOCUMENTS 8,053,829 B2   11/2011  Kang et al.
8,236,652 B2   8/2012   Kim
(Continued)

FOREIGN PATENT DOCUMENTS

KR   10-2018-0095499 A   8/2018

*Primary Examiner* — Ratisha Mehta
(74) *Attorney, Agent, or Firm* — Harness, Dickey & Pierce, P.L.C.

(57) ABSTRACT

An integrated circuit device includes: a lower memory stack including a plurality of lower word lines located on a substrate, an upper memory stack located on the lower memory stack and including a plurality of upper word lines, at least one first lower interconnection layer extending in a horizontal direction at a first vertical level between the lower memory stack and the upper memory stack, and configured to be electrically connected to at least one lower word line selected from the plurality of lower word lines, a separate insulating film covering at least one first lower interconnection layer, and at least one first upper interconnection layer extending in the horizontal direction at a second vertical level higher than the upper memory stack, and configured to be electrically connected to at least one upper word line selected from the upper word lines.

20 Claims, 36 Drawing Sheets

(51) Int. Cl.
*H01L 23/528* (2006.01)
*H01L 27/11526* (2017.01)
*H01L 23/522* (2006.01)
*H01L 25/065* (2006.01)
*H01L 23/00* (2006.01)
*H01L 27/11573* (2017.01)

(56) References Cited

U.S. PATENT DOCUMENTS

| | | |
|---|---|---|
| 8,828,884 B2 | 9/2014 | Lee et al. |
| 9,000,510 B2 | 4/2015 | Hong |
| 9,230,987 B2 | 1/2016 | Pachamuthu et al. |
| 9,627,403 B2 | 4/2017 | Liu et al. |
| 9,911,750 B2 | 3/2018 | Lee |
| 10,074,667 B1 * | 9/2018 | Higashi ............ H01L 27/11553 |

* cited by examiner

INTEGRATED CIRCUIT DEVICE AND METHOD OF FABRICATING THE SAME

CROSS-REFERENCE TO RELATED APPLICATION

This application claims the benefit of Korean Patent Application No. 10-2019-0058311, filed on May 17, 2019, in the Korean Intellectual Property Office, the disclosure of which is incorporated herein in its entirety by reference.

BACKGROUND

Inventive concepts relate to an integrated circuit device and/or a method of fabricating the same, and more particularly, to an integrated circuit device including a nonvolatile vertical memory device and/or a method of fabricating the same.

As information communication apparatuses become more multifunctional, there is a desire and/or a need for increased capacity and integration of integrated circuit devices including memory devices. With the reduction of the size of memory cells for higher integration, the operation circuits and wiring structures which are included in memory devices for operation and electrical connection of memory devices are becoming more complex. Accordingly, there is a desire and/or a need for an integrated circuit device including a memory device having improved electrical characteristics while improving the degree of integration.

SUMMARY

Inventive concepts provide an integrated circuit device and a method of fabricating the same, wherein in a vertical memory device, even when the number of word lines stacked is increased to obtain a higher degree of integration, and the number of contacts connected to the word lines and the number of interconnections are increased, the area the memory device occupies is reduced, and thus the area of a chip is reduced. This may enable a higher level of chip fabrication and/or a higher yield. Further, the degree of freedom of interconnection arrangement is improved, and even when the number of word lines stacked is increased, a simplified process may be performed without an increase in the difficulty of a process for contact formation.

According to some example embodiments of inventive concepts, there is provided an integrated circuit device comprising a substrate including a memory cell region and a connection region, a lower memory stack including a plurality of lower word lines on the memory cell region and the connection region of the substrate, the plurality of lower word lines extending in a horizontal direction parallel to a main surface of the substrate, the plurality of lower word lines overlapping each other in a vertical direction, an upper memory stack on the lower memory stack, the upper memory stack comprising a plurality of upper word lines overlapping each other in the vertical direction, at least one first lower interconnection layer on the connection region at a first vertical level between the lower memory stack and the upper memory stack, the at least one first lower interconnection layer extending in the horizontal direction, and configured to electrically connect to at least one lower word line selected from the plurality of lower word lines, a separate insulating film covering the at least one first lower interconnection layer such that an upper surface of the at least one first lower interconnection layer does not contact other conductors on the connection region, and at least one first upper interconnection layer on the connection region at a second vertical level higher than that of the upper memory stack, the at least one first upper interconnection layer extending, in the horizontal direction, the at least one first upper interconnection layer configured to be electrically connected to at least one upper word line selected from the plurality of upper word lines.

According to some example embodiments of inventive concepts, there is provided an integrated circuit device comprising a substrate including a memory cell region and a connection region, a peripheral circuit region spaced apart from the memory cell region and including a plurality of circuits, a lower memory stack including (i) a plurality of lower word lines on the memory cell region extending in a horizontal direction parallel to a main surface of the substrate, the plurality of lower word lines overlapping each other in a vertical direction, and (ii) a plurality of lower pad regions connected to the plurality of lower word lines and corresponding to a stepped lower connection portion on the connection region, an upper memory stack located above the lower memory stack on the memory cell region and including (i) a plurality of upper word lines extending in the horizontal direction and overlapping each other in the vertical direction, and (ii) a plurality of upper pad regions connected to the plurality of upper word lines and corresponding to a stepped upper connection portion on the connection region, a lower insulating film on the connection region, the lower insulating film covering the stepped lower connection portion, a plurality of lower contact plugs extending through the lower insulating film from the plurality of lower pad regions to a first vertical level, the first vertical level lower than the upper memory stack, and a plurality of first lower interconnection layers between the lower memory stack and the upper memory stack. At least one first lower interconnection layer selected from the plurality of first lower interconnection layers includes (i) a first local portion connected to at least one of the plurality of lower contact plugs and (ii) a second local portion connected to at least one of the plurality of circuits.

According to some example embodiments of inventive concepts, there is provided an integrated circuit device comprising a first substrate including a memory cell region and a connection region, a lower memory stack including (i) a plurality of lower word lines extending in a horizontal direction parallel to a main surface of the first substrate on the memory cell region, the plurality of lower word lines overlapping each other in a vertical direction, and (ii) a plurality of lower pad regions on the connection region, the plurality of lower pad regions connected to the plurality of lower word lines, and an upper memory stack on the lower memory stack, the upper memory stack including (i) a plurality of upper word lines on the memory cell region and overlapping each other in the vertical direction, and (ii) a plurality of upper pad regions connected to the plurality of upper word lines and located on the connection region. At least one first lower interconnection layer extends in the horizontal direction at a first vertical level between the lower memory stack and the upper memory stack on the connection region, at least one lower contact plug connects between at least one lower pad region selected from the plurality of lower pad regions and the at least one first lower interconnection layer, and a separate insulating film covers the at least one first lower interconnection layer such that an upper surface of the at least one first lower interconnection layer does not contact other conductors on the connection region.

According to some example embodiments of inventive concepts, there is provided a method of fabricating an integrated circuit device, the method comprising preparing a substrate, forming a lower memory stack including (i) a plurality of lower word lines extending in a horizontal direction parallel to a main surface of the substrate and overlapping each other in a vertical direction on the substrate, and (ii) a plurality of lower pad regions connected to the plurality of lower word lines, forming a plurality of lower contact plugs including a plurality of first lower contact plugs connected to a plurality of first lower pad regions selected from the plurality of lower pad regions, forming, on the substrate, a plurality of lower interconnection layers including a plurality of first lower interconnection layers extending in the horizontal direction at a first vertical level which is higher than the lower memory stack, the first lower interconnection layers connected to the plurality of first lower contact plugs, forming a separate insulating film on the plurality of lower interconnection layers, the separate insulating film covering the plurality of lower interconnection layers, forming an upper memory stack spaced apart from the lower memory stack in the vertical direction with the separate insulating film therebetween, the upper memory stack including (i) a plurality of upper word lines overlapping each other in the vertical direction, and (ii) a plurality of upper pad regions connected to the plurality of upper word lines, forming a plurality of upper contact plugs including a plurality of first upper contact plugs connected to the plurality of upper pad regions, and forming a plurality of upper interconnection layers extending in the horizontal direction at a second vertical level higher than the first vertical level, the plurality of upper interconnection layers connected to the plurality of lower contact plugs.

According to some example embodiments of inventive concepts, there is provided a method of fabricating an integrated circuit device, the method comprising: forming a lower memory stack on a substrate, the lower memory stack including (i) a plurality of lower word lines extending in a horizontal direction parallel to a main surface of the substrate and overlapping each other in a vertical direction, and (ii) a plurality of lower pad regions connected to the plurality of lower word lines, forming a plurality of lower contact plugs on the substrate, the plurality of lower contact plugs connected to the plurality of lower pad regions, forming, on the substrate, a plurality of lower interconnection layers extending in the horizontal direction at a first vertical level higher than the lower memory stack, and connected to the plurality of lower contact plugs, forming a separate insulating film covering the lower memory stack and the lower interconnection layers on the substrate, forming an upper memory stack including (i) a plurality of upper word lines on a bonding substrate, the plurality of upper word lines overlapping each other in the vertical direction, and (ii) a plurality of upper pad regions connected to the plurality of upper word lines, forming a plurality of upper contact plugs on the bonding substrate, the plurality of upper contact plugs connected to the plurality of upper pad regions, forming, on the bonding substrate, a plurality of upper interconnection layers extending in the horizontal direction at a second vertical level higher than the upper memory stack, and connected to the plurality of upper contact plugs, and bonding the separate insulating film and the bonding substrate to allow the lower memory stack and the upper memory stack to face each other with the bonding substrate therebetween.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF EXAMPLE EMBODIMENTS

Figure 1:
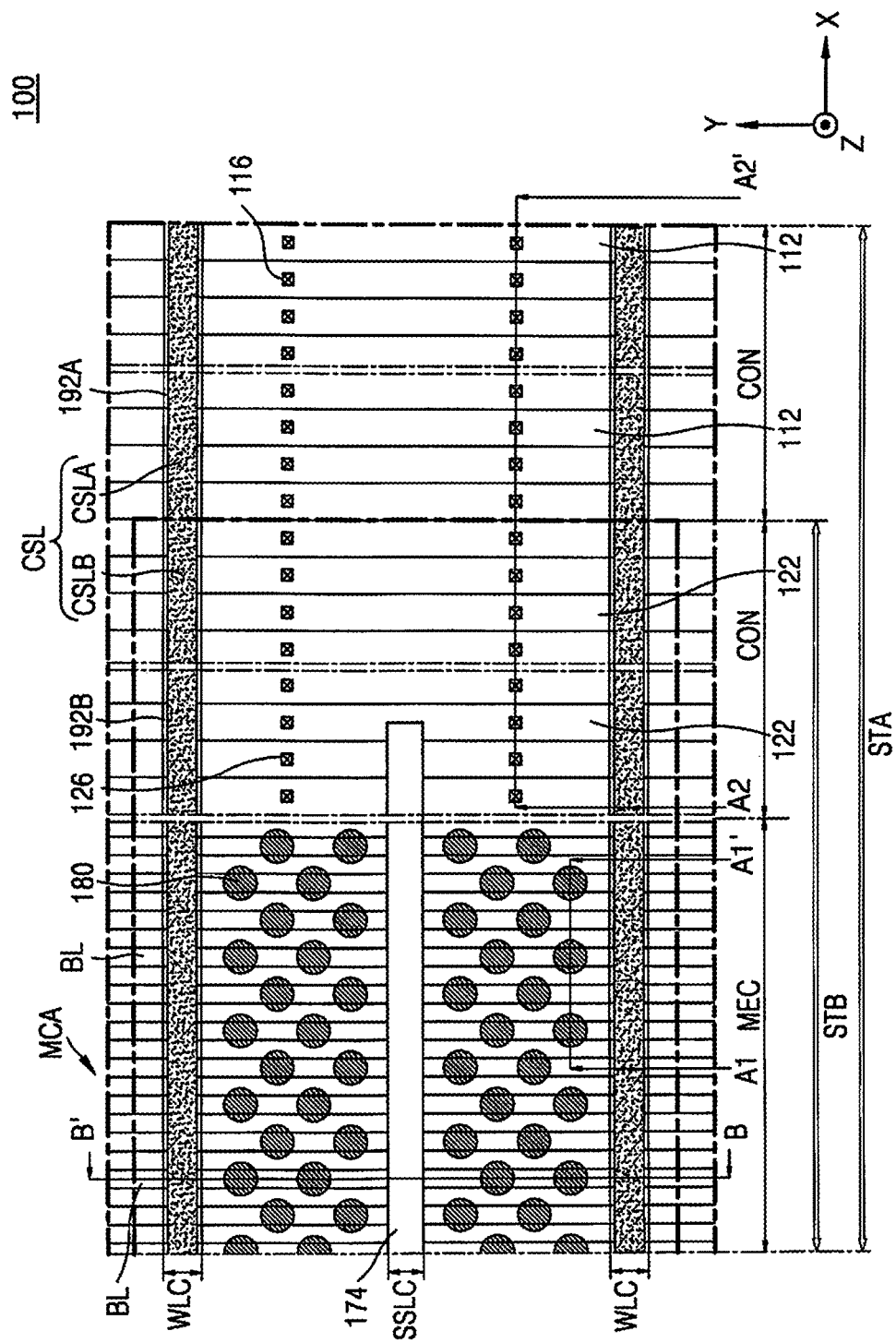
FIG. 1 shows a plan view of an integrated circuit device according to some example embodiments of inventive concepts, showing some components including major components thereof.
Figure 2A:
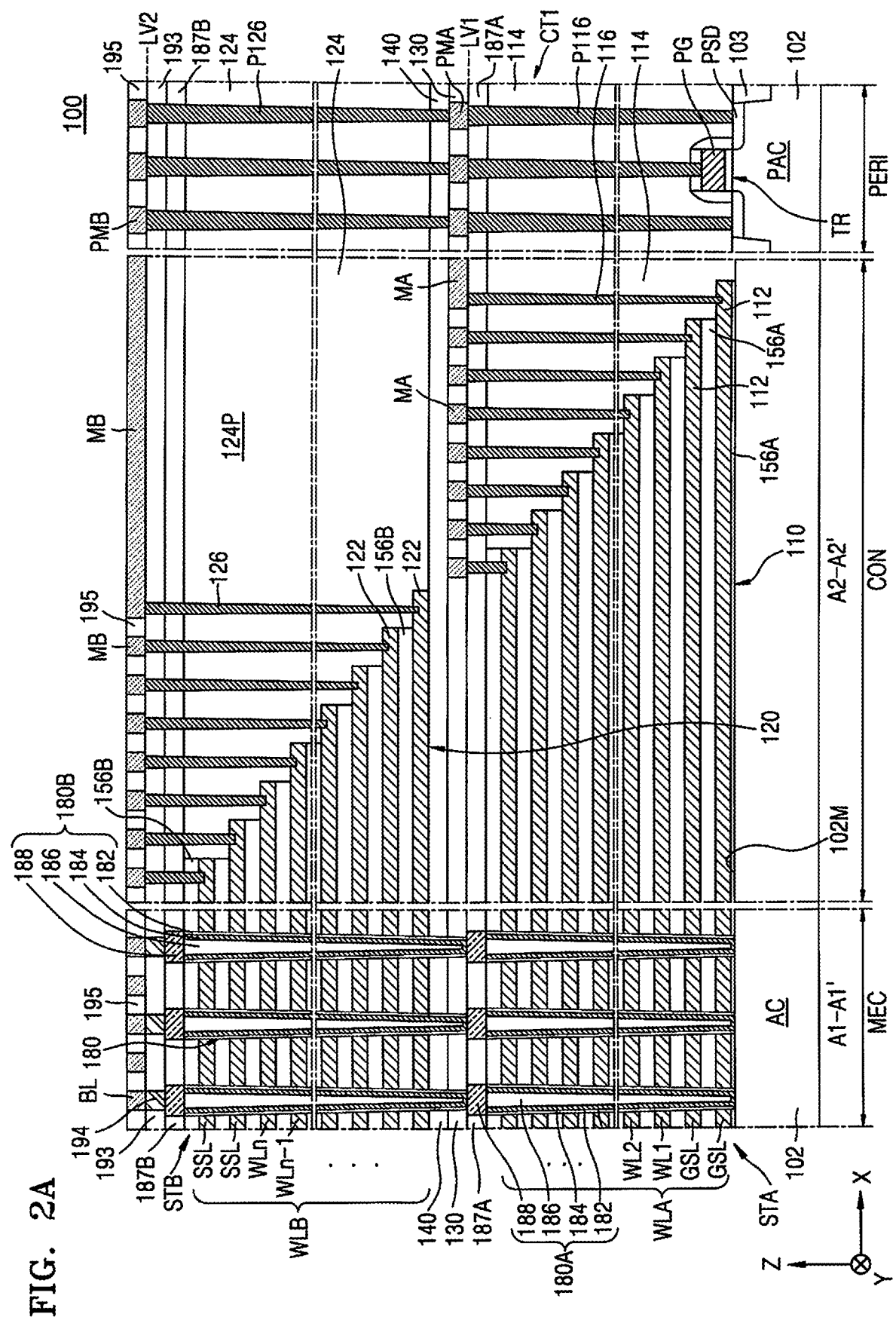
FIG. 2A shows cross-sectional views taken along line A1-A1' and line A2-A2', and a cross-sectional view of a portion of a peripheral circuit region of the integrated circuit device illustrated in FIG. 1.
Figure 2B:
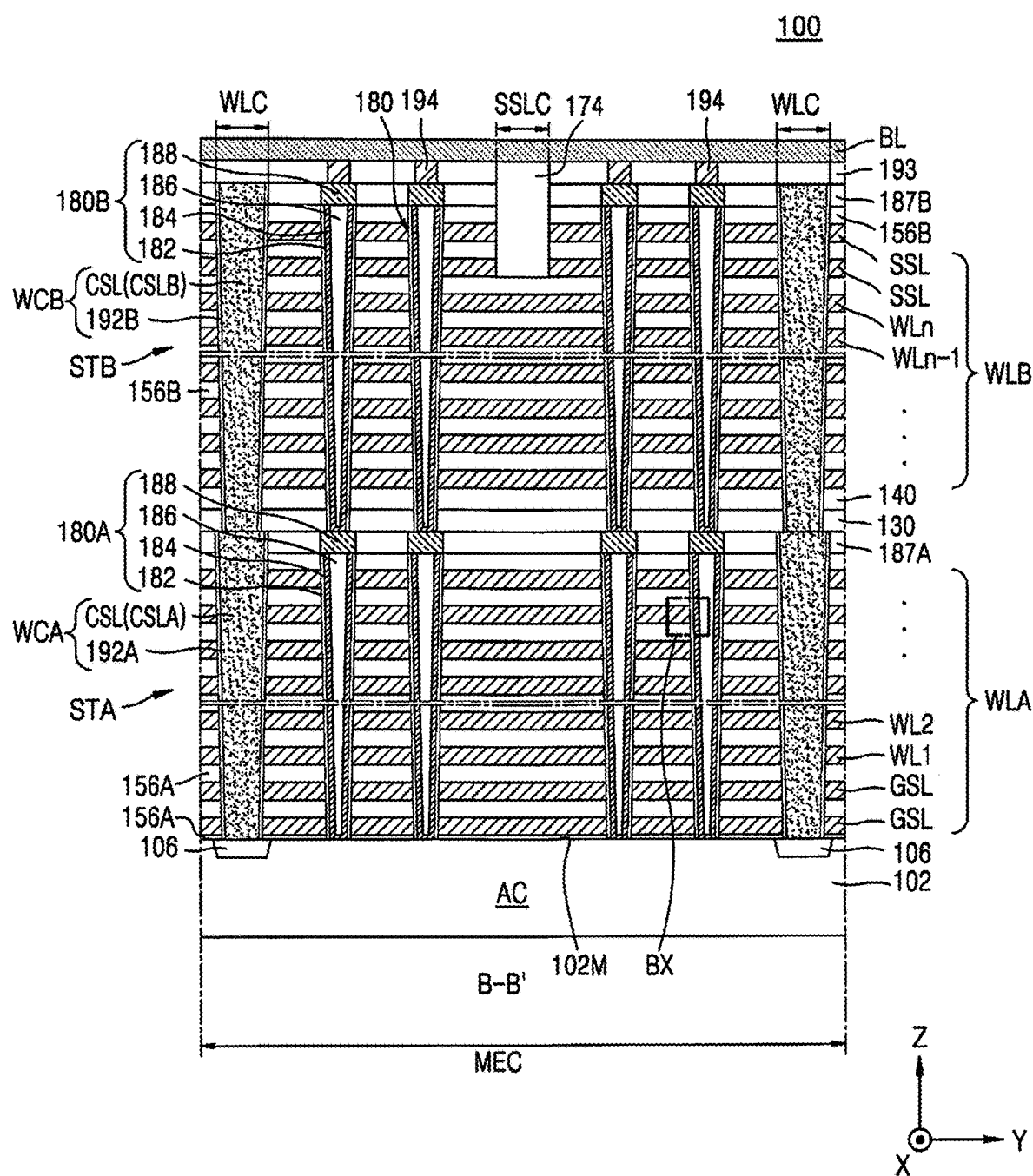
FIG. 2B shows a cross-sectional view taken along line B-B' of the integrated circuit device illustrated in FIG. 1.

FIG. 1 shows a plan view of an integrated circuit device 100 according to some example embodiments of inventive concepts, showing some components, including major components thereof. FIG. 2A shows a cross-sectional view taken along line A1-A1', line A2-A2', and a cross-sectional view of a portion of a peripheral circuit region PERI of the integrated circuit device of FIG. 1. FIG. 2B shows a cross-sectional view taken along line B-B' of FIG. 1.

Referring to FIGS. 1, 2A, and 2B, the integrated circuit device 100 includes a substrate 102 having a memory cell region MEC, a connection region CON, and a peripheral circuit region PERI. The substrate 102 may have a main surface 102M extending in a horizontal direction along the X-Y plane. The substrate 102 may include a semiconductor such as, but not limited to be, Si, Ge, and or SiGe. The substrate 102 may single-crystal and/or may be doped, e.g. lightly doped with boron. A memory cell array MCA may be formed on an active area AC of the memory cell region MEC.

The connection region CON may be arranged adjacent to an edge side of the memory cell region MEC. The memory cell region MEC may be spaced from the peripheral circuit region PERI with the connection region CON therebetween. Although FIGS. 1 and 2A show that the connection region CON is located only on one side of the memory cell region MEC, example embodiments are not limited thereto. For example, the connection region CON may be located on both sides of the memory cell region MEC in a first horizontal direction (X direction).

A lower memory stack STA may be located on the substrate 102. The lower memory stack STA may include a plurality of lower word lines WLA and a plurality of lower pad regions 112 connected to the lower word lines WLA. See FIG. 2A. The lower word lines WLA are located on the memory cell region MEC, extend in the horizontal direction parallel to a main surface 102M of the substrate 102, and overlap each other in a vertical direction (Z direction). For example, the lower word lines WLA may be sequentially stacked. The lower pad regions 112 are located on the connection region CON and constitute, or are included in, a stepped lower connection portion 110.

An upper memory stack STB is located on the lower memory stack STA. The upper memory stack STB includes a plurality of upper word lines WLB and a plurality of upper pad regions 122 connected to the upper word lines WLB. See FIG. 2A. The upper word lines WLB are located on the memory cell region MEC, extend in the horizontal direction parallel to the main surface 102M of the substrate 102, and overlap each other in the vertical direction (Z direction). For example, the upper word lines WLB may be sequentially stacked. A plurality of upper pad regions 122 are located on the connection region CON and constitute, or are included in, a stepped upper connection portion 120.

The lower memory stack STA may include 48, 64, or 98 lower word lines WLA, o and the upper memory stack STB may include 48, 64, or 98 upper word lines WLB, but the lower memory stack STA and the upper memory stack STB are not limited thereto. In some example embodiments, the sum of the number of lower word lines WLA and the number of upper word lines WLB may be at least 192, and may be any number between 2 and 192 inclusive. Furthermore in some example embodiments, the number of lower word lines WLA may be the same as, or different from, the number of upper word lines WLB.

The lower word lines WLA and the upper word lines WLB may include a plurality of word lines WL: WL1, WL2, through WLn-1, and WLn, at least one ground selection line GSL, and at least one string selection line SSL. Referring to FIGS. 2A and 2B, the lower word lines WLA and the upper word lines WLB include two ground selection lines GSL and two string selection lines SSL. However, inventive concepts are not limited thereto. The number of ground selection lines GSL may be the same as, or different from, the number of string selection lines SSL.

In the horizontal direction, the area occupied by the lower memory stack STA may be larger than the area occupied by the upper memory stack STB. For example, as illustrated in FIGS. 1 and 2A, in the horizontal direction, at least a portion of the stepped lower connection portion 110 may protrude further away from the memory cell region MEC than the stepped upper connection portion 120.

A plurality of word line cut regions WLC may extend in a first horizontal direction (X direction) parallel to the main surface 102M of the substrate 102. See FIGS. 1 and 2B. The word line cut regions WLC may define a width of each of the lower word lines WLA and the upper word lines WLB in a second horizontal direction (Y direction) perpendicular to the first horizontal direction (X direction). The lower word lines WLA and the upper word lines WLB may be repeatedly spaced apart from one another at regular intervals by the word line cut regions WLC.

The substrate 102 may have, e.g. may include, a plurality of common source regions 106 extending along the first horizontal direction (X direction). In some example embodiments, the common source regions 106 may be or may include impurity regions doped with a high concentration of n-type impurities. For example, the common source regions 106 may be doped with a high concentration of phosphorus (P) and/or arsenic (As). The common source regions 106 may each act as a source region for supplying current to vertical memory cells. On the common source regions 106, a plurality of common source lines CSL may extend along the first horizontal direction (X direction). The common source lines CSL may fill a portion of a word line cut region WLC on one side of each of the lower word lines WLA and the upper word lines WLB. Each of the common source lines CSL may include a lower common source line CSLA passing through the lower memory stack STA and an upper common source line CSLB passing through the upper memory stack STB. See FIG. 2B. Within the word line cut region WLC, the lower common source line CSLA may be surrounded by a lower insulating spacer 192A and the upper common source line CSLB may be surrounded by an upper insulating spacer 192B. The lower common source line CSLA and the lower insulating spacer 192A may constitute, or be included in, a lower word line cut structure WCA passing through the lower memory stack STA, and the upper common source line CSLB and the upper insulating spacer 192B may constitute an upper word line cut structure WCB passing through the upper memory stack STB. A lower surface of the upper word line cut structure WCB may contact an upper surface of the lower word line cut structure WCA. In the second horizontal direction (Y direction), the width of the lower surface of the upper word line cut structure WCB may be smaller than the width of the upper surface of the lower word line cut structure WCA. Either or both of the lower word line cut structure WCB and the upper word line cut structure WCB may taper in the vertical direction (Z direction).

In the second horizontal direction (Y direction), two neighboring string selection lines SSL may be spaced apart with a string selection line cut area SSLC therebetween. See FIG. 2B. The string selection line cut area SSLC may be filled with an insulating film 174. The insulating film 174 may include an oxide film, a nitride film, or a combination thereof. Alternatively or additionally, in some example embodiments, at least a portion of the string selection line cut area SSLC may be filled with an air gap.

The lower word lines WLA and the upper word lines WLB may each include a metal, a metal silicide, an impurity-doped semiconductor, or a combination thereof. For example, the lower word lines WLA and the upper word lines WLB may each include metal, such as tungsten, nickel, cobalt, tantalum, and/or the like; metal silicide, such as tungsten silicide, nickel silicide, cobalt silicide, tantalum silicide, and/or the like; a doped polysilicon; or a combination thereof. The lower word lines WLA and the upper word lines WLB may include the same material and/or may include different material.

A pair of insulating films 156A and 56B may be located between the substrate 102 and the ground selection line GSL, between a pair of ground selection lines GSL, from among the word lines WL: WL1, WL2 through WLn-1, WLn, and between a pair of the string selection lines SSL. The insulating films 156A and 156B may include insulating film 156A constituting, or included in, the lower memory stack STA and insulating film 156B constituting, or included in, the upper memory stack STB. From among the insulating films 156A constituting (or included in) the lower memory stack STA, an insulating film that is closest to the substrate 102 may have a smaller thickness than the other insulating films. From among the insulating films 156B constituting (or included in) the upper memory stack STB, an insulating film that is farthest from the substrate 102 may cover an upper surface of one of the pair of string selection lines SSL which is farthest from the substrate 102. Each of the insulating films 156A and 156B may include silicon oxide, silicon nitride, and/or SiON. The insulating films 156A and 156B may include the same material and/or different material.

An interlayer insulating film 130 and a separate insulating film 140 may be located between the lower memory stack STA and the upper memory stack STB. The interlayer insulating film 130 and the separate insulating film 140 may each include a silicon oxide film. The interlayer insulating film 130 and the separate insulating film 140 may include the same material and/or different material.

On the memory cell region MEC, a plurality of channel structures 180 may extend through the lower word lines WLA, the interlayer insulating film 130, the separate insulating film 140, the upper word lines WLB, and the insulating films 156A and 156B in the vertical direction (Z direction). The channel structures 180 may be spaced apart from one another at intervals along the X and Y directions.

The channel structures 180 may each include a lower channel structure 180A passing the lower word lines WLA and an upper channel structure 180B passing through the upper word lines WLB. The lower channel structure 180A and the upper channel structure 180B may each include a gate dielectric film 182, a channel region 184, a buried insulating film 186, and a drain region 188, respectively. The gate dielectric film 182, the channel region 184, the buried insulating film 186, and the drain region 188 in the lower channel structure 180A may each respectively include the same and/or different material than the gate dielectric film 182, the channel region 184, the buried insulating film 186, and the drain region in the upper channel structure 180B. The channel region 184 may include doped polysilicon and/or undoped polysilicon. The channel region 184 may have a cylindrical shape. The inner space of the channel region 184 may be filled with the buried insulating film 186. The buried insulating film 186 may include an insulating material. For example, the buried insulating film 186 may include silicon oxide, silicon nitride, SION, or a combination thereof. In some example embodiments, the buried insulating film 186 may be skipped, and in this case, the channel region 184 may have a pillar structure with an empty inner space. The drain region 188 may include doped polysilicon, metal, conductive metal nitride, or a combination thereof. Examples of metals that may constitute the drain region 188 include tungsten, nickel, cobalt, tantalum, and/or the like.

The drain regions 188 constituting, or included in, the lower channel structure 180A are insulated each other by a lower intermediate insulating film 187A, and the drain regions 188 constituting, or included in, the upper channel structure 180B are insulated each other by an upper intermediate insulating film 187B. The lower intermediate insulating film 187A and the upper intermediate insulating film 187B may each include an oxide film, a nitride film, or a combination thereof. A lower surface of the upper channel structure 180B may contact an upper surface of the lower channel structure 180A. In the horizontal direction (X direction and/or Y direction), the width of the lower surface of the upper channel structure 180B may be smaller than the width of the upper surface of the lower channel structure 180A.

Referring to FIGS. 2A and 2B, each of the lower channel structure 180A and the upper channel structure 180B include the gate dielectric film 182 and the gate dielectric film 182 extends along the channel region 184 in the vertical direction (Z direction). However, inventive concepts are not limited thereto, and various modifications and variations can be made to the embodiments provided herein.

Figure 3A:
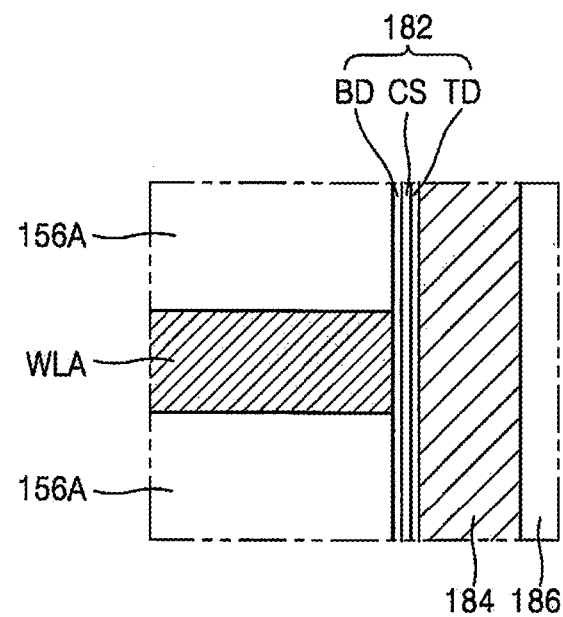
FIGS. 3A to 3D show cross-sectional views of a gate dielectric film included in an integrated circuit device according to some example embodiments of inventive concepts to explain various structures of the gate dielectric film.

FIG. 3A is a cross-sectional view for explaining the gate dielectric film 182 illustrated in FIGS. 2A and 2B in detail, and an enlarged view of a region indicated by "BX" in FIG. 2B.

Referring to FIG. 3A, the gate dielectric film 182 may have a structure including a tunneling dielectric film TD, a charge storage film CS, and a blocking dielectric film BD, which are sequentially formed on the channel region 184. The relative thicknesses of the tunneling dielectric film TD, the charge storage film CS, and the blocking dielectric film BD are not limited to those illustrated in FIG. 3A, and may be variously modified.

The tunneling dielectric film TD may include at least one of silicon oxide, hafnium oxide, aluminum oxide, zirconium oxide, tantalum oxide, or the like. The charge storage film CS may be or correspond to a region where electrons which have passed through the tunneling dielectric film TD from the charge storage film CS are stored, and may include at least one of silicon nitride, boron nitride, silicon boron nitride, or doped polysilicon. The blocking dielectric film BD may include at least one of silicon oxide, silicon nitride, or a metal oxide that has greater permittivity than silicon oxide. The metal oxide may include at least one of hafnium oxide, aluminum oxide, zirconium oxide, tantalum oxide, or a combination thereof.

Figure 3B:
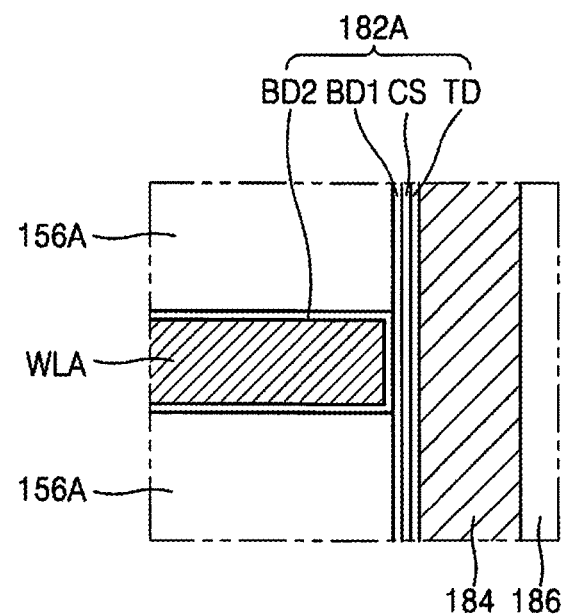
Figure 3C:
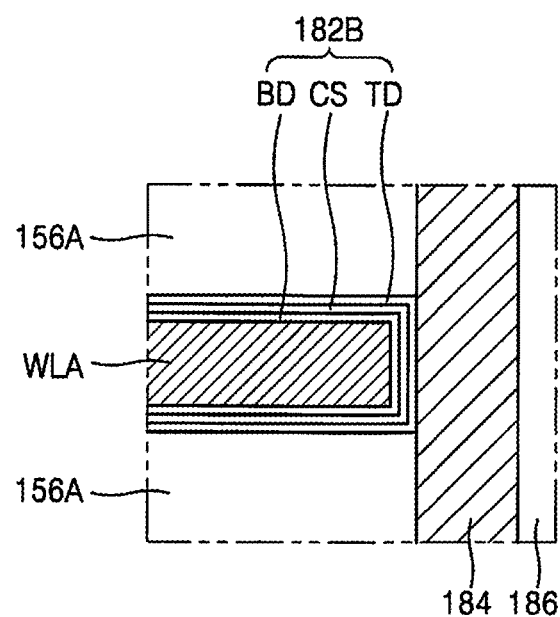
Figure 3D:
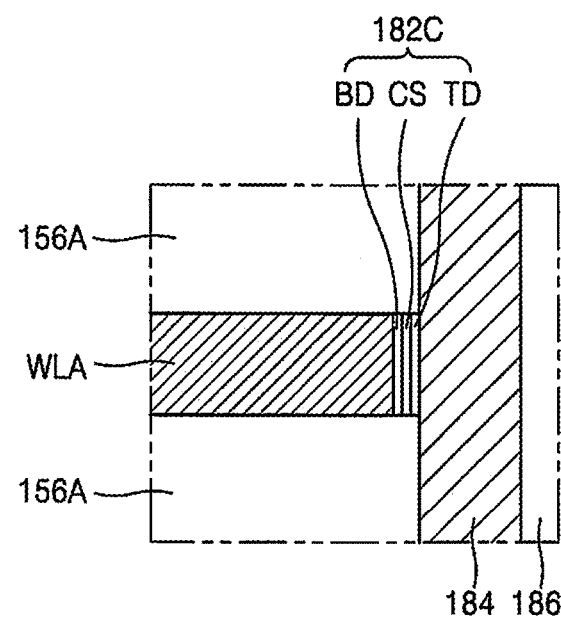

FIGS. 3B to 3D are cross-sectional views illustrating example structures of gate dielectric films 182A, 182B, and 182C which can be used in place of the gate dielectric film 182 illustrated in FIG. 3A. Gate dielectric films in the lower channel structures 180A may correspond to one of the gate dielectric films 182, 182A, 182B, and 182C, and gate dielectric film in the upper channel structures 180B may correspond to one of the gate dielectric films 182, 182A, 182B, and 182C that is the same, or different, than that of the lower channel structures 180A.

In some example embodiments, the integrated circuit device 100 may include the gate dielectric film 182A as illustrated in FIG. 3B instead of, or in addition to, the gate dielectric film 182. The gate dielectric film 182A has substantially the same structure as the gate dielectric film 182 illustrated in FIG. 3A. However, the gate dielectric film 182A includes a first blocking dielectric film BD1 and a second blocking dielectric film BD2 instead of the blocking dielectric film BD. The first blocking dielectric film BD1 may extend as being parallel to the channel region 184 and the second blocking dielectric film BD2 may surround the lower word line WLA. The first blocking dielectric film BD1 and the second blocking dielectric film BD2 may each include at least one of silicon oxide, silicon nitride, or a metal oxide. For example, the first blocking dielectric film BD1 may include a silicon oxide film and the second blocking dielectric film BD2 may include a metal oxide film having greater permittivity than a silicon oxide film, and may not include a silicon oxide film.

In some example embodiments, the integrated circuit device 100 may include the gate dielectric film 182B as illustrated in FIG. 3C instead of, or in addition to, the gate dielectric film 182. The gate dielectric film 182B may be formed cover the surface of the lower word line WLA facing the channel region 184 and the surface of the lower word line WLA facing the insulating films 156A and 156B. The gate dielectric film 182B may include the tunneling dielectric film TD, the charge storage film CS, and the blocking dielectric film BD, which are sequentially formed on the channel region 184.

In some example embodiments, the integrated circuit device 100 may include the gate dielectric film 182C as illustrated in FIG. 3D instead of, or in addition to, the gate dielectric film 182. The gate dielectric film 182C may cover the sidewall of the lower word line WLA between the lower word lines WLA and the channel region 184, and may not cover the lower and upper surfaces of the lower word lines WLA. The gate dielectric film 182C may include the tunneling dielectric film TD, the charge storage film CS, and the blocking dielectric film BD, which are sequentially formed on the channel region 184, e.g. which are conformally formed on the channel region 184.

The configuration and shape of a gate dielectric film included in integrated circuit devices according to some example embodiments of inventive concepts are not limited to the gate dielectric films 182, 182A, 182B, and 182C illustrated in FIGS. 3A to 3D, and various changes and modifications could be made thereto within the scope of inventive concepts.

Referring to FIGS. 1, 2A, and 2B, on the connection region CON, the width of the lower pad regions 112 constituting, or include in, the stepped lower connection portion 110 and the width of the upper pad regions 122 constituting, or included in, the stepped upper connection portion 120 may be gradually decreased as being away from the substrate 102 in the horizontal direction.

In some example embodiments, on the connection region CON, a plurality of dummy channel structures (not shown) may be located on the stepped lower connection portion 110 and the stepped upper connection portion 120. The dummy channel structures may support the edge portions of the lower word lines WLA and the upper word lines WLB, and the lower pad regions 112 and the upper pad regions 122 to prevent or reduce the likelihood of the occurrence of undesirable structural deformation such as bending and/or breakage.

On the memory cell region MEC, a plurality of bit lines BL may be arranged above the upper memory stack STB. A plurality of bit line contact pads 194 may be located between the channel structures 180 and the bit lines BL. The drain region 188 of each of the upper channel structure 180B may be connected to a corresponding one of the bit lines BL through a corresponding bit line contact pad of the bit line contact pads 194. The bit line contact pads 194 may be insulated from each other by an insulating film 193. The bit lines BL may be insulated from each other by an upper interlayer insulating film 195. The bit line contact pads 194 and the bit lines BL may each include a metal, a metal nitride, or a combination thereof. For example, the bit line contact pads 194 and the bit lines BL may each include at least one of tungsten, titanium, tantalum, copper, aluminum, titanium nitride, tantalum nitride, tungsten nitride, or a combination thereof. The bit line contact pads 194 and the bit lines BL may include the same material and/or may include different material. The insulating film 193 and the upper interlayer insulating film 195 may each include an oxide film, a nitride film, or a combination thereof. The insulating film 193 and the upper interlayer insulating film 195 may include the same material and/or different material.

On the connection region CON, a lower insulating film 114 covering the stepped lower connection portion 110 is located between the substrate 102 and the lower intermediate insulating film 187A. The lower insulating film 114 may cover the lower pad regions 112 and the insulating film 156A.

On the connection region CON, an upper insulating film 124 covering the stepped upper connection portion 120 is located between the separate insulating film 140 and the upper intermediate insulating film 187B. The upper insulating film 124 may cover the upper pad regions 122 and the insulating film 156B. The lower insulating film 114 and the upper insulating film 124 may include the same material and/or different material.

On the connection region CON, a plurality of lower contact plugs 116 may be connected to the stepped lower connection portion 110. The lower contact plugs 116 may extend away from the substrate 102 up to a first vertical level LV1, through the lower insulating film 114 and the lower intermediate insulating film 187A from the lower pad regions 112, wherein the first vertical level LV1 is higher than the lower memory stack STA and lower than the upper memory stack STB. The lower contact plug 116 connected to one of the lower pad regions 112 which is farthest from the substrate 102 may extend from the lower pad regions 112 to the first vertical level LV1 through the insulating film 156A and the lower intermediate insulating film 187A. The term "level" used herein refers to a distance along the vertical direction (Z direction or −Z direction) from the upper surface of the substrate 102.

A plurality of lower interconnection layers MA may be formed on the lower contact plugs 116. The lower interconnection layer MA may be connected to the lower contact plugs 116 and may extend in the horizontal direction at the first vertical level LV1. The lower interconnection layer MA may be configured to electrically connect to at least one lower word line WLA of the lower word lines WLA through the lower contact plugs 116. On the connection region CON, the lower interconnection layers MA may be insulated from each other by the interlayer insulating film 130.

As illustrated in FIG. 2A, the upper surface of each of the lower interconnection layers MA may be covered with the separate insulating film 140 so as not to contact other conductors. The separate insulating film 140 may continuously extend in the horizontal direction (X direction and/or Y direction) in local regions where the separate insulating film 140 overlaps vertically with the lower interconnection layer MA.

On the connection region CON, a plurality of upper contact plugs 126 may be connected to the stepped upper connection portion 120. The upper contact plugs 126 may extend away from the substrate 102, from the upper pad regions 122 up to a second vertical level LV2 through the upper insulating film 124, the upper intermediate insulating film 187B, and the insulating film 193, wherein the second vertical level LV2 is higher than the upper memory stack STB. The upper contact plug 126 connected to one of the upper pad regions 122 which is farthest from the substrate 102 may extend from the upper pad region 122 to the second vertical level LV2 through the insulating film 156B, the upper intermediate insulating film 187B, and the insulating film 193. The second vertical level LV2 may be at a higher level than the level of the uppermost surface of the channel structures 180 passing through the upper memory stack STB. A lower surface of each of the upper contact plugs 126 may be at a higher level than the lower surface of one of the upper word lines WLB which is closest to the lower memory stack STA. All of the upper contact plugs 126 passing through the upper insulating film 124 may not pass through the separate insulating film 140 in the vertical direction (Z direction). None of the upper contact plugs 126 passing through the upper insulating film 124 may be connected to one of the lower interconnection layers MA extending at the first vertical level LV1.

On the connection region CON, the upper interconnection layers MB may be formed on the upper contact plugs 126. The upper interconnection layers MB may be connected to the upper contact plugs 126 and may extend in the horizontal direction (X direction and/or Y direction) at the second vertical level LV2. The upper interconnection layers MB may be electrically connected to at least one upper word lines WLB selected from the upper word lines WLB through the upper contact plugs 126. The upper interconnection layers MB on the connection region CON may be located at the same level as the bit lines BL on the memory cell region MEC. On the connection region CON, the upper interconnection layers MB may be insulated from each other by the upper interlayer insulating film 195.

Each of the lower contact plugs 116, the lower interconnection layers MA, the upper contact plugs 126, and the upper interconnection layers MB may include at least one of tungsten, titanium, tantalum, copper, aluminum, titanium nitride, tantalum nitride, tungsten nitride, or a combination thereof.

As illustrated in FIGS. 1 and 2A, the lower interconnection layers MA may be formed on the lower contact plugs 116 extending from a portion of the stepped lower connection portion 110 which protrudes in a direction in which the stepped lower connection portion 110 is farther than the stepped upper connection portion 120 from the memory cell region MEC in the horizontal direction. Therefore, the lower interconnection layers MA may not include portions which vertically overlap with the upper memory stack STB.

As illustrated in FIG. 2A, on the connection region CON, an interconnection structure for electrically connecting the lower interconnection layers MA and the upper interconnection layers MB to each other may not be arranged between the lower interconnection layers MA and the upper interconnection layers MB. In some example embodiments, the interconnection structure may not pass through a local region 124P of the upper insulating film 124 which vertically overlaps with the lower interconnection layers MA.

On a peripheral circuit region PERI, a plurality of circuits CT1 may be formed. The circuits CT1 may be formed at a level higher than or equal to the level of the substrate 102, and may include components such as a peripheral source/drain region PSD and/or a device isolation film 103 at a level lower than an upper surface of the substrate 102. A detailed configuration for the circuits CT1 will be described below with reference to FIG. 4.

On the peripheral circuit region PERI of the substrate 102, a device isolation film 103 defining a peripheral active region PAC may be formed. On the peripheral active region PAC, a peripheral transistor TR may be formed. The peripheral transistor TR may constitute, or be included in, a portion of the circuits CT1 formed on the peripheral circuit region PERI. The peripheral transistor TR may be electrically connected to the memory cell region MEC through an interconnection structure located on the connection region CON. The peripheral transistor TR may include a peripheral gate PG and a peripheral source/drain region PSD formed in the peripheral active region PAC on either side of the peripheral gate PG. The peripheral transistors TR may be n-type, or, alternatively, may be p-type. In some example embodiments, unit devices, such as resistors, capacitors, and/or the like, may be further located on the peripheral circuit region PERI.

A plurality of lower peripheral contact plugs P116 may be located on the peripheral circuit region PERI. The lower peripheral contact plugs P116 may extend from the peripheral transistor TR to the first vertical level LV1 through the lower insulating film 114 in the vertical direction (Z direction). A plurality of lower peripheral interconnection layers PMA connected to the lower peripheral contact plugs P116 may be located on the lower peripheral contact plugs P116. The lower peripheral interconnection layers PMA may extend in the horizontal direction at the first vertical level LV1, which is the same level as that of the lower interconnection layers MA formed on the connection region CON. Each of the lower peripheral interconnection layers PMA may be connected to one of the peripheral gate PG and the peripheral source/drain region PSD through one of the lower peripheral contact plugs P116. At least one of the lower peripheral interconnection layers PMA may be configured to be connected to other circuits or interconnections located on the peripheral circuit region PERI. The lower peripheral interconnection layers PMAs may be insulated from each other by the interlayer insulating film 130.

A plurality of upper peripheral contact plugs P126 connected to the lower peripheral interconnection layers PMA may be located on the lower peripheral interconnection layers PMA. The upper peripheral contact plugs P126 may extend from the lower peripheral interconnection layers PMA to the second vertical level LV2 through the separate insulating film 140 and the upper insulating film 124. In FIG. 2A, the lower peripheral interconnection layers PMA are illustrated as being connected to one of the upper peripheral contact plugs P126, but inventive concepts is not limited thereto. For example, at least some of the lower peripheral interconnection layers PMA may not be connected to the upper peripheral contact plugs P126. In some example embodiments, at least some of the upper peripheral contact plugs P126 illustrated in FIG. 2A may be omitted.

A plurality of upper peripheral interconnection layers PMB connected to the upper peripheral contact plugs P126 may be located on the upper peripheral contact plugs P126. The upper peripheral interconnection layers PMB may extend in the horizontal direction at the second vertical level LV2, which is the same level as that of the upper interconnection layers MB formed on the connection region CON. Each of, or at least some of, the upper peripheral interconnection layers PMB may be configured to be connected to other circuits or interconnections located on the peripheral circuit region PERI. The upper peripheral interconnection layers PMB may be insulated from each other by the upper interlayer insulating film 195.

Each of the lower peripheral contact plugs P116, the lower peripheral interconnection layers PMA, the upper peripheral contact plugs P126, and the upper peripheral interconnection layers PMB may include at least one of tungsten, titanium, tantalum, copper, aluminum, titanium nitride, tantalum nitride, tungsten nitride, or a combination thereof. The lower peripheral contact plugs P116, the lower peripheral interconnection layers PMA, the upper peripheral contact plugs P126, and the upper peripheral interconnection layers PMB may include the same materials and/or different materials.

Figure 4:
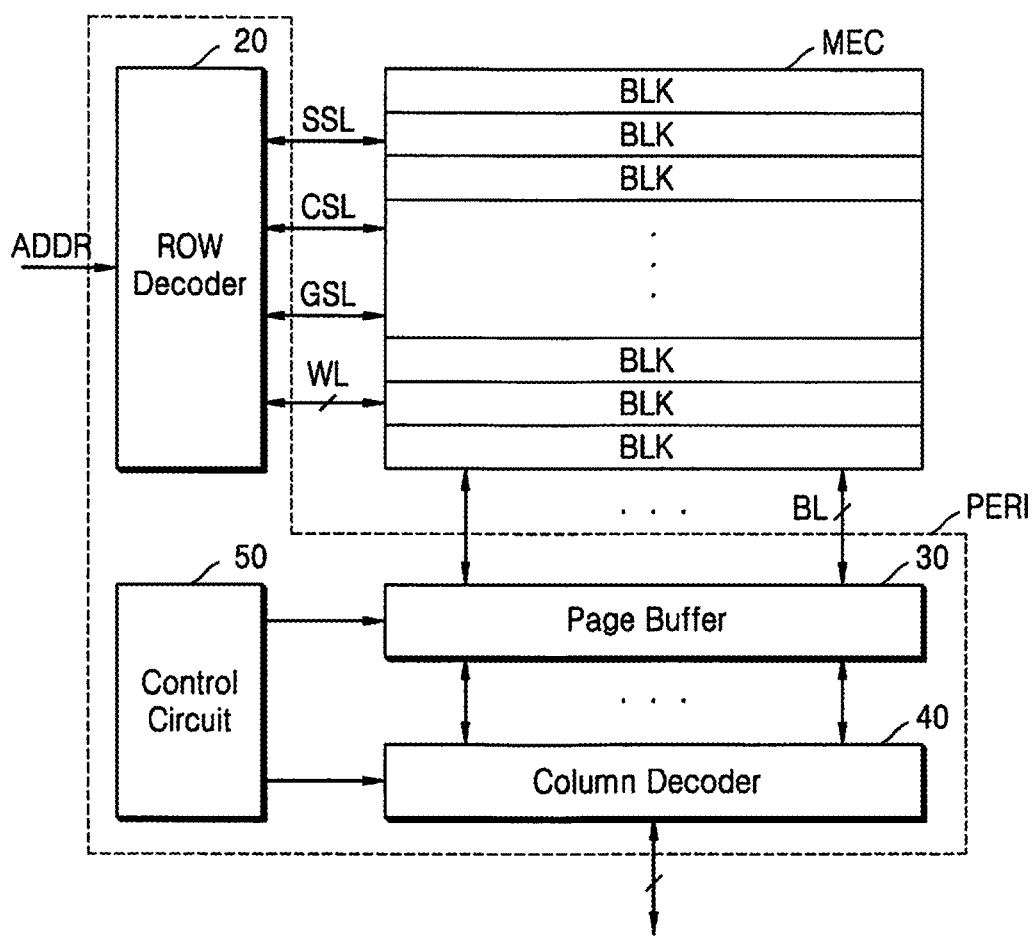
FIG. 4 shows a schematic block diagram for explaining an example configuration of the integrated circuit devices illustrated in FIGS. 1, 2A, and 2B.

FIG. 4 shows a schematic block diagram for explaining an example configuration of the integrated circuit device 100 illustrated in FIGS. 1, 2A, and 2B.

Referring to FIG. 4, the peripheral circuit region PERI of the integrated circuit device 100 includes the circuits CT1 (FIG. 2A). Each of the circuits CT1 may include at least one of a row decoder 20, a page buffer 30, a column decoder 40, or a control circuit 50.

The memory cell region MEC may include a plurality of memory blocks BLK. Each of the memory blocks BLK may include a plurality of memory cells. The memory cells included in the memory cell region MEC may include a lower memory stack STA and an upper memory stack STB as described with reference to FIGS. 1, 2A, and 2B. The memory cells may be configured to be electrically connected to the row decoder 20 through the lower word lines WLA, the upper word lines WLB, the lower contact plugs 116, the lower interconnection layers MA, the upper contact plugs 126, and the upper interconnection layers MB, and may be configured to be electrically connected to the page buffer 30 and the column decoder 40 through the bit lines BL.

The row decoder 20 may be commonly connected to the memory blocks BLK, and may provide a driving signal, such as a driving voltage, to a plurality of word lines WL: WL1, WL2, through WLn−1, WLn (see FIGS. 2A and 2B) of a memory block BLK selected according to a block selection signal. For example, the row decoder 20 receives address information ADDR from the outside, and decodes the received address information ADDR to determine a voltage supplied to at least some selected from the lower word lines WLA and the upper word lines WLB (see FIGS. 2A and 2B) which are electrically connected to the memory blocks BLK.

The page buffer 30 may be configured to be electrically connected to the memory cell region MEC through the bit lines BL. The page buffer 30 may be connected to a bit line BL that is selected according to an address decoded by the column decoder 40. The page buffer 30 may, according to an operation mode, temporarily store data to be stored in the memory cells included in the memory cell region MEC, or sense data stored in the memory cells. In some example embodiments, the page buffer 30 may, in a program operation mode, operate as a write driver circuit and, in a read operation mode, operate as a sense amplifier circuit. The page buffer 30 may receive a signal including at least one of power, voltage, or current from a control logic and provide the received signal to a selected bit line BL.

The column decoder 40 may provide a data transmission path between the page buffer 30 and an external device such as a memory controller. The column decoder 40 may decode an externally provided input address to select one bit line of the bit lines BL. The column decoder 40 may be commonly connected to the memory blocks BLK, and may provide data information to the bit lines BL of a memory block which is selected according to a block selection signal.

The control circuit 50 may control the overall operation of the integrated circuit device 100. The control circuit 50 receives a control signal and an external voltage and may operate according to the received control signal. The control circuit 50 may include a voltage generator which generates voltages for internal operation, such as a program voltage, a read voltage, an erase voltage, etc., by using an external voltage. The control circuit 50 may control the read, write, and/or erase operations in response to control signals.

Figure 5:
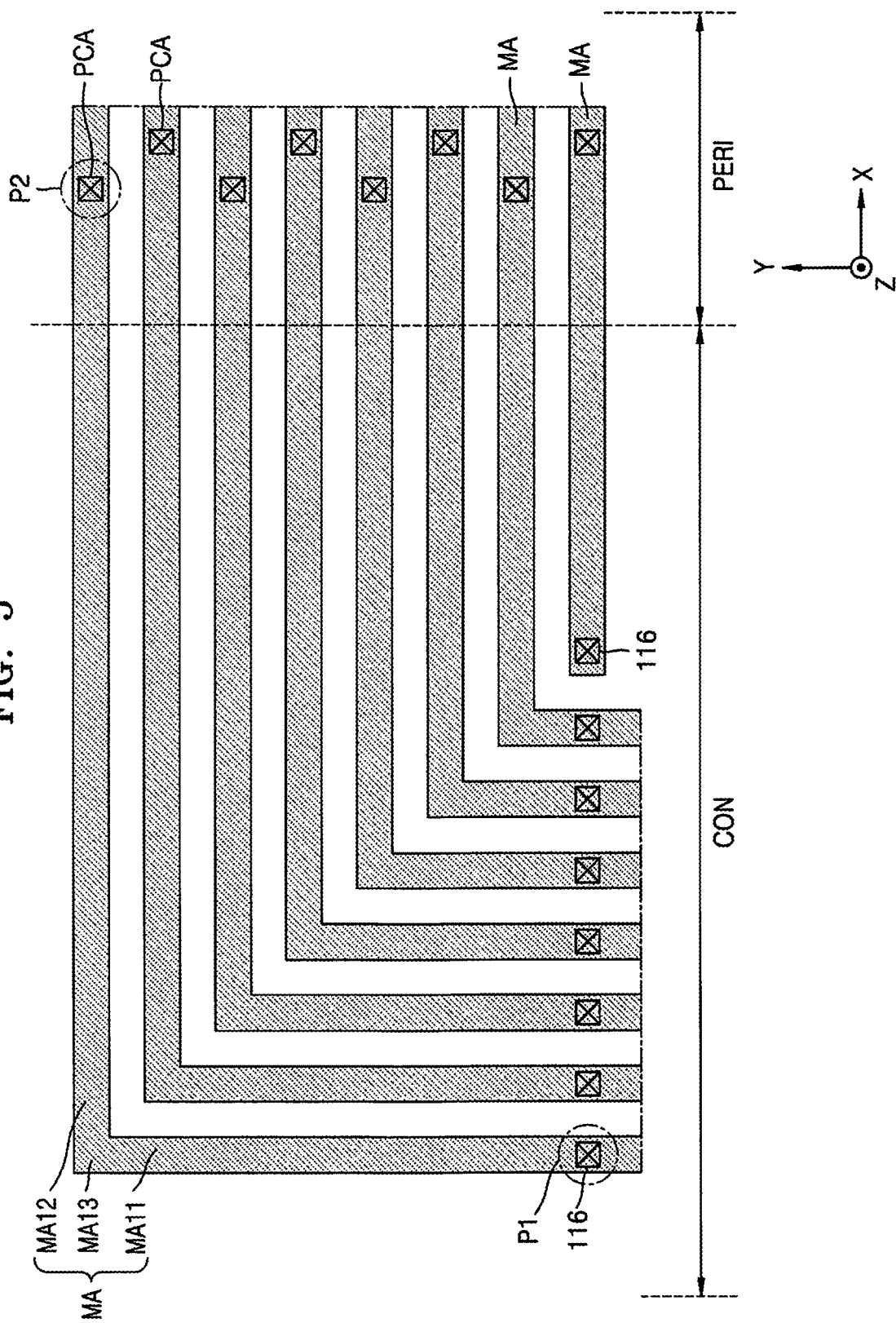
FIG. 5 shows a plan view showing an example planar layout of a plurality of lower interconnection layers illustrated in FIG. 2A.

FIG. 5 shows a plan view showing an example planar layout of the lower interconnection layers MA illustrated in FIG. 2A.

Referring to FIGS. 2A and 5, the lower interconnection layers MA may extend over the connection region CON and the peripheral circuit region PERI. On the connection region CON, some lower interconnection layers of the lower interconnection layers MA may include a first horizontal extension portion MA11 extending from the upper surface of the lower contact plug 116 in a first direction at the first vertical level LV1, a second horizontal extension portion MA12 extending from the first horizontal extension portion MA11 in the second direction, which is different from the first direction, at the first vertical level LV1, and a bent portion MA13 between the first horizontal extension portion MA11 and the second horizontal extension portion MA12. In some example embodiments, the first horizontal extension portion MA11 may extend in the second horizontal direction (Y direction), and the second horizontal extension portion MA12 may extend in the first horizontal direction (X direction), but inventive concepts is not limited thereto. Some lower interconnection layers of the lower interconnection layers MA may not include a bent portion and may extend in a linear shape in, e.g. only in, the first direction or the second direction. Furthermore, although the bent portion MA13 is illustrated as being at right angles with the first direction and the second direction, inventive concepts are not limited thereto.

In some example embodiments, the lower interconnection layers MA may be configured to be electrically connected to an interconnection structure (not shown) constituting, or included in, the circuits CT1 located on the peripheral circuit region PERI. For example, the lower interconnection layers MA may each include a first local portion P1 connected to the lower contact plugs 116 on the connection region CON, and a second local portion P2 connected to a peripheral contact PCA included in some circuits selected from the circuits CT1 located on the peripheral circuit region PERI. The lower interconnection layers MA may be connected to the lower word lines WLA on memory cell region MEC through the lower contact plugs 116, and to the circuits CT1 (see FIG. 2A) located on the peripheral circuit region PERI through a plurality of peripheral contacts PCA. In some example embodiments, the circuits CT1 connected to the peripheral contacts PCA may be selected from the row decoder 20, the page buffer 30, the column decoder 40, and the control circuit 50, which have been described in connection with FIG. 4, but are not limited thereto.

Figure 6:
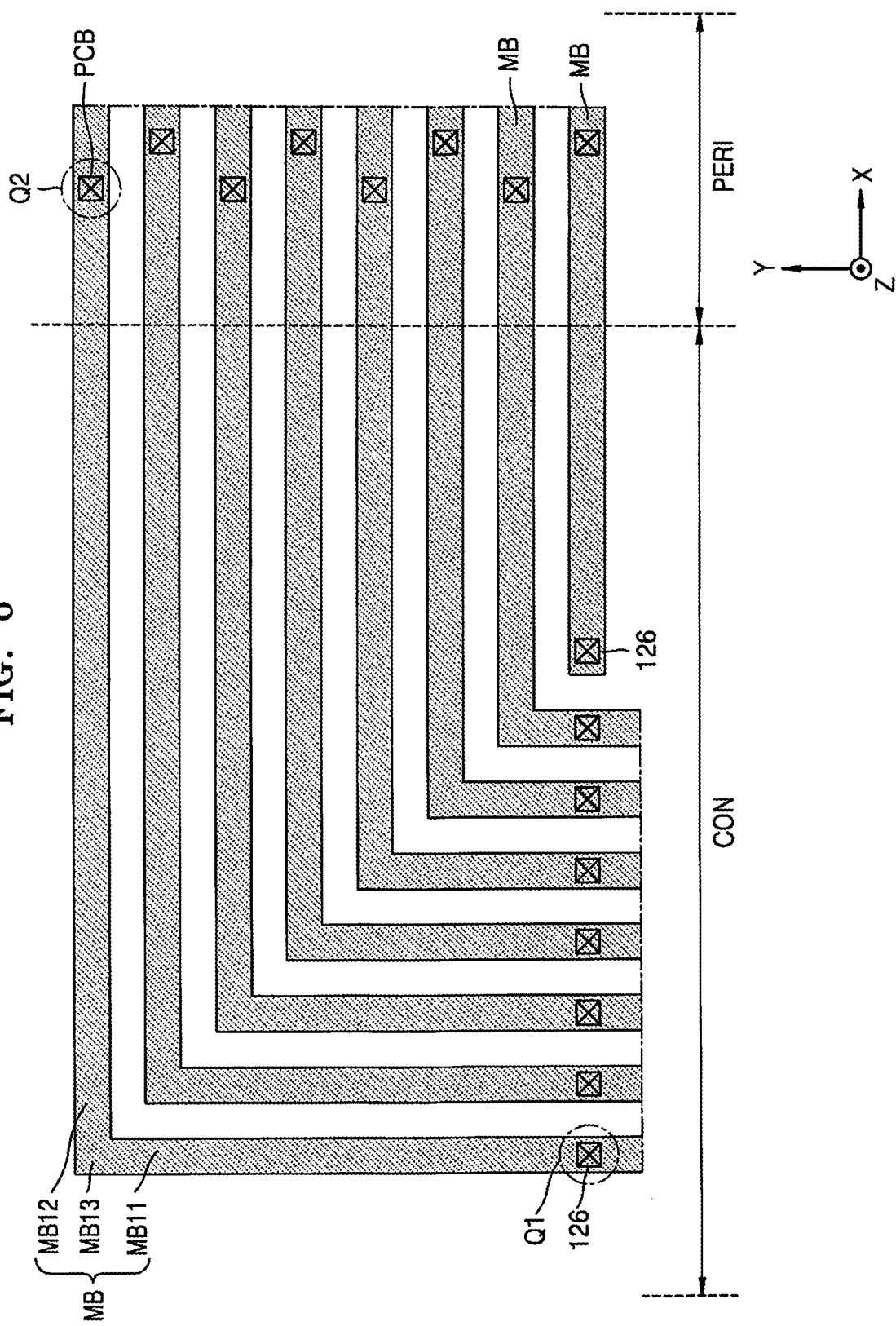
FIG. 6 shows a plan view showing an example planar layout of a plurality of upper interconnection layers illustrated in FIG. 2A.

FIG. 6 shows a plan view showing an example planar layout of the upper interconnection layers MB illustrated in FIG. 2A.

Referring to FIGS. 2A and 6, the upper interconnection layers MB may extend over the connection region CON and the peripheral circuit region PERI. On the connection region CON, some upper interconnection layers of the upper interconnection layers MB may include a first horizontal extension portion MB11 extending from the upper surface of the upper contact plugs 126 in the first direction at the second vertical level LV2, a second horizontal extension portion MB12 extending from the first horizontal extension portion MB11 in the second direction, which is different from the first direction, at the second vertical level LV2, and a bent portion MB13 between the first horizontal extension portion MB11 and the second horizontal extension portion MB12. In some example embodiments, the first horizontal extension portion MB11 may extend in the second horizontal direction (Y direction), and the second horizontal extension portion MB12 may extend in the first horizontal direction (X direction), but inventive concepts are not limited thereto. Some upper interconnection layers of the upper interconnection layers MB may not include a bent portion and may extend in a linear shape in the first direction or the second direction. Furthermore, although the bent portion MB13 is illustrated as being at right angles with the first direction and the second direction, inventive concepts are not limited thereto.

In some example embodiments, the upper interconnection layers MB may be configured to be electrically connected to an interconnection structure (not shown) constituting the circuits CT1 located on the peripheral circuit region PERI. For example, the upper interconnection layers MB may each include a first local portion Q1 connected to the upper contact plugs 126 on the connection region CON, and a second local portion Q2 connected to a peripheral contact PCB included in some circuits selected from the circuits CT1 (see FIG. 2A) located on the peripheral circuit region PERI. The upper interconnection layers MB may be connected to the upper word lines WLB on memory cell region MEC through the upper contact plugs 126, and to the circuits CT1 (see FIG. 2A) located on the peripheral circuit region PERI through a plurality of peripheral contacts PCB. In some example embodiments, the circuits CT1 connected to the peripheral contacts PCB may be selected from the row decoder 20, the page buffer 30, the column decoder 40, and the control circuit 50, which have been described in connection with FIG. 4, but are not limited thereto.

Figure 7:
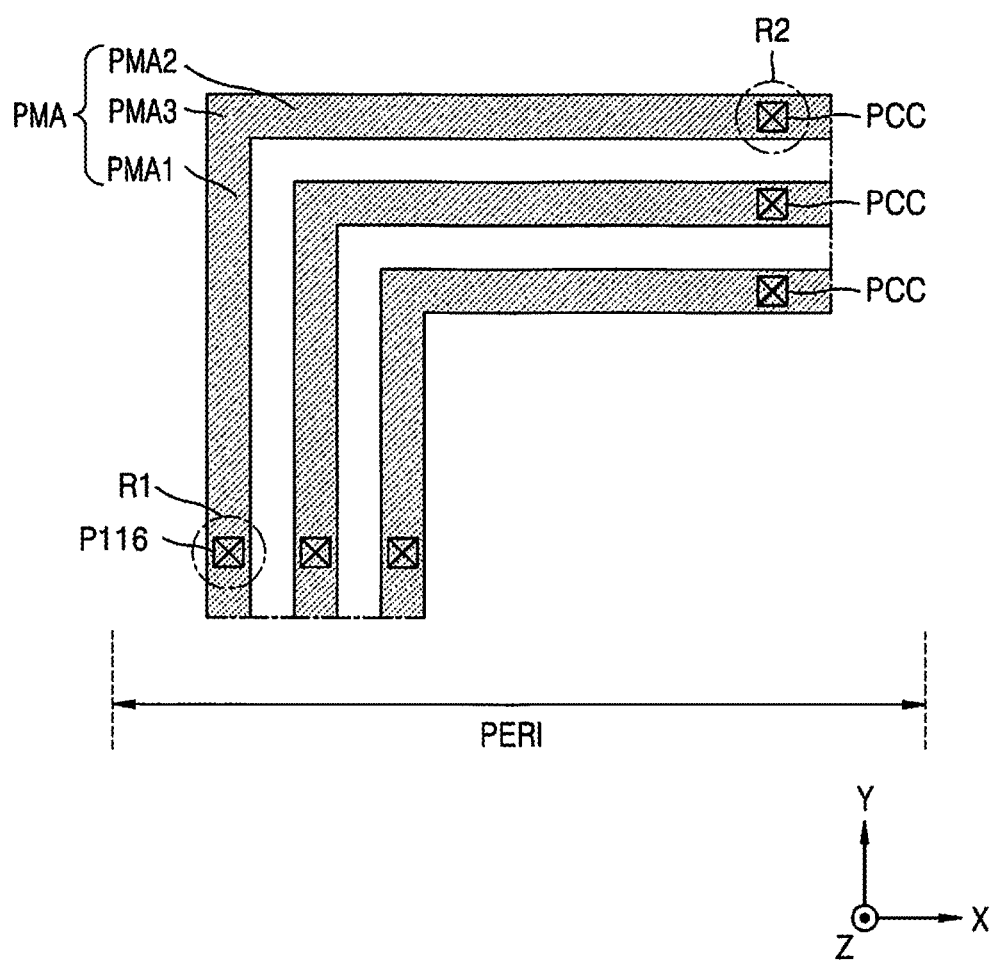
FIG. 7 shows a plan view showing an example planar layout of a plurality of lower peripheral interconnection layers illustrated in FIG. 2A.

FIG. 7 shows a plan view showing an example planar layout of the lower peripheral interconnection layers PMA illustrated in FIG. 2A.

Referring to FIGS. 2A and 7, the lower peripheral interconnection layers PMA may extend in the first horizontal direction (X direction) and the second horizontal direction (Y direction) at the first vertical level LV1 on the peripheral circuit region PERI. The lower peripheral interconnection layers PMA may each include a first horizontal extension portion PMA1, a second horizontal extension portion PMA2, and a bent portion PMA3 located therebetween. The first horizontal extension portion PMA1 may extend in the second horizontal direction (Y direction), and the second horizontal extension portion PMA2 may extend in the first horizontal direction (X direction), but inventive concepts is not limited thereto. In some example embodiments, each of the lower peripheral interconnection layers PMA may be configured to be electrically connected to at least two interconnection structures (not shown) constituting different circuits selected from the circuits CT1 (see FIG. 2A) located on the peripheral circuit region PERI. For example, each of the lower peripheral interconnection layers PMA may include a first local portion R1 connected to the lower peripheral contact plugs P116 on the peripheral circuit region PERI, and a second local portion R2 connected to a peripheral contact PCC included in some circuits selected from the circuits CT1 (see FIG. 2A) located on the peripheral circuit region PERI. The lower peripheral interconnection layers PMA may be connected to one circuit of the circuits CT1 (see FIG. 2A) located on the peripheral circuit region PERI through the lower peripheral contact plugs P116, and to any other circuit of the circuits CT1 (see FIG. 2A), which is different from the circuit described above, through the peripheral contact PCC. In some example embodiments, the circuits CT1, to which the lower peripheral contact plugs P116 and the peripheral contact PCC are connected, may be selected from the row decoder 20, the page buffer 30, the column decoder 40, and the control circuit 50, which have been described in connection with FIG. 4, but are not limited thereto.

Figure 8:
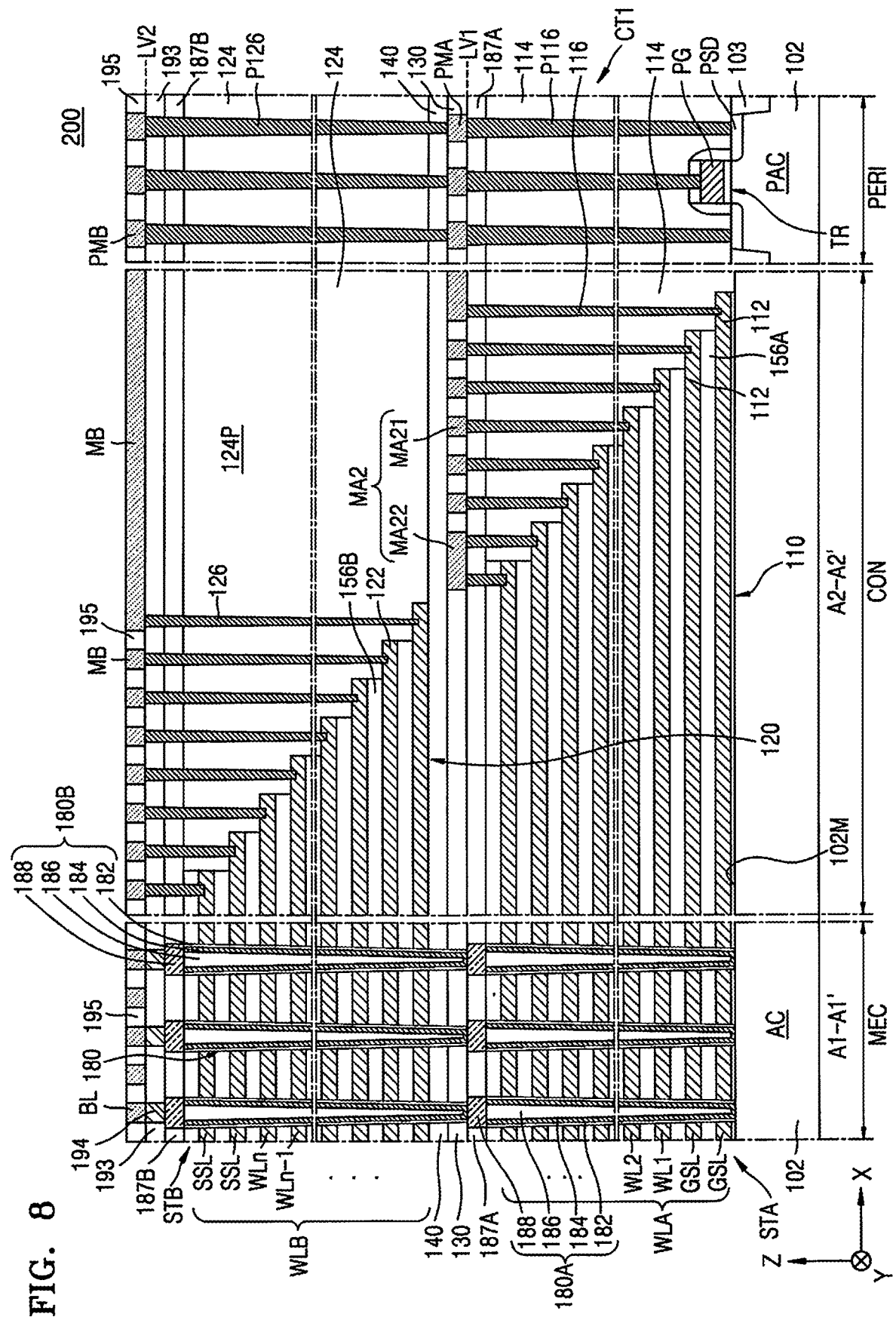
FIGS. 8 to 20 show cross-sectional views of integrated circuit devices according to some example embodiments of inventive concepts.

FIG. 8 shows a cross-sectional view of an integrated circuit device 200 according to s embodiments of inventive concepts. FIG. 8 illustrates the configuration of a portion corresponding to a cross-section taken along line A1-A1' of FIG. 1, the configuration of a portion corresponding to a cross-section taken along line A2-A2' of FIG. 1, and the configuration of a portion corresponding to a cross-section of a portion of the peripheral circuit region PERI of FIG. 1.

Referring to FIG. 8, the integrated circuit device 200 has substantially the same configuration as the integrated circuit device 100 described with reference to FIGS. 1 to 7. A difference between the integrated circuit device 200 and the integrated circuit device 100 is that the integrated circuit device 200 includes a plurality of lower interconnection layers MA2 connected to the lower contact plugs 116 and extending in the horizontal direction at the first vertical level LV1.

The lower interconnection layers MA2 includes a first lower interconnection layer MA21 connected to one lower contact plug selected from the lower contact plugs 116, and a second lower interconnection layer MA22 connected to some of the lower contact plugs 116. FIG. 8 illustrates an example embodiment in which the second lower interconnection layer MA22 is connected to two lower contact plugs 116. However, inventive concepts are not limited thereto. For example, the second lower interconnection layer MA 22 may be connected to three or more lower contact plugs 116. In some example embodiments, two or more lower word lines selected from the lower word lines WLA may be connected to one second lower interconnection layer MA 22 through two or more lower contact plugs 116. At least one lower word line selected from connected to lower word lines WLA and connected to the second lower interconnection layer MA22 may be a dummy word line which does not perform a normal function of a memory cell substantially formed on the memory cell region MEC. For example, a dummy word line may be electrically isolated and/or may electrically float during operation of the memory cell region MEC. A detailed configuration for the lower interconnection layers MA2 is substantially the same as that described for the lower interconnection layers MA with reference to FIGS. 2A and 5.

As in the lower interconnection layers MA described in connection with FIG. 5, each of the lower interconnection layers MA2 may extend over the connection region CON and the peripheral circuit region PERI, and may include a first local portion connected to the lower contact plugs 116 on the connection region CON, and a second local portion connected to some circuits selected from the circuits CT1 (see FIG. 2A) located on the peripheral circuit region PERI. At least some of the lower interconnection layers MA2 may include a bent portion which has a shape similar to that of the bent portion MA13 illustrated in FIG. 5.

Figure 9:
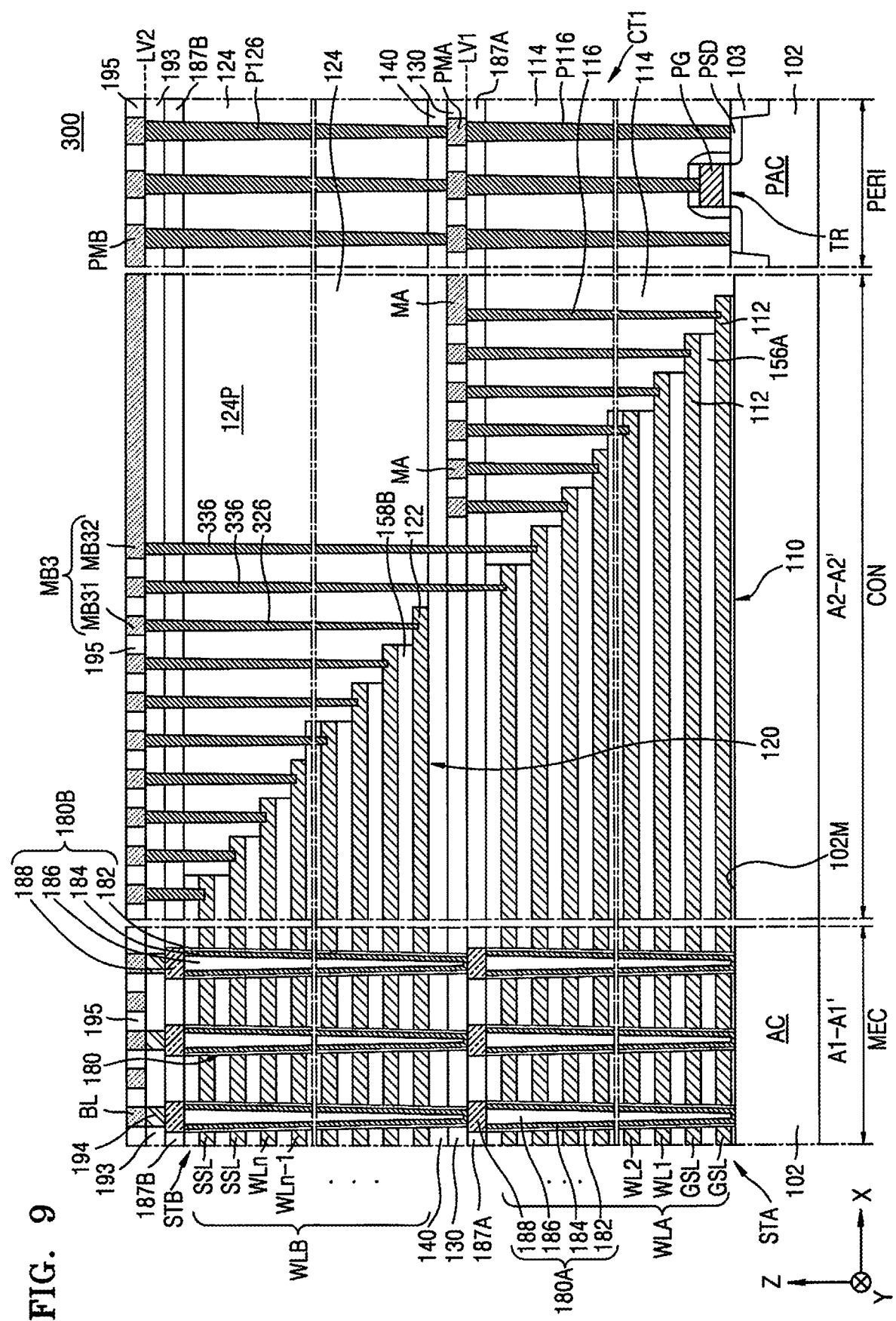

FIG. 9 shows a cross-sectional view of an integrated circuit device 300 according to some example embodiments of inventive concepts. FIG. 9 illustrates the configuration of a portion corresponding to a cross-section taken along line A1-A1' of FIG. 1, the configuration of a portion corresponding to a cross-section taken along line A2-A2' of FIG. 1, and the configuration of a portion corresponding to a cross-section of a portion of the peripheral circuit region PERI of FIG. 1.

Referring to FIG. 9, the integrated circuit device 300 has substantially the same configuration as the integrated circuit device 100 described with reference to FIGS. 1 to 7. A difference between the integrated circuit device 300 and the integrated circuit device 100 is that the integrated circuit device 300 includes a plurality of upper interconnection layers MB3 extending in the horizontal direction at the second vertical level LV2 on the connection region CON.

The upper interconnection layers MB3 may include a plurality of first upper interconnection layers MB31 configured to be electrically connected to at least one upper word lines selected from the upper word lines WLB, and at least one second upper interconnection layer MB32 configured to be electrically connected to at least one lower word lines selected from the lower word lines WLA. FIG. 9 illustrates an example embodiment in which the upper interconnection layers MB3 include two second upper interconnection layers MB32, but inventive concepts are not limited thereto. The upper interconnection layers MB3 may include one or at least three upper interconnection layers MB32.

The first upper interconnection layers MB31 may be configured to be electrically connected to the upper word lines WLB through a plurality of first upper contact plugs 326. At least one upper interconnection layer MB32 may be configured to be electrically connected to lower word lines WLA through at least one second upper contact plug 336. The details of the first upper contact plugs 326 and the second upper contact plugs 336 are substantially the same as those described with the upper contact plugs 126 in connection with FIG. 2A. A difference between the first and second upper contact plugs 326 and 336 and the upper contact plugs 126 is that the second upper contact plug 336 may extend in the vertical direction (Z direction) through the lower intermediate insulating film 187A, the interlayer insulating film 130, the separate insulating film 140, the upper insulating film 124, the upper intermediate insulating film 187B, and the insulating film 193.

As in the upper interconnection layers MB described in connection with FIG. 6, each of the upper interconnection layers MB3 may extend over the connection region CON and the peripheral circuit region PERI, and may include a first local portion connected to the first upper contact plug 326 or the second upper contact plug 336 on the connection region CON, and a second local portion connected to some circuits selected from the circuits CT1 (see FIG. 2A) located on the peripheral circuit region PERI. At least some of the upper interconnection layers MB3 may include a bent portion which has a shape similar to that of the bent portion MB13 illustrated in FIG. 6 in the horizontal direction.

Each of the upper interconnection layers MB3 may be insulated from each other by the upper interlayer insulating film 195. The second upper contact plug 336 may be spaced in the horizontal direction from the lower interconnection layers MA with the interlayer insulating film 130 therebetween.

Figure 10:
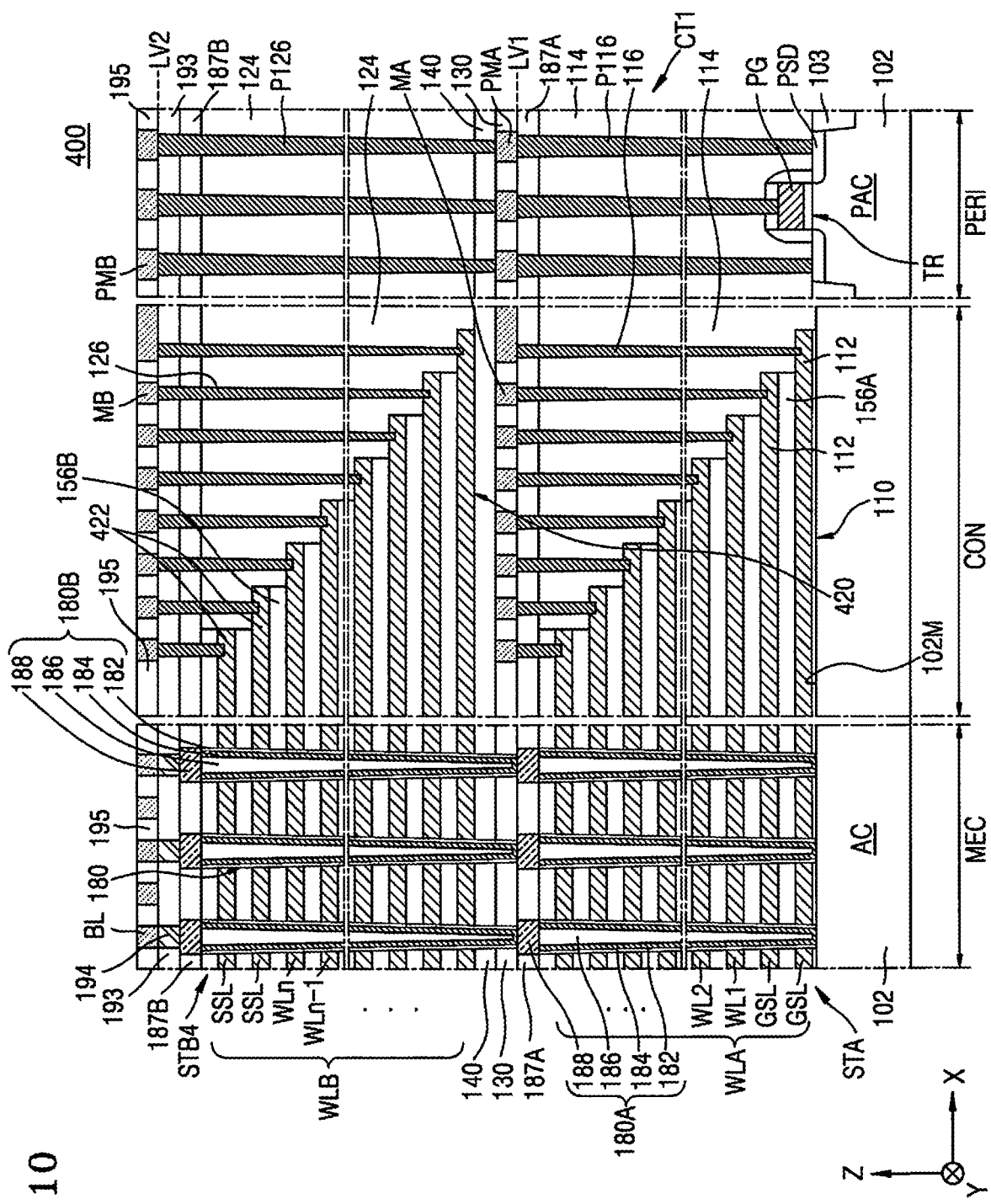

FIG. 10 shows a cross-sectional view of an integrated circuit device 400 according to some example embodiments of inventive concepts.

Referring to FIG. 10, the integrated circuit device 400 has substantially the same configuration as the integrated circuit device 100 described with reference to FIGS. 1 to 7. A difference between the integrated circuit device 400 and the integrated circuit device 100 is that the integrated circuit device 400 includes an upper memory stack STB4 located on the lower memory stack STA. In a horizontal direction parallel to the main surface 102M of the substrate 102, the area occupied by the upper memory stack STB4 may be substantially the same as the area occupied by the lower memory stack STA.

The upper memory stack STB4 may include upper word lines WLB located on the memory cell region MEC, and a stepped upper connection portion 420 located on the connection region CON and connected to the upper word lines WLB. The stepped upper connection portion 420 may include a plurality of upper pad regions 422.

The upper memory stack STB4 may include a portion that overlaps vertically with at least a portion of the lower interconnection layers MA. At least a portion of the stepped upper connection portion 420 of the upper memory stack STB4 may be located between the lower interconnection layers MA and the upper interconnection layers MB. At least one of the lower interconnection layers MA may vertically overlap with the upper memory stack STB4. At least a portion of the stepped lower connection portion 110 may be located between the substrate 102 and the stepped upper connection portion 420, and at least one of the lower interconnection layers MA may overlap vertically with the stepped upper connection portion 420.

A portion of the separate insulating film 140 which covers the lower interconnection layers MA may fill a space between the lower interconnection layers MA and the stepped upper connection portion 420.

A detailed configuration for the upper memory stack STB4 is substantially the same as described with the upper memory stack STB in connection with FIGS. 1, 2A, and 2B.

Figure 11:
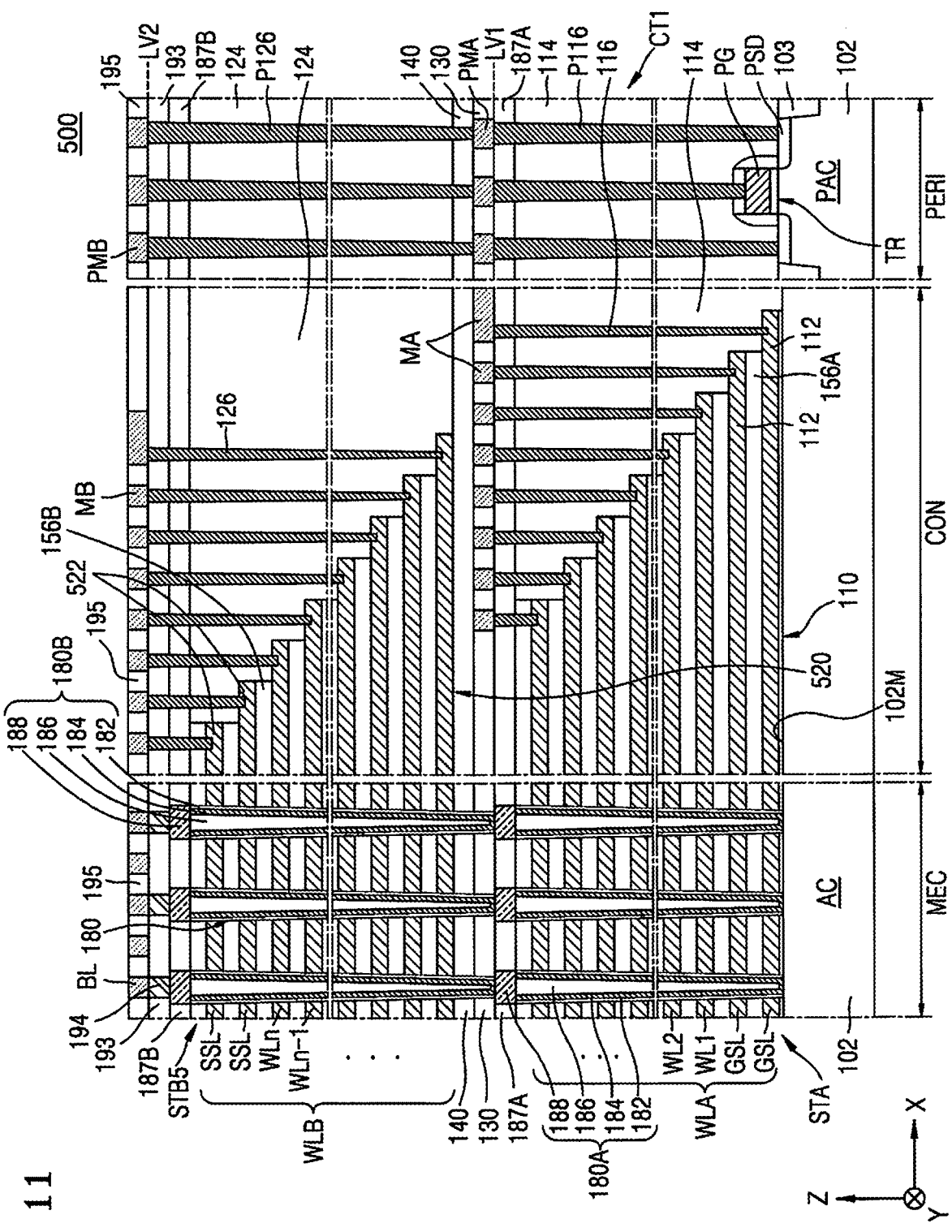

FIG. 11 shows a cross-sectional view of an integrated circuit device 500 according to some example embodiments of inventive concepts.

Referring to FIG. 11, the integrated circuit device 500 has substantially the same configuration as the integrated circuit device 100 described with reference to FIGS. 1 to 7. A difference between the integrated circuit device 500 and the integrated circuit device 100 is that the integrated circuit device 500 includes an upper memory stack STB5 located on the lower memory stack STA. In a horizontal direction parallel to the main surface 102M of the substrate 102, the area occupied by the upper memory stack STB5 may be smaller than the area occupied by the lower memory stack STA.

The upper memory stack STB5 may include upper word lines WLB located on the memory cell region MEC, and a stepped upper connection portion 520 located on the connection region CON and connected to the upper word lines WLB. The stepped upper connection portion 520 may include a plurality of upper pad regions 522.

The upper memory stack STB5 may include a portion that overlaps vertically with at least a portion of the lower interconnection layers MA. At least a portion of the stepped upper connection portion 520 of the upper memory stack STB5 may be located between the lower interconnection layers MA and the upper interconnection layers MB. At least one of the lower interconnection layers MA may vertically overlap with the upper memory stack STB5. At least a portion of the stepped lower connection portion 110 may be located between the substrate 102 and the stepped upper connection portion 520, and at least one of the lower interconnection layers MA may overlap vertically with the stepped upper connection portion 520.

A portion of the separate insulating film 140 which covers the lower interconnection layers MA may fill a space between the lower interconnection layers MA and the stepped upper connection portion 520.

A detailed configuration for the upper memory stack STB5 is substantially the same as described with the upper memory stack STB in connection with FIGS. 1, 2A, and 2B.

Figure 12:
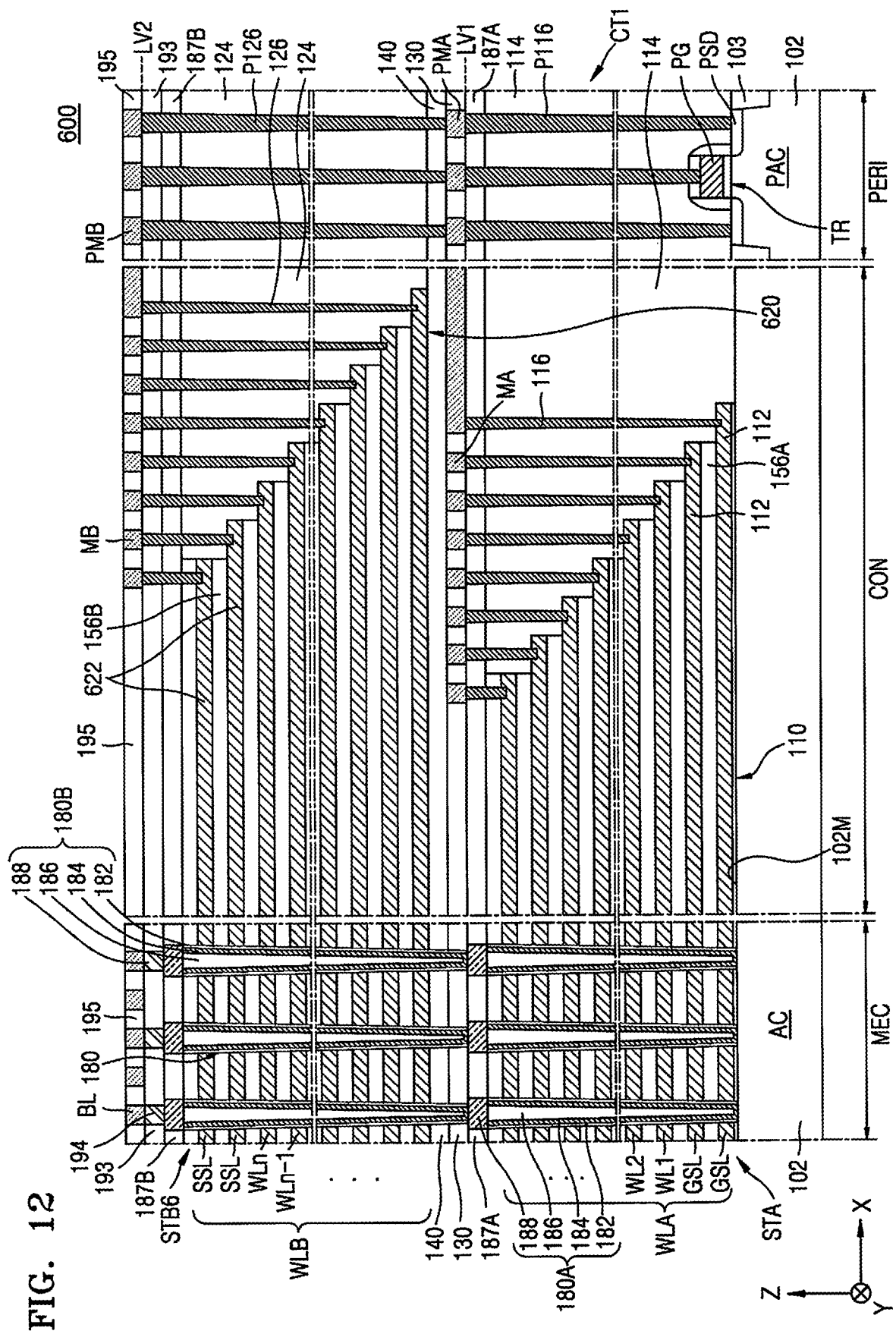

FIG. 12 shows a cross-sectional view of an integrated circuit device 600 according to some example embodiments of inventive concepts.

Referring to FIG. 12, the integrated circuit device 600 has substantially the same configuration as the integrated circuit device 100 described with reference to FIGS. 1 to 7. A difference between the integrated circuit device 600 and the integrated circuit device 100 is that the integrated circuit device 600 includes an upper memory stack STB6 located on the lower memory stack STA. In a horizontal direction (X direction and/or Y direction) parallel to the main surface 102M of the substrate 102, the area occupied by the upper memory stack STB6 may be greater than the area occupied by the lower memory stack STA.

The upper memory stack STB6 may include upper word lines WLB located on the memory cell region MEC, and a stepped upper connection portion 620 located on the connection region CON and connected to the upper word lines WLB. The stepped upper connection portion 620 may include a plurality of upper pad regions 622. In the horizontal direction, at least a portion of the stepped upper connection portion 620 may protrude further away from the memory cell region MEC than the stepped lower connection portion 110.

The upper memory stack STB6 may include a portion that overlaps vertically with the lower interconnection layers MA. In some example embodiments, at least a portion of the stepped upper connection portion 620 of the upper memory stack STB6 may be located between the lower interconnection layers MA and the upper interconnection layers MB. In some example embodiments, the upper interconnection layers MB may, in the horizontal direction, be located as being spaced further from the memory cell region MEC than an end of the stepped lower connection portion 110.

At least one of the lower interconnection layers MA may vertically overlap with the upper memory stack STB6. The stepped lower connection portion 110 may be located between the substrate 102 and the stepped upper connection portion 620, and the lower interconnection layers MA may overlap vertically with the stepped upper connection portion 620.

A portion of the separate insulating film 140 which covers the lower interconnection layers MA may fill a space between the lower interconnection layers MA and the stepped upper connection portion 620.

A detailed configuration for the upper memory stack STB6 is substantially the same as described with the upper memory stack STB in connection with FIGS. 1, 2A, and 2B.

Figure 13:
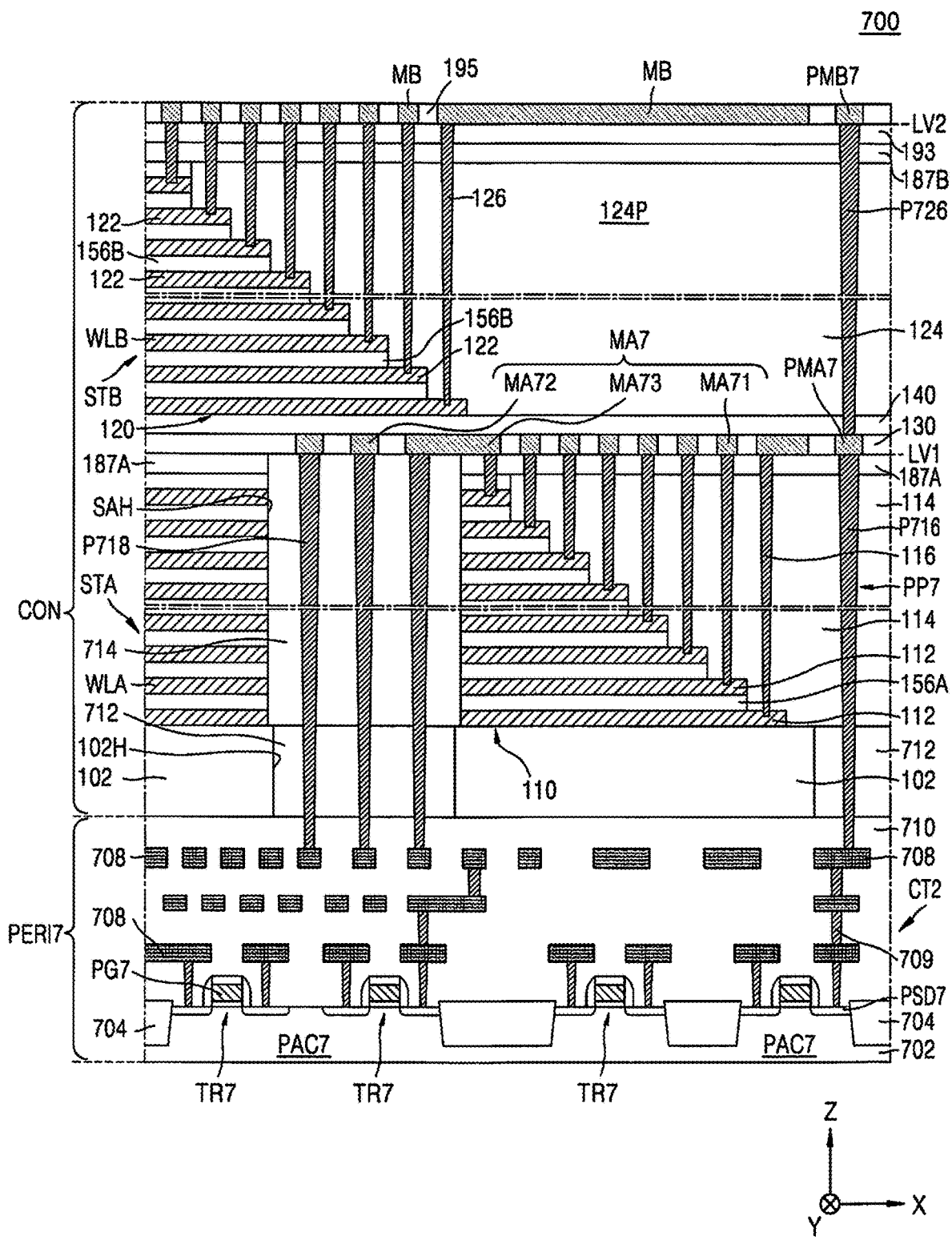

FIG. 13 shows a cross-sectional view of an integrated circuit device 700 according to some example embodiments of inventive concepts.

Referring to FIG. 13, the integrated circuit device 700 has substantially the same configuration as the integrated circuit device 100 described with reference to FIGS. 1 to 7. A difference between the integrated circuit device 700 and the integrated circuit device 100 is that the integrated circuit device 700 includes a peripheral circuit region PERI7 formed at a level lower than that of the substrate 102 and a plurality of lower interconnection layers MA7 extending in the horizontal direction at the first vertical level LV1 on the connection region CON.

The memory cell region MEC (see FIGS. 2A and 2B) and the connection region CON may overlap vertically with the peripheral circuit region PERI7.

The peripheral circuit region PERI7 may include a peripheral circuit board 702 located under the substrate 102 and a plurality of circuits CT2 located between the peripheral circuit board 702 and the substrate 102. A detailed configuration for the peripheral circuit board 702 is substantially the same as described with the substrate 102 in connection with FIGS. 2A and 2B.

In the peripheral circuit board 702, a peripheral circuit active area PAC7 may be defined by a device isolation film 704. A plurality of transistors TR7 may be formed on the peripheral circuit active area PAC7. The transistors TR7 may each include a peripheral gate PG7 and a peripheral source/drain region PSD7 formed in the peripheral active region PAC7 on either side of the peripheral gate PG7. In some example embodiments, unit devices, such as resistors, capacitors, and the like, may be further located on the peripheral circuit region PERI7. A peripheral interlayer insulating film 710 may be formed on the transistors TR7. The peripheral interlayer insulating film 710 may include silicon oxide, SiON, SiOCN, or the like.

The peripheral circuit region PERI 7 may include a plurality of peripheral circuit interconnection layers 708 and a plurality of peripheral circuit contacts 709. Some of the peripheral circuit interconnection layers 708 may be configured to be electrically connected to the transistors TR7. The peripheral circuit contacts 709 may be configured to interconnect some peripheral circuit interconnection layers selected from the peripheral circuit interconnection layers 708. The peripheral circuit interconnection layers 708 and peripheral circuit contacts 709 may be covered with the peripheral interlayer insulating film 710. Some of the peripheral circuit interconnection layers 708 may face the lower memory stack STA with the substrate 102 therebetween.

The peripheral circuit interconnection layers 708 and the peripheral circuit contacts 709 may each include a metal, a conductive metal nitride, a metal silicide, or a combination thereof. For example, the peripheral circuit interconnection layers 708 and peripheral circuit contacts 709 may each include conductive materials, such as at least one of tungsten, molybdenum, titanium, cobalt, tantalum, nickel, tungsten silicide, titanium silicide, cobalt silicide, tantalum silicide, nickel silicide, or the like. Referring to FIG. 13, the peripheral circuit interconnection layers 708 are arranged to constitute, or be included in, a three-layered interconnection structure in the vertical direction (Z direction). However, inventive concepts is not limited to the embodiment illustrated in FIG. 13. For example, the peripheral circuit interconnection layers 708 may have a two-layered, or four or more-layered, interconnection structure.

The lower interconnection layer MA7 located on the connection region CON may include at least one first lower interconnection layer MA71 configured to be electrically connected to at least one lower word lines selected from lower word lines WLA, at least one second lower interconnection layer MA72 configured to be electrically connected to at least one peripheral circuit interconnection layers selected from the peripheral circuit interconnection layers 708 included in the peripheral circuit region PERI7, and a third lower interconnection layer MA73 connected between the lower word lines WLA and the peripheral circuit interconnection layer 708. The lower interconnection layers MA7 may extend in the horizontal direction at the first vertical level LV1 between the lower memory stack STA and the upper memory stack STB.

In the integrated circuit device 700, interconnection structures located on the connection region CON may be configured to be electrically connected to the peripheral circuit interconnection layers 708 located on the peripheral circuit region PERI7 through at least one connection plug PP7 extending in the vertical direction (Z direction). In some example embodiments, at least some of the lower interconnection layers MA7 and at least some of the upper interconnection layers MB, on the connection region CON, may be configured to be electrically connected to the peripheral circuit interconnection layers 708 located on the peripheral circuit region PERI7 through at least one connection plug PP7. In some example embodiments, at least some of the lower interconnection layers MA7 and at least some of the upper interconnection layers MB, on the connection region CON, may be configured to be electrically connected to unit devices, such as resistors, capacitors, and the like, located on the peripheral circuit region PERI7 through at least one connection plug PP7.

In the integrated circuit device 700, a plurality of through-holes 102H may be formed in the substrate 102. At least one connection plug PP7 may extend from one peripheral circuit interconnection layer selected from the peripheral circuit interconnection layers 708 beyond the substrate 102 through the substrate 102. The through-holes 102H may be filled with a substrate-buried insulating film 712. The substrate-buried insulating film 712 may include a silicon oxide film.

The connection plug PP7 may include a lower peripheral interconnection layer PMA7 located at the first vertical level LV1, which is a level identical to the level of the lower interconnection layers MA7, and an upper peripheral interconnection layer PMB7 located at the second vertical level LV2, which is a level identical to that of the upper interconnection layers MB.

The connection plug PP7 may further include a lower peripheral contact plug P716. The lower peripheral contact plug P716 may extend in the vertical direction (Z direction) from one peripheral circuit interconnection layer selected from the peripheral circuit interconnection layers 708 to the lower peripheral interconnection layer PMA7 through the peripheral interlayer insulating film 710 and the substrate-buried insulating film 712. The lower peripheral contact plug P716 may pass through the substrate 102 through the through-holes 102H and may be surrounded by the substrate-buried insulating film 712 in the through-hole 102H.

The connection plug PP7 may further include an upper peripheral contact plug P726. The upper peripheral contact plug P726 may extend in the vertical direction (Z direction) from the lower peripheral interconnection layer PMA7 to the upper peripheral interconnection layer PMB7 through the separate insulating film 140, the upper insulating film 124, the upper intermediate insulating film 187B, and the insulating film 193.

As in the lower peripheral interconnection layers PMA described in connection with FIG. 7, the lower peripheral interconnection layer PMA7 may extend in the first horizontal direction (X direction) and the second horizontal direction (Y direction) at the first vertical level LV1. In some example embodiments, the lower peripheral interconnection layer PMA7 may include a local portion connected to at least one lower interconnection layer selected from the lower interconnection layers MA7 at the first vertical level LV1. In this case, if needed, the upper peripheral contact plug P726 may be omitted from the connection plug PP7. The lower peripheral interconnection layer PMA7 may be insulated from the lower interconnection layers MA7 by the interlayer insulating film 130.

As in the lower peripheral interconnection layers PMA described in connection with FIG. 7, the upper peripheral interconnection layer PMB7 may extend in the first horizontal direction (X direction) and the second horizontal direction (Y direction) at the second vertical level LV2. In some example embodiments, the upper peripheral interconnection layer PMB7 may include a local portion connected to at least one upper interconnection layer selected from the upper interconnection layers MB at the second vertical level LV2. The upper peripheral interconnection layer PMB7 may be insulated from the upper interconnection layers MB by the upper interlayer insulating film 195.

The lower peripheral interconnection layer PMA7, the upper peripheral interconnection layer PMB7, the lower peripheral contact plug P716, and the upper peripheral contact plug P726, which constitute the connection plug PP7, may each include tungsten, titanium, tantalum, copper, aluminum, titanium nitride, tantalum nitride, tungsten nitride, or a combination thereof.

In the integrated circuit device 700, the lower memory stack STA may have a lower memory stack through-hole SAH which passes through the lower memory stack STA. The lower memory stack through-hole SAH may be filled by a stack-filling insulating film 714. The stack-filling insulating film 714 may extend in the vertical direction (Z direction) through the lower word lines WLA. The stack-burying insulating film 714 may include a silicon oxide film.

The integrated circuit device 700 may further include at least one through contact plug P718 extending in the vertical direction (Z direction) to the peripheral circuit interconnection layer 708 through the lower memory stacks STA and the substrate 102. The second lower interconnection layer MA72 and the third lower interconnection layer MA73 may each contact the upper surface of the through contact plug P718. The third lower interconnection layer MA73 may include a portion connected to the through contact plug P718 and a portion connected to the lower contact plugs 116. The third lower interconnection layer MA73 may extend in the horizontal direction at the first vertical level LV1 between the lower memory stack STA and the upper memory stack STB.

The through contact plug P718 may pass through the lower memory stack STA through the lower memory stack through-hole SAH and may be surrounded by the stack-burying insulating film 714 within the lower memory stack through-hole SAH. The stack-burying insulating film 714 may overlap vertically with the upper memory stack STB.

Figure 14:
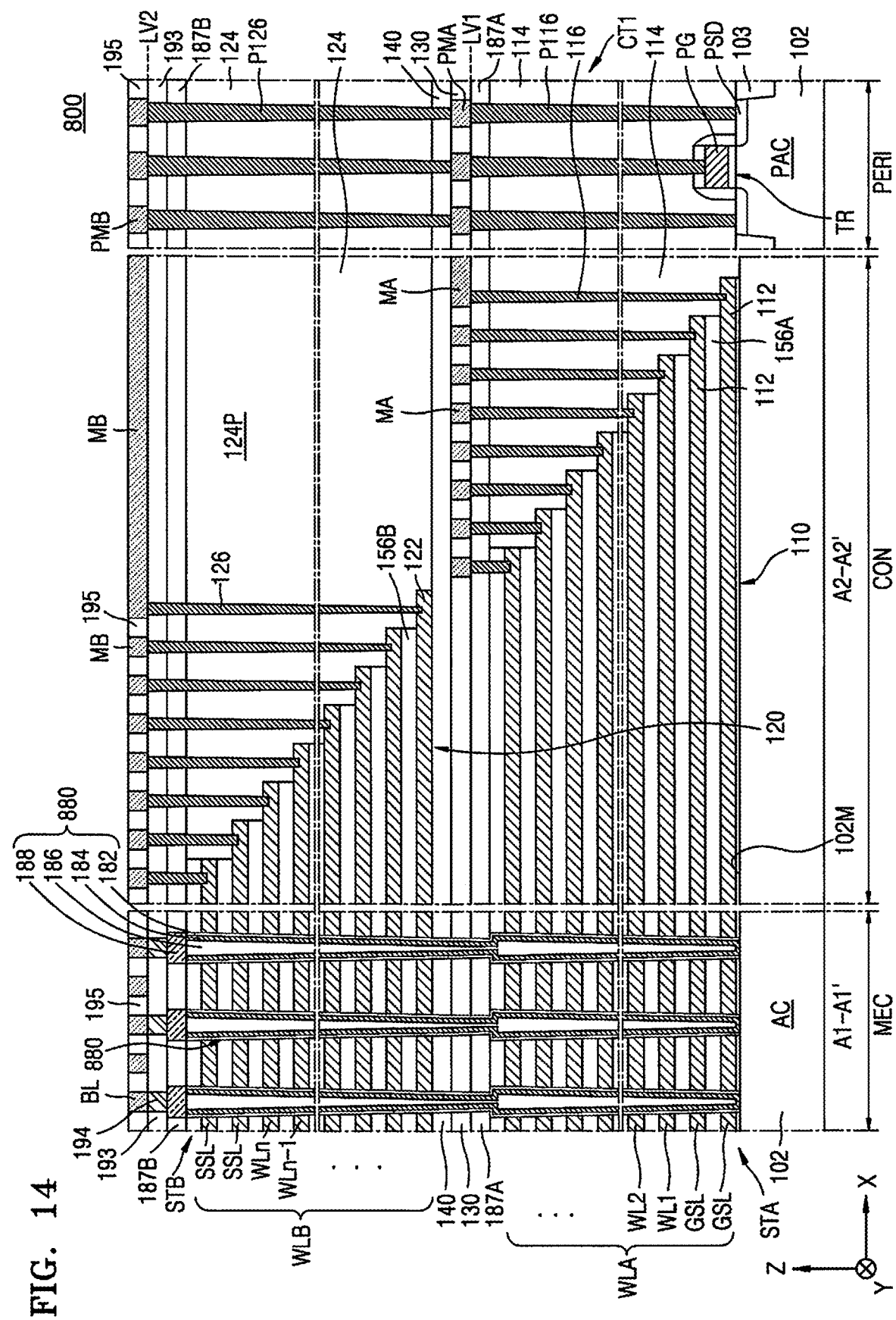

FIG. 14 shows a cross-sectional view of an integrated circuit device 800 according to some example embodiments of inventive concepts. FIG. 14 illustrates the configuration of a portion corresponding to a cross-section taken along line A1-A1' of FIG. 1, the configuration of a portion corresponding to a cross-section taken along line A2-A2' of FIG. 1, and the configuration of a portion corresponding to a cross-section of a portion of the peripheral circuit region PERI of FIG. 1.

Referring to FIG. 14, the integrated circuit device 800 has substantially the same configuration as the integrated circuit device 100 described with reference to FIGS. 1 to 7. A difference between the integrated circuit device 800 and the integrated circuit device 100 is that the integrated circuit device 800 includes a plurality of channel structures 880 instead of the channel structures 180.

The channel structures 880 may have substantially the same configuration as the channel structures 180 illustrated in FIGS. 2A and 2B. A difference between the channel structures 880 and the channel structures 180 is that in the channel structures 880, the gate dielectric film 182, the channel region 184, and the buried insulating film 186 extend in the vertical direction (Z direction) through the lower word lines WLA, the interlayer insulating film 130, the separate insulating film 140, the upper word lines WLB, and the insulating films 156A and 156B, and the drain region 188 is located only on the uppermost portion of the channel structure 880. Each of the channel structures 880 may not include the drain region 188 located at a level between the lower memory stack STA and the upper memory stack STB.

In the channel structures 880, a portion passing through the lower memory stack STA and a portion passing through the upper memory stack STB may each have a horizontal width which is increased as away from the substrate 102. In the channel structures 880, a horizontal width of the channel structures 880 around a portion between the lower memory stack STA and the upper memory stack STB, for example, an interface between the lower intermediate insulating film 187A and the uppermost insulating film from among the insulating films 156A of the lower memory stacks STA may be relatively, greatly changed.

Figure 15:
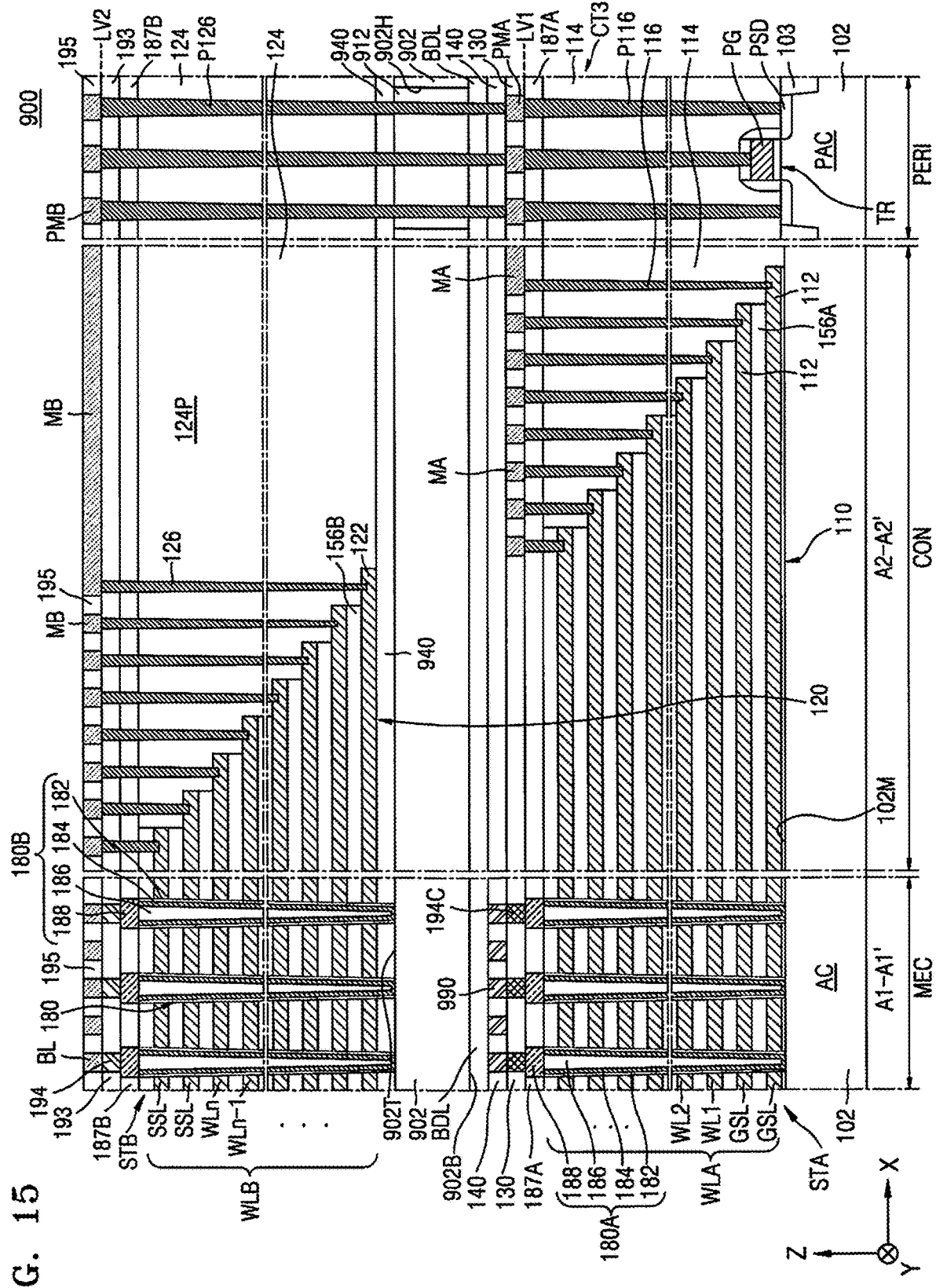

FIG. 15 shows a cross-sectional view of an integrated circuit device 900 according to some example embodiments of inventive concepts. FIG. 15 illustrates the configuration of a portion corresponding to a cross-section taken along line A1-A1' of FIG. 1, the configuration of a portion corresponding to a cross-section taken along line A2-A2' of FIG. 1, and the configuration of a portion corresponding to a cross-section of a portion of the peripheral circuit region PERI of FIG. 1.

Referring to FIG. 15, the integrated circuit device 900 has substantially the same configuration as the integrated circuit device 100 described with reference to FIGS. 1 to 7. A difference between the integrated circuit device 900 and the integrated circuit device 100 is that the integrated circuit device 900 further includes a bonding substrate 902 between the lower memory stack STA and the upper memory stack STB. A bonding layer BDL may be located between a bottom surface 902B of the bonding substrate 902 and the separate insulating film 140. An upper base insulating film 940 may be located between an upper surface 902T of the bonding substrate 902 and the upper memory stack STB.

The bonding substrate 902 may have substantially the same configuration as described with the substrate 102 in connection with FIGS. 2A and 2B. The bonding layer BDL may include at least one of silicon oxide, silicon nitride, SiCN, SiC, a polymer, or a combination thereof. The polymer may include at least one of polyimide, polyamide, polyacrylate, polyaramide, or a combination thereof. The upper base insulating film 940 may include a silicon oxide film.

The lower memory stack STA and the upper memory stack STB may be spaced apart from each other with the bonding substrate 902 and the bonding layer BDL therebetween. The lower interconnection layers MA and the upper interconnection layers MB may be spaced apart from each other with the bonding substrate 902 and the bonding layer BDL therebetween.

On the memory cell region MEC, a plurality of contact pads 194C connected to the drain regions 188 of the lower channel structures 180A and a plurality of conductive lines 990 connected to the contact pads 194C may be formed on the lower channel structures 180A. The contact pads 194C may be formed at the same level as the lower interconnection layers MA, that is, at the first vertical level LV1. The contact pads 194C may pass through the interlayer insulating film 130 and may contact the upper surfaces of the drain regions 188 of the lower channel structures 180A. The conductive lines 990 may pass through the separate insulating film 140 and may contact the upper surfaces of the contact pads 194C. Like the bit lines BL illustrated in FIGS. 1, 2A, and 2B, the conductive lines 990 may extend in the Y direction. In some example embodiments, the contact pads 194C may be configured to be electrically connected to the bit lines BL through the conductive lines 990. The contact pads 194C and the conductive lines 990 may each include metal, metal nitride, or a combination thereof. For example, the contact pads 194C and the conductive lines 990 may each include at least one of tungsten, titanium, tantalum, copper, aluminum, titanium nitride, tantalum nitride, tungsten nitride, or a combination thereof. The contact pads 194C and the conductive lines 990 may include the same material and/or may include different material.

On the peripheral circuit region PERI, a plurality of circuits CT3 may be formed. The circuits CT3 may include the peripheral transistor TR, the lower peripheral contact plugs P116, the lower peripheral interconnection layers PMA, the upper peripheral contact plugs P126, and the upper peripheral interconnection layers PMB. The upper peripheral contact plugs P126 may extend in the vertical direction (Z direction) through a through-hole 902H passing through the bonding substrate 902. The through-hole 902H may be filled with a buried insulating film 912. The upper peripheral contact plugs P126 may be surrounded by the buried insulating film 912 within the through-hole 902H. The lower peripheral interconnection layers PMA and the upper peripheral interconnection layers PMB may be spaced apart from each other with the bonding substrate 902 and the bonding layer BDL therebetween.

In some example embodiments, the circuits CT3 formed on the peripheral circuit region PERI may not include the upper peripheral contact plugs P126 passing through the bonding substrate 902 and the bonding layer BDL.

Figure 16:
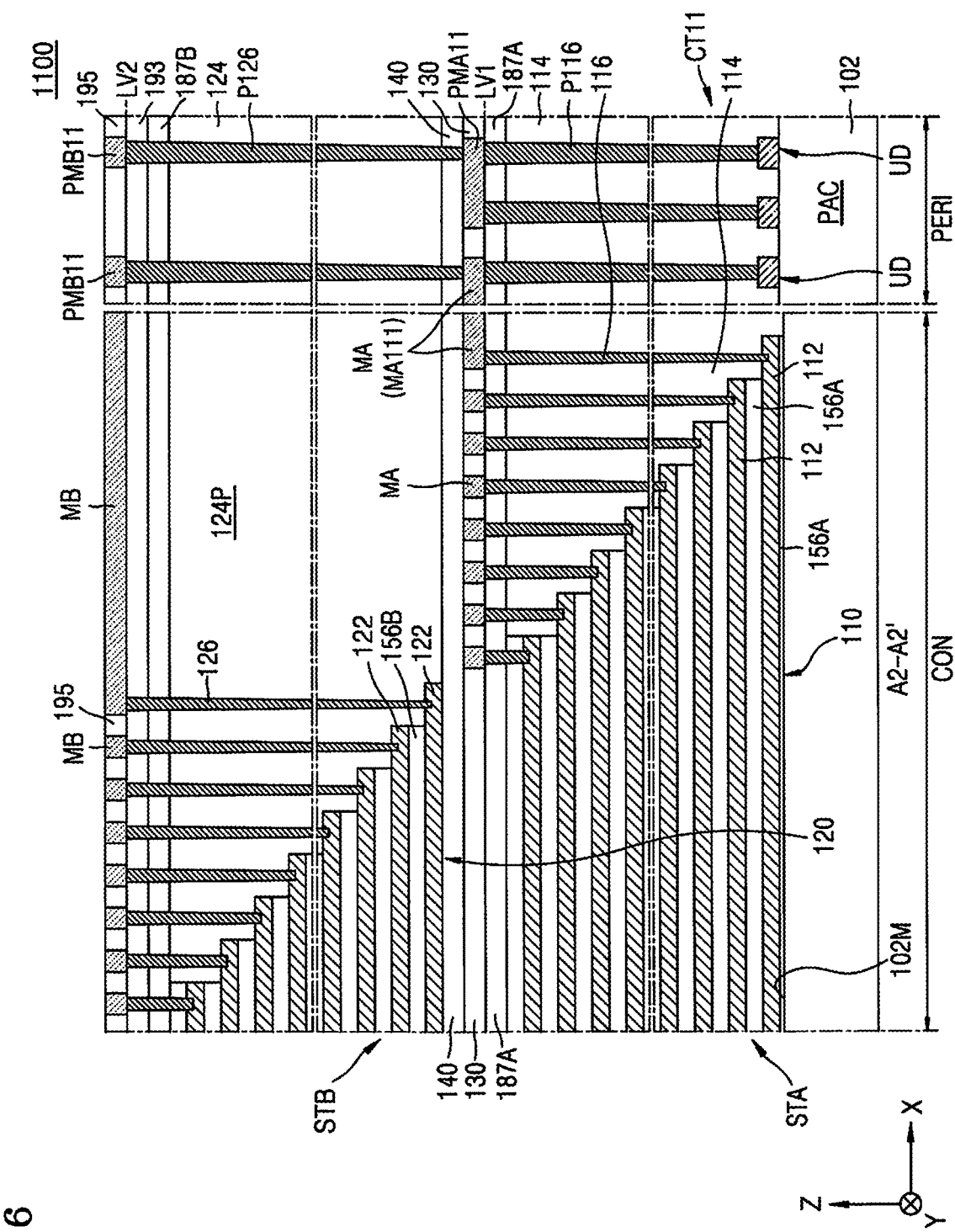

FIG. 16 shows a cross-sectional view of an integrated circuit device 1100 according to some example embodiments of inventive concepts. FIG. 16 illustrates the configuration of a portion corresponding to a cross-section taken along line A2-A2' of FIG. 1, and the configuration of a portion corresponding to a cross-section of a portion of the peripheral circuit region PERI of FIG. 1.

Referring to FIG. 16, the integrated circuit device 1100 has substantially the same configuration as the integrated circuit device 100 described with reference to FIGS. 1 to 7. A difference between the integrated circuit device 1100 and the integrated circuit device 100 is that the integrated circuit device 1100 includes a plurality of circuits CT11 formed on the peripheral circuit region PERI. The circuits CT11 may include a plurality of unit devices UD formed on the substrate 102. In some example embodiments, the unit devices UD may be at least one of transistors, resistors, or capacitors. In some example embodiments, the unit devices UD may constitute, or be included in, one selected from the row decoder 20, the page buffer 30, the column decoder 40, and the control circuit 50, which have been described in connection with FIG. 4.

The lower peripheral contact plugs P116 may be connected to the unit devices UD. In some example embodiments, at least one of the unit devices UD may be the peripheral transistor TR illustrated in FIG. 2A, and a portion of the unit devices UD, to which the lower peripheral contact plugs P116 are connected, may be the peripheral gate PG of the peripheral transistor TR. However, inventive concepts is not limited thereto.

A lower peripheral interconnection layer PMA11 may be formed on the lower peripheral contact plugs P116. The lower peripheral contact plugs P116 may be connected to one lower peripheral interconnection layer PMA11. FIG. 16 illustrates an embodiment in which two lower peripheral contact plugs P116 are connected to one lower peripheral interconnection layer PMA11, but inventive concepts is not limited thereto. In some example embodiments, three or more of the lower peripheral contact plugs P116 may be connected to one lower peripheral interconnection layer PMA11.

At least one of the lower interconnection layers MA formed on the connection region CON may include a lower interconnection layer MA111 extending integrally from the connection region CON to the peripheral circuit region PERI. The lower interconnection layer MA111 may include a portion connected to the lower contact plug 116 on the connection region CON, and a portion connected to the lower peripheral contact plug P116 on the peripheral circuit region PERI. The lower peripheral interconnection layer PMA11 and the lower interconnection layer MA111 may each extend in the horizontal direction at the first vertical level LV1.

The upper peripheral contact plugs P126 may be formed on the lower interconnection layer MA111 and the lower peripheral interconnection layer PMA11. The upper peripheral contact plugs P126 may include an upper peripheral contact plug P126 connected to the lower peripheral interconnection layer PMA11 and an upper peripheral contact plug P126 connected to the lower interconnection layer MA111. A plurality of upper peripheral interconnection layers PMB11 connected to the upper peripheral contact plugs P126 may be located on the upper peripheral contact plugs P126. The upper peripheral interconnection layers PMB11 may extend in the horizontal direction at the second vertical level LV2, which is the same level as that of the upper interconnection layers MB formed on the connection region CON. Each of the upper peripheral interconnection layers PMB11 may be configured to be connected to other circuits or interconnections located on the peripheral circuit region PERI. The upper peripheral interconnection layers PMB11 may be insulated from each other by the upper interlayer insulating film 195.

The lower peripheral interconnection layer PMA11, the lower interconnection layer MA111, and the upper peripheral interconnection layers PMB11 may each include at least one of tungsten, titanium, tantalum, copper, aluminum, titanium nitride, tantalum nitride, tungsten nitride, or a combination thereof. The lower peripheral interconnection layer PMA11, the lower interconnection layer MA111, and the upper peripheral interconnection layers PMB11 may include the same and/or different materials.

Figure 17:
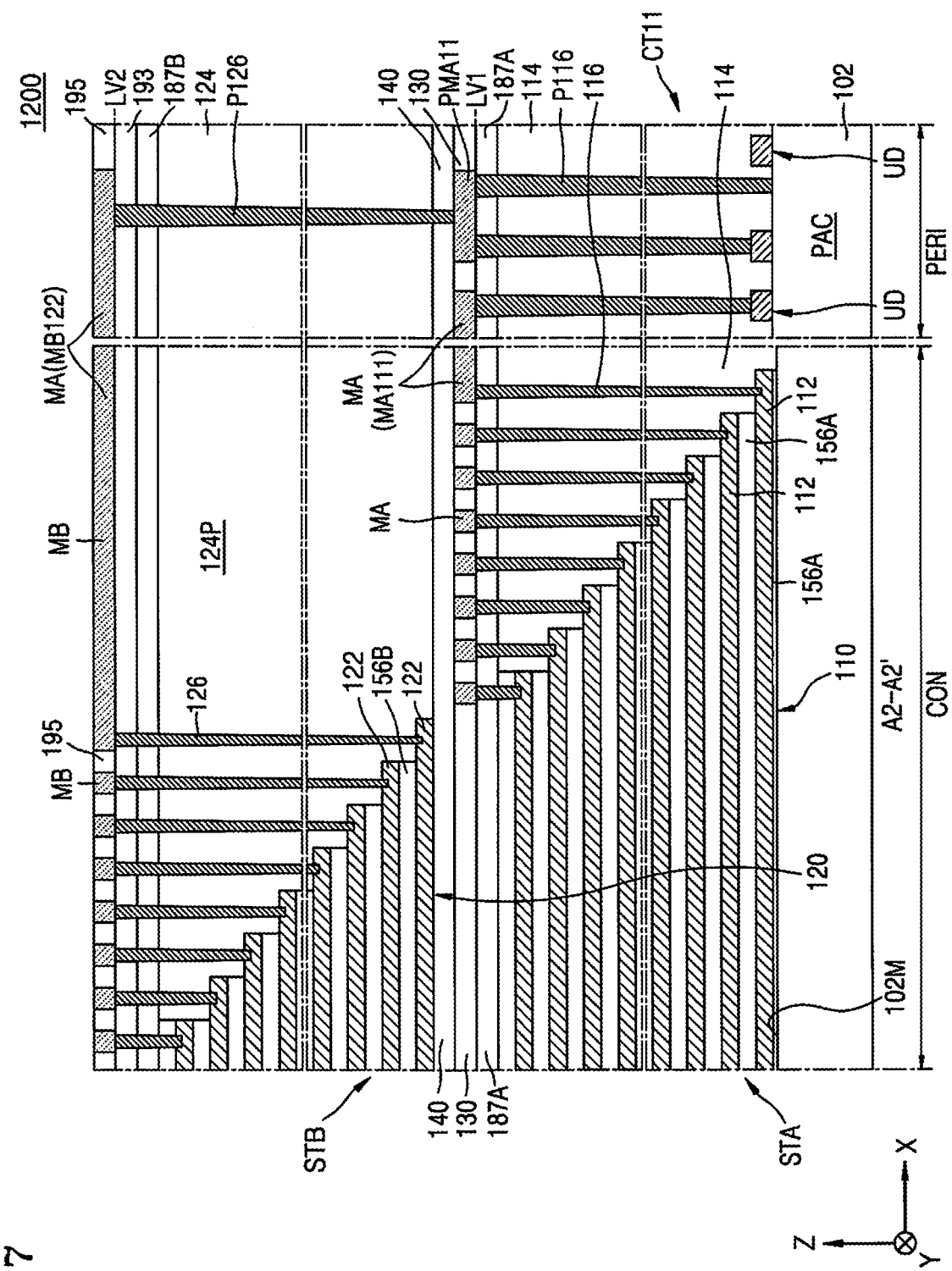

FIG. 17 shows a cross-sectional view of an integrated circuit device 1200 according to some example embodiments of inventive concepts. FIG. 17 illustrates the configuration of a portion corresponding to a cross-section taken along line A2-A2' of FIG. 1, and the configuration of a portion corresponding to a cross-section of a portion of the peripheral circuit region PERI of FIG. 1.

Referring to FIG. 17, the integrated circuit device 1200 has substantially the same configuration as the integrated circuit device 1100 described with reference to FIG. 16. A difference between the integrated circuit device 1200 and the integrated circuit device 1100 is that, in the integrated circuit device 1200, the plurality of lower peripheral contact plugs P116 on the peripheral circuit region PERI may include one lower peripheral contact plug P116 connected to the peripheral active region PAC. In some example embodiments, at least one of the unit devices UD may be the peripheral transistor TR illustrated in FIG. 2A, and a portion of the peripheral active region PAC, to which the lower peripheral contact plugs P116 are connected, may be the peripheral source/drain region PSD of the peripheral transistor TR. However, inventive concepts are not limited thereto.

At least one of the upper interconnection layers MB formed on the connection region CON may include an upper interconnection layer MB122 extending integrally from the connection region CON to the peripheral circuit region PERI. The upper interconnection layer MB122 may include a portion connected to the upper contact plug 126 on the connection region CON, and a portion connected to the upper peripheral contact plug P126 on the peripheral circuit region PERI. The upper interconnection layer MB122 may extend in the horizontal direction at the second vertical level LV2.

Figure 18:
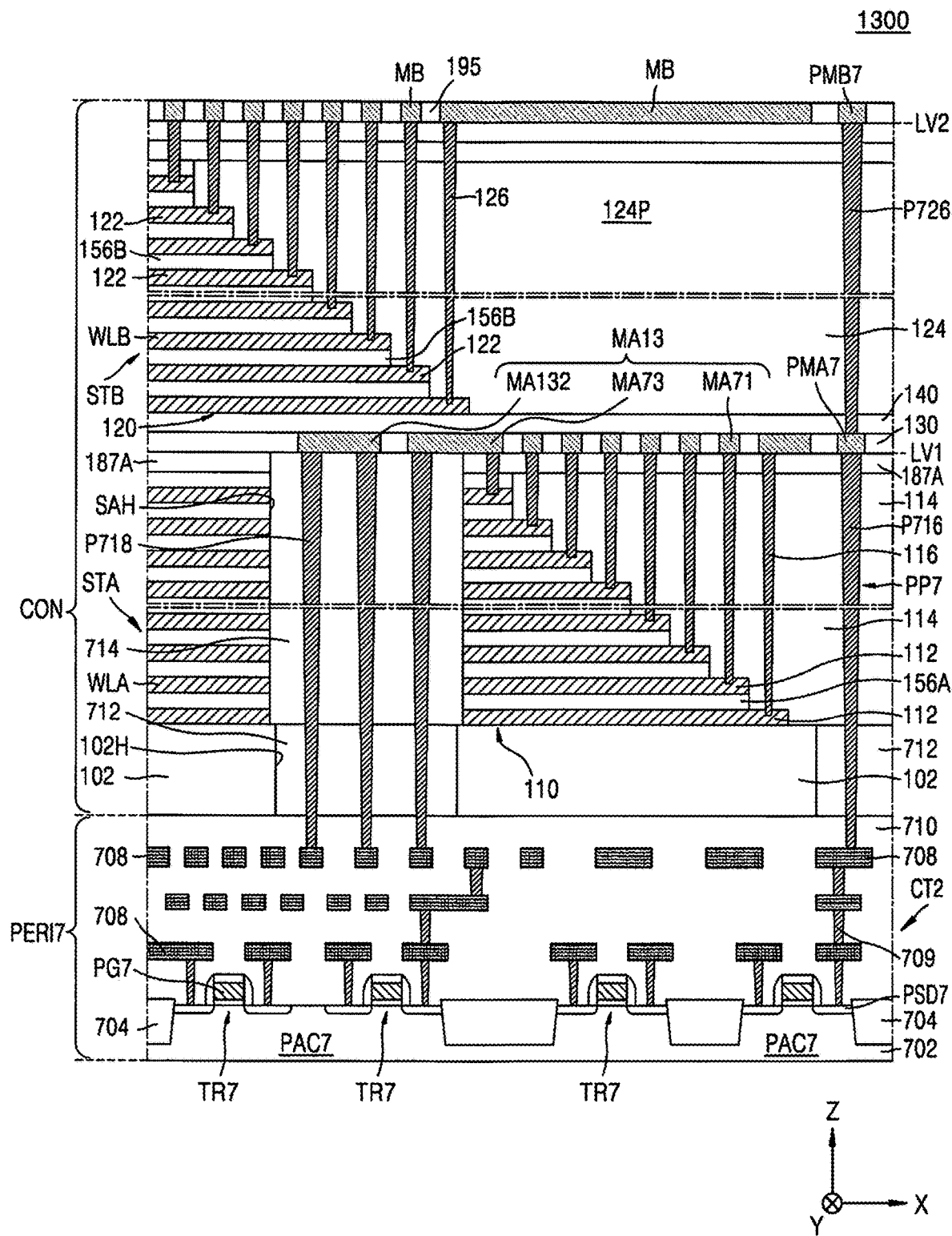

FIG. 18 shows a cross-sectional view of an integrated circuit device 1300 according to some example embodiments of inventive concepts.

Referring to FIG. 18, the integrated circuit device 1300 has substantially the same configuration as the integrated circuit device 700 described with reference to FIG. 13. A difference between the integrated circuit device 1300 and the integrated circuit device 700 is that the integrated circuit device 1300 includes a plurality of lower interconnection layers MA13 instead of the lower interconnection layers MA7. The lower interconnection layers MA13 may extend in the horizontal direction at the first vertical level LV1 between the lower memory stack STA and the upper memory stack STB. The lower interconnection layers MA13 may include at least one first lower interconnection layer MA71 configured to be electrically connected to at least one lower word lines selected from the lower word lines WLA, a second lower interconnection layer MA132 configured to be electrically connected to at least one peripheral circuit interconnection layers 708 selected from the peripheral circuit interconnection layers 708 included in the peripheral circuit region PERI7, and a third lower interconnection layer MA73 connected between the lower word lines WLA and the peripheral circuit interconnection layer 708. The second lower interconnection layer MA132 may extend in the horizontal direction to be connected to a plurality of through contact plugs P718. The through contact plugs P718 connected to one second lower interconnection layer MA132 may be different unit devices selected from the circuits CT2 included in the peripheral circuit region PERI7, for example, different transistors, resistors, or capacitors. FIG. 18 illustrates an embodiment in which two through contact plugs P718 are connected to one second lower interconnection layer MA132, but inventive concepts are not limited thereto. In some example embodiments, three or more of the through contact plugs P718 may be connected to one second lower interconnection layer MA132.

Figure 19:
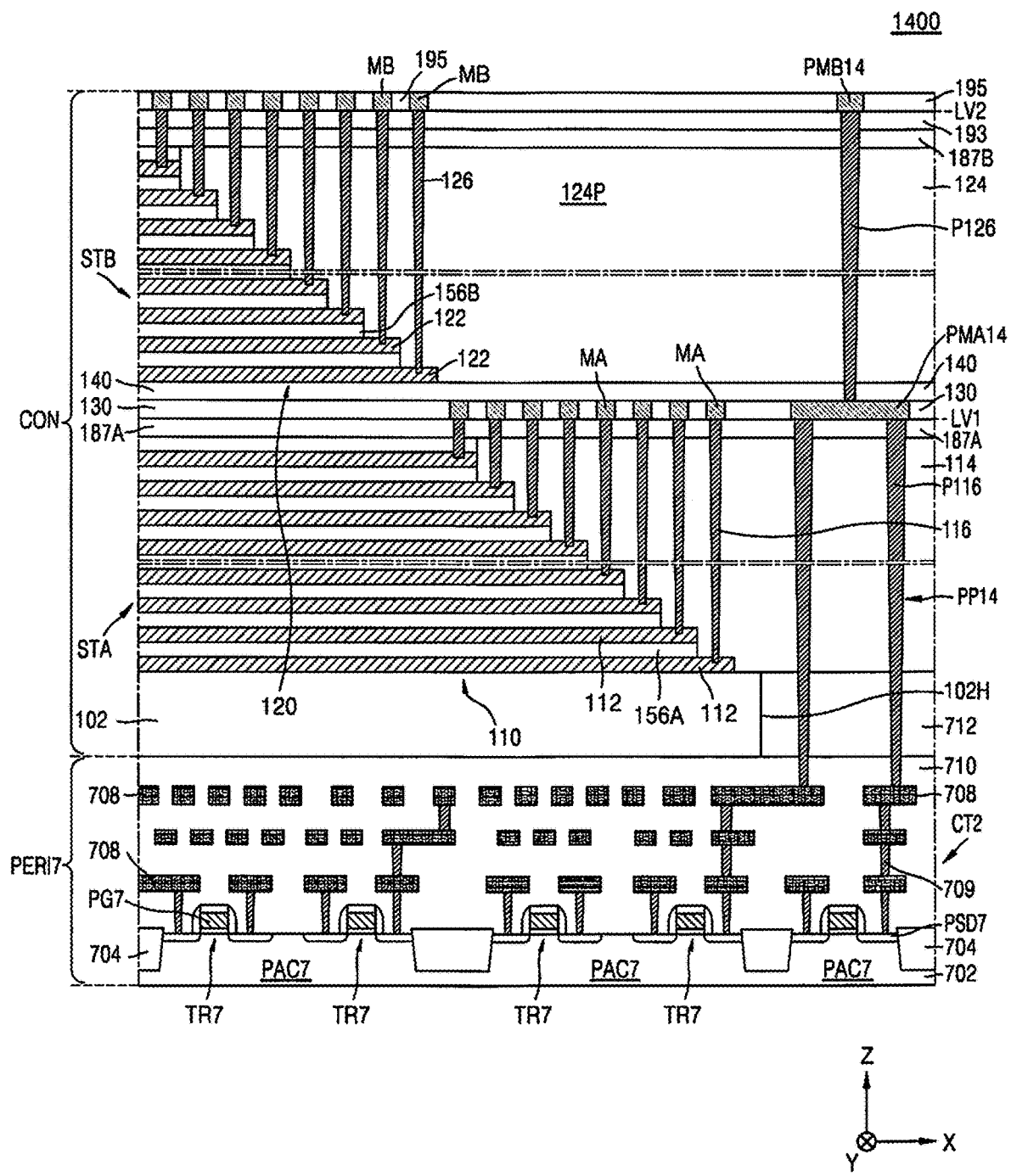

FIG. 19 shows a cross-sectional view of an integrated circuit device 1400 according to some example embodiments of inventive concepts.

Referring to FIG. 19, the integrated circuit device 1400 has substantially the same configuration as the integrated circuit device 100 described with reference to FIGS. 1 to 7. A difference between the integrated circuit device 1400 and the integrated circuit device 700 is that like the integrated circuit device 700 described in connection with FIG. 13, the integrated circuit device 1400 may include the peripheral circuit region PERI7 formed at a lower level than that of the substrate 102. The memory cell region MEC (see FIGS. 2A and 2B) and the connection region CON may overlap vertically with the peripheral circuit region PERI7.

In the integrated circuit device 1400, interconnection structures located on the connection region CON may be configured to be electrically connected to the peripheral circuit interconnection layers 708 located on the peripheral circuit region PERI7 through at least one connection plug PP14 extending in the vertical direction (Z direction).

The connection plug PP14 may extend from one peripheral circuit interconnection layer selected from the peripheral circuit interconnection layers 708 beyond the substrate 102 through the substrate 102.

The connection plug PP14 may include a lower peripheral interconnection layer PMA14 located at the first vertical level LV1, which is a level identical to the level of the lower interconnection layers MA, and an upper peripheral interconnection layer PMB14 located at the second vertical level LV2, which is a level identical to that of the upper interconnection layers MB. The connection plug PP14 may further include lower peripheral contact plugs P116. The lower peripheral contact plug P116 may each extend in the vertical direction (Z direction) from one peripheral circuit interconnection layer selected from the peripheral circuit interconnection layers 708 to the lower peripheral interconnection layer PMA14 through the peripheral interlayer insulating film 710 and the substrate-buried insulating film 712. The lower peripheral contact plugs P116 may pass through the substrate 102 through the through-hole 102H and may be surrounded by the substrate-buried insulating film 712 in the through-hole 102H.

The lower peripheral contact plugs P116 may be connected to one lower peripheral interconnection layer PMA14. FIG. 19 illustrates an embodiment in which two lower peripheral contact plugs P116 are connected to one lower peripheral interconnection layer PMA14, but inventive concepts are not limited thereto. In some example embodiments, three or more of the lower peripheral contact plugs P116 may be connected to one lower peripheral interconnection layer PMA14.

The connection plug PP14 may further include the upper peripheral contact plug P126. The upper peripheral contact plug P126 may extend in the vertical direction (Z direction) from the lower peripheral interconnection layer PMA14 to the upper peripheral interconnection layer PMB14 through the separate insulating film 140, the upper insulating film 124, the upper intermediate insulating film 187B, and the insulating film 193.

Like the lower peripheral interconnection layers PMA described in connection with FIG. 7, the lower peripheral interconnection layer PMA14 may extend in the first horizontal direction (X direction) and the second horizontal direction (Y direction) at the first vertical level LV1. The upper peripheral interconnection layer PMB14 may extend in the first horizontal direction (X direction) and the second horizontal direction (Y direction) at the second vertical level LV2. The lower peripheral interconnection layer PMA14 and the upper peripheral interconnection layer PMB14 may each include at least one of tungsten, titanium, tantalum, copper, aluminum, titanium nitride, tantalum nitride, tungsten nitride, or a combination thereof. The lower peripheral interconnection layer PMA14 and the upper peripheral interconnection layer PMB14 may include the same material and/or may include different material.

Figure 20:
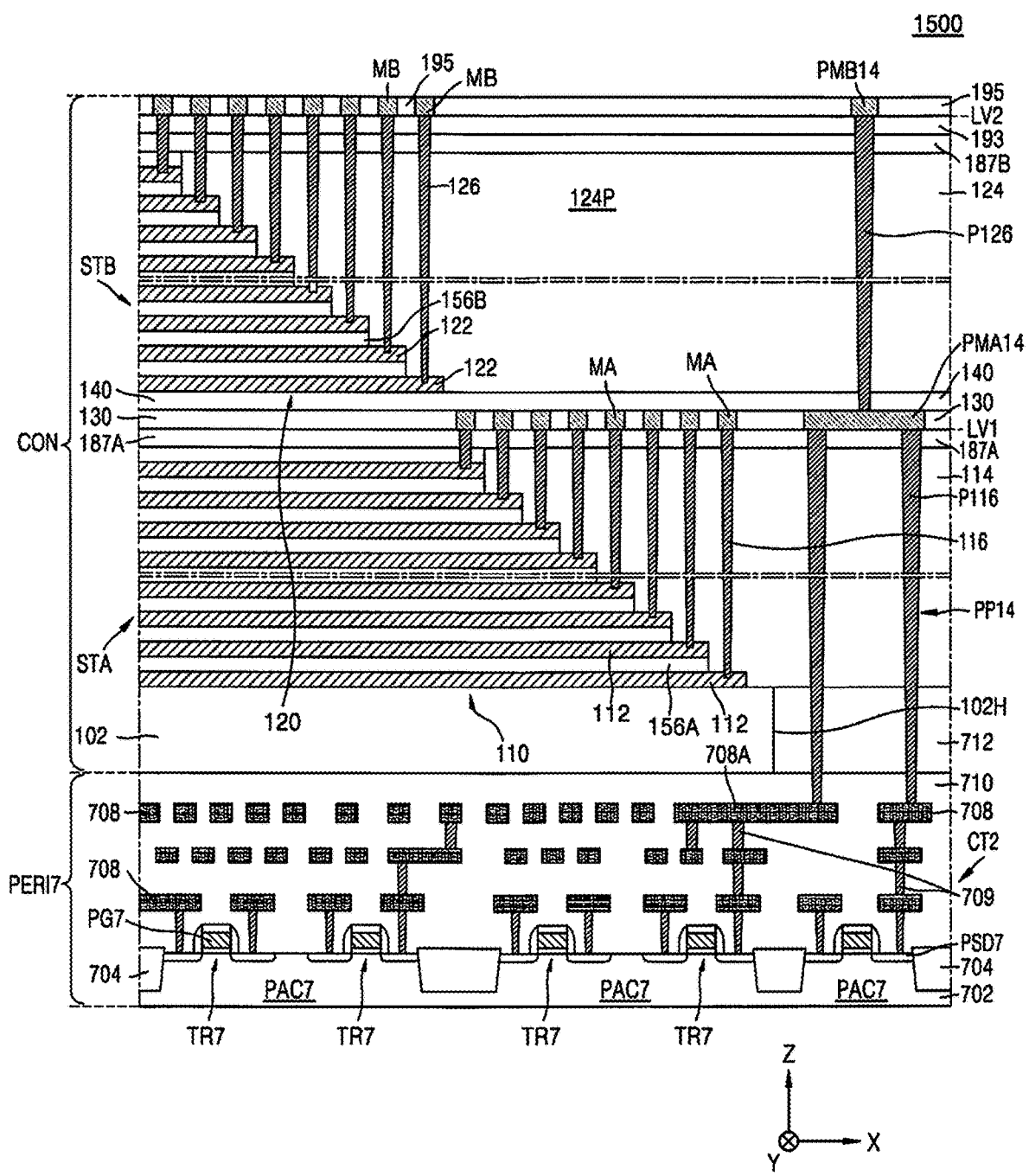

FIG. 20 shows a cross-sectional view of an integrated circuit device 1500 according to some example embodiments of inventive concepts.

Referring to FIG. 20, the integrated circuit device 1500 has substantially the same configuration as the integrated circuit device 1400 described with reference to FIG. 19. A difference between the integrated circuit device 1500 and the integrated circuit device 1400 is that, in the integrated circuit device 1500, the peripheral circuit interconnection layers 708 located on the peripheral circuit region PERI7 may include a peripheral circuit interconnection layer 708A having a lower surface contacting the peripheral circuit contacts 709, and one lower peripheral contact plug P116 selected from the lower peripheral contact plugs P116 constituting the connection plug PP14 may extend in the vertical direction to interconnect the peripheral circuit interconnection layer 708A and the lower peripheral interconnection layer PMA14 between the peripheral circuit interconnection layer 708A and the lower peripheral interconnection layer PMA14.

Inventive concepts are not limited solely to example embodiments described in the integrated circuit devices 100, 200, 300, 400, 500, 600, 700, 800, 900, 1100, 1200, 1300, 1400, and 1500. For example, the integrated circuit devices 100, 200, 300, 400, 500, 600, 700, 800, 900, 1100, 1200, 1300, 1400, and 1500 are not meant to be mutually exclusive with one another, and an integrated circuit device according to some example embodiments may include features from multiple ones of the integrated circuit devices 100, 200, 300, 400, 500, 600, 700, 800, 900, 1100, 1200, 1300, 1400, and 1500.

According to the integrated circuit devices 100, 200, 300, 400, 500, 600, 700, 800, 900, 1100, 1200, 1300, 1400, 1500 described with reference to FIGS. 1 to 20, even when, to increase the integration degree of an integrated circuit device, the number of word lines WL: WL1, WL2, through WLn−1, and WLn included in the lower word lines WLA and the upper word lines WLB is increased and the number of contact plugs and the number of interconnection layers, connected to the lower word lines WLA and the upper word lines WLB, are increased, since a plurality of lower contact plugs and a plurality of lower interconnection layers, connected to the lower word lines WLA, and a plurality of upper contact plugs and a plurality of upper interconnection layers, connected to the upper word lines WLB, are arranged at different vertical levels, a plurality of contact plugs and a plurality of interconnection layers connected to the lower word lines WLA and the upper word lines WLB may be efficiently arranged, and the areas occupied by the desired numbers of a plurality of contact plugs and a plurality of interconnection layers may be reduced, and thus, the area of a chip may be reduced. A reduction in the area of the chip may lead to an improvement in fabrication yield. In detail, since a plurality of lower contact plugs and a plurality of lower interconnection layers, connected to the lower memory stack STA, are arranged at a lower level than the upper memory stacks STB, STB4, STB5, and STB6, the area occupied by a stepped connection portion of each of a plurality of memory stacks, vertically spaced from each other, is reduced, thereby contributing to a decrease in the size of a chip and/or an improvement in fabrication yield.

FIGS. 21A to 21J show cross-sectional views sequentially illustrated according to a process order to explain a method of fabricating an integrated circuit device according to some example embodiments of inventive concepts. In example embodiment, the method of fabricating the integrated circuit device 100 illustrated in FIGS. 1, 2A, and 2B will be described as an example.

Figure 21A:
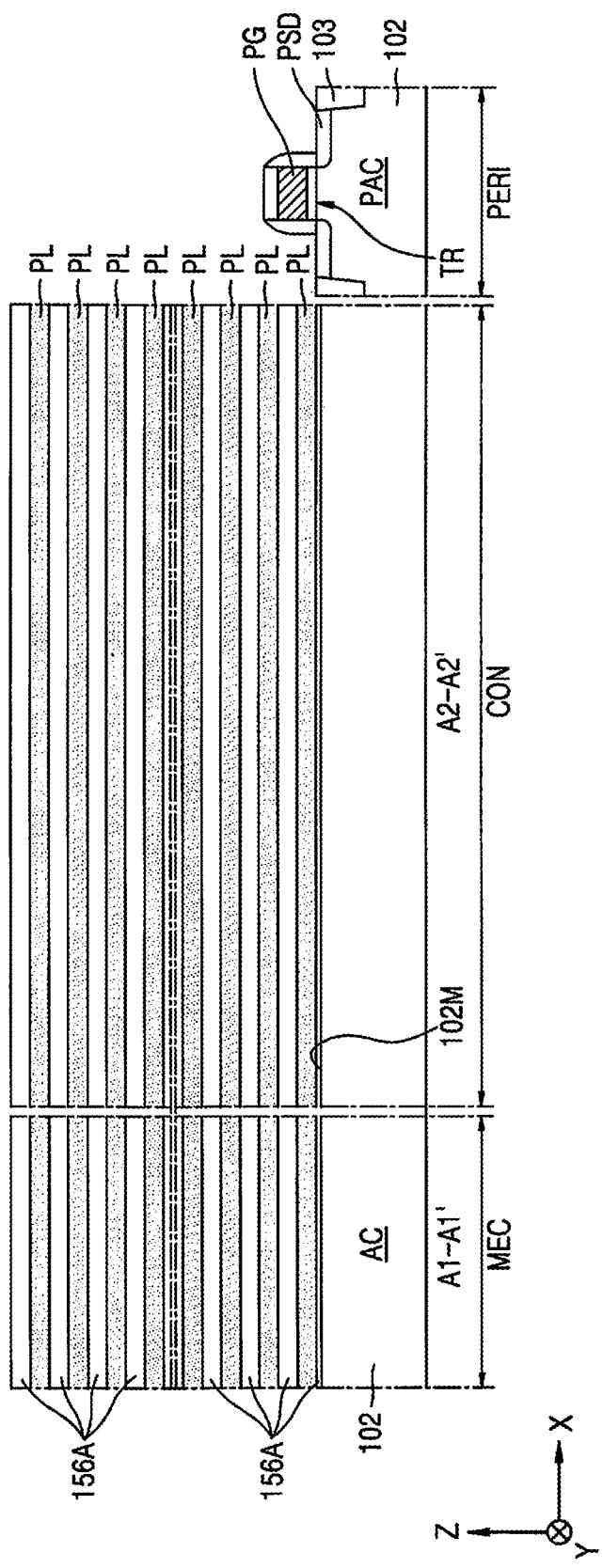
FIGS. 21A to 21J show cross-sectional views illustrated according to a process order to explain a method of fabricating an integrated circuit device according to some example embodiments of inventive concepts.

Referring to FIG. 21A, the active area AC is defined in the memory cell region MEC of the substrate 102, and the peripheral active region PAC is defined in the peripheral circuit region PERI. The peripheral active region PAC may be defined by the device isolation film 103.

A plurality of insulating films 156A and a plurality of sacrificial films PL are alternately stacked one by one on the memory cell region MEC and the connecting region CON of the substrate 102, and the peripheral transistor TR is formed on the peripheral circuit region PERI of the substrate 102. The plurality of insulating films 156A and the plurality of sacrificial films PL may be formed with a chemical vapor deposition (CVD) process or an atomic layer deposition (ALD) process; however, inventive concepts are not limited thereto. The peripheral active region PAC may be formed with a CMOS integration process, such as a planar CMOS integration process; however, inventive concepts are not limited thereto.

The sacrificial films PL may include at least one of silicon nitride, silicon carbide, or polysilicon. The sacrificial films PL may ensure a space for forming lower word lines WLA in respective subsequent processes.

Figure 21B:
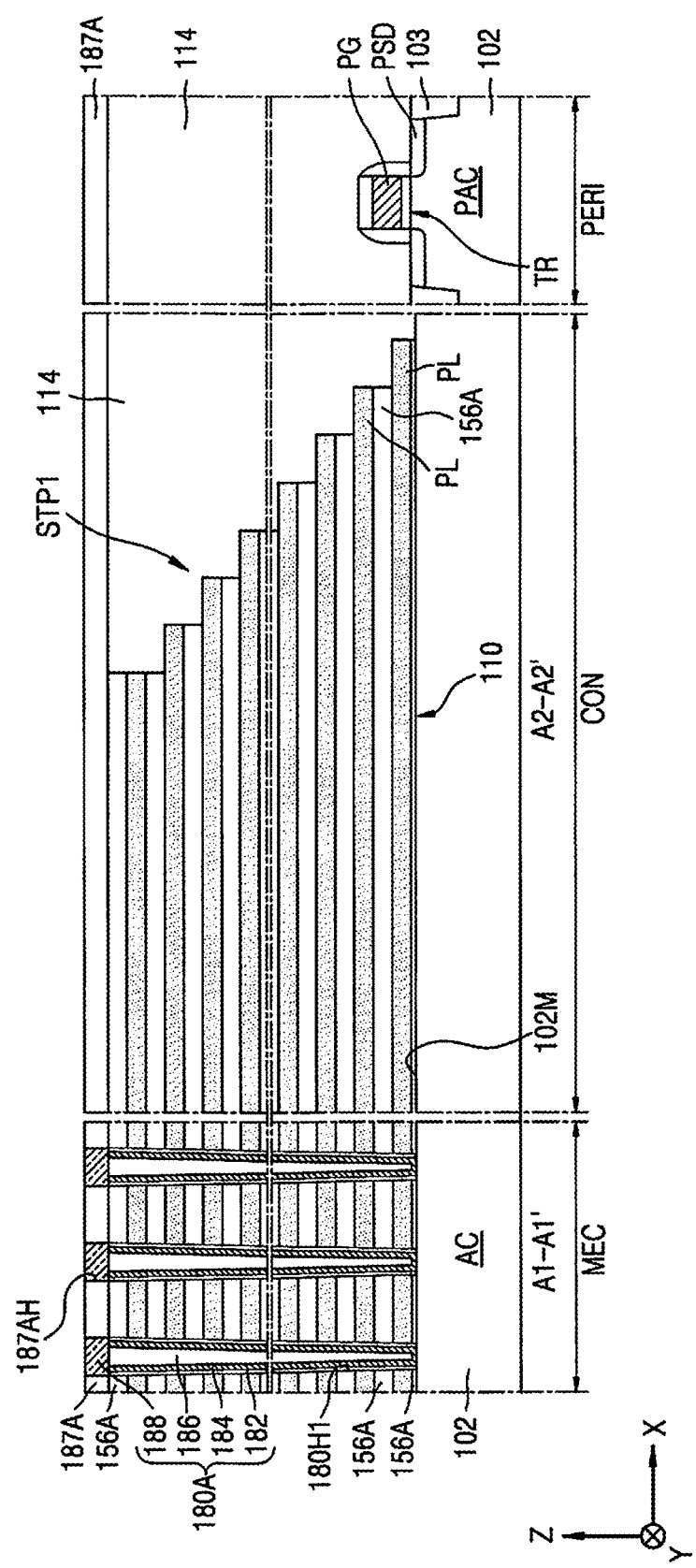

Referring to FIG. 21B, a portion of each of the insulating films 156A and the sacrificial films PL is removed such that the insulating films 156A and the sacrificial films PL form a lower stepped structure STP1, and then the lower insulating film 114 covering the lower stepped structure STP1 and the peripheral transistor TR is formed on the substrate 102. The portion of each of the insulating films 156A and the sacrificial films PL may be removed with an etching process, such as a reactive ion etching (RIE) process; however, inventive concepts are not limited thereto. The lower insulating film 114 may be formed with a CVD process, such as a plasma enhanced CVD (PECVD) process and/or a low pressure CVD (LPCVD) process; however, inventive concepts are not limited thereto.

Then, on the memory cell region MEC, a plurality of lower channel holes 180H1 extending in the vertical direction (Z direction) through the insulating films 156A and the sacrificial films PL are formed, and the gate dielectric film 182, the channel region 184, and the buried insulating film 186 are formed in each of the lower channel holes 180H1 to form a plurality of lower channel hole filling structures. The plurality of lower channel holes 180H1 may be formed with an etching process. The gate dielectric film 182 may be formed with a CVD process such or ALD process.

Then, on the memory cell region MEC, the connection region CON, and the peripheral circuit region PERI, the lower intermediate insulating film 187A covering the lower channel hole filling structure, the lower stepped structure STP1, and the lower insulating film 114 is formed, and a plurality of contact holes 187AH are formed in the lower intermediate insulating film 187A to expose an upper surface of the lower channel hole filling structure, and a plurality of drain regions 188 are formed inside the contact holes 187AH. The lower intermediate insulating film 187A may be formed to have a planarized upper surface over the memory cell region MEC, the connection region CON, and the peripheral circuit region PERI. The lower intermediate insulating film 187A may be deposited with a CVD process, and may be planarized with a chemical mechanical planarization (CMP) process and/or an etch back process; however, inventive concepts are not limited thereto.

Figure 21C:
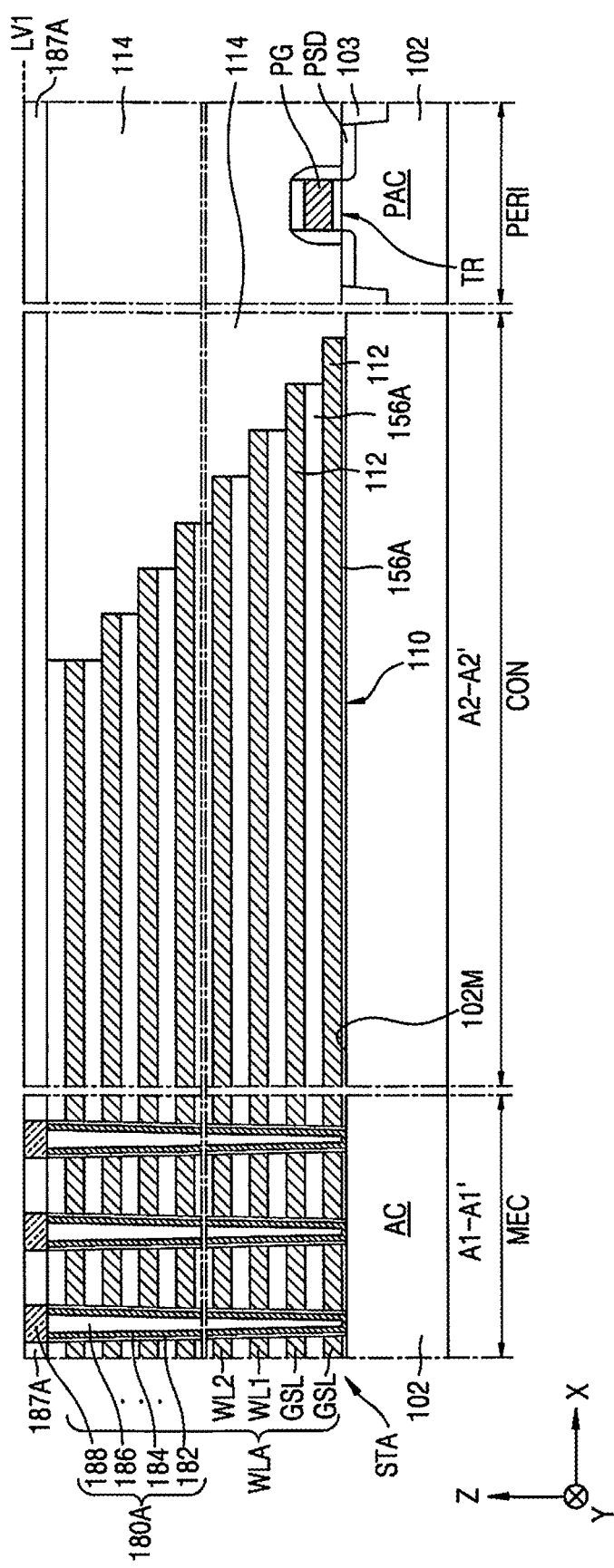

Referring to FIG. 21C, the word line cut regions WLC (see FIGS. 1 and 2B) passing through the insulating films 156A and the sacrificial films PL (see FIG. 21B) and exposing the substrate 102 are formed, for example with a reactive ion etch (RIE) process, and then, impurity ions, such as at least one of boron ions, arsenic ions, phosphorus ions, or carbon ions, are implanted into the substrate 102 through the word line cut regions WLC to form the common source regions 106 (see FIG. 2B), and the sacrificial films PL (see FIG. 21B) are replaced with the lower word lines WLA.

In some example embodiments, to replace the sacrificial films PL (see FIG. 21B) with the lower word lines WLA, the sacrificial films PL (see FIG. 21B) exposed by the word line cut regions WLC are selectively removed to provide a space between adjacent films selected from the insulating films 156A, and then, the space is filled with a conductive material to form the lower word lines WLA. In this case, the lower word lines WLA may be formed by using metal materials, such as at least one of tungsten, tantalum, cobalt, nickel, or the like.

In some example embodiments, when the sacrificial films PL include polysilicon, a silicidation process may be performed on the sacrificial films PL to replace the sacrificial films PL (see FIG. 21B) with the lower word lines WLA. In this case, the lower word lines WLA may each include at least one of tungsten silicide, tantalum silicide, cobalt silicide, or nickel silicide.

Thereafter, the lower insulating spacer 192A and the lower common source line CSLA are formed in each of the word line cut regions WLC (see FIGS. 1 and 2B) to form the lower word line cut structure WCA. The lower insulating spacer 192A may include at least one of silicon oxide, silicon nitride, SiON, SiOCN, SiCN, or a combination thereof. The lower common source line CSLA may include metals such as at least one of tungsten, copper, or aluminum; a conductive metal nitride such as at least one of titanium nitride, tantalum nitride, or the like; transition metals such as at least one of titanium, tantalum, and the like; or a combination thereof. In some example embodiments, a metal silicide film (not shown) may be located between the common source regions 106 and the lower common source line CSLA to reduce the contact resistance therebetween. The metal silicide film may include cobalt silicide, but is not limited thereto. In some example embodiments, when a common source line (not shown) is buried in the substrate 102, the word line cut regions WLC may be filled with only an insulator, and the process for forming the lower common source line CSLA may be omitted.

By replacing the sacrificial films PL with the lower word lines WLA in the lower stepped structure STP1 (see FIG. 21B), the lower memory stack STA including the stepped lower connection portion 110 located on the connection region CON may be obtained.

Figure 21D:
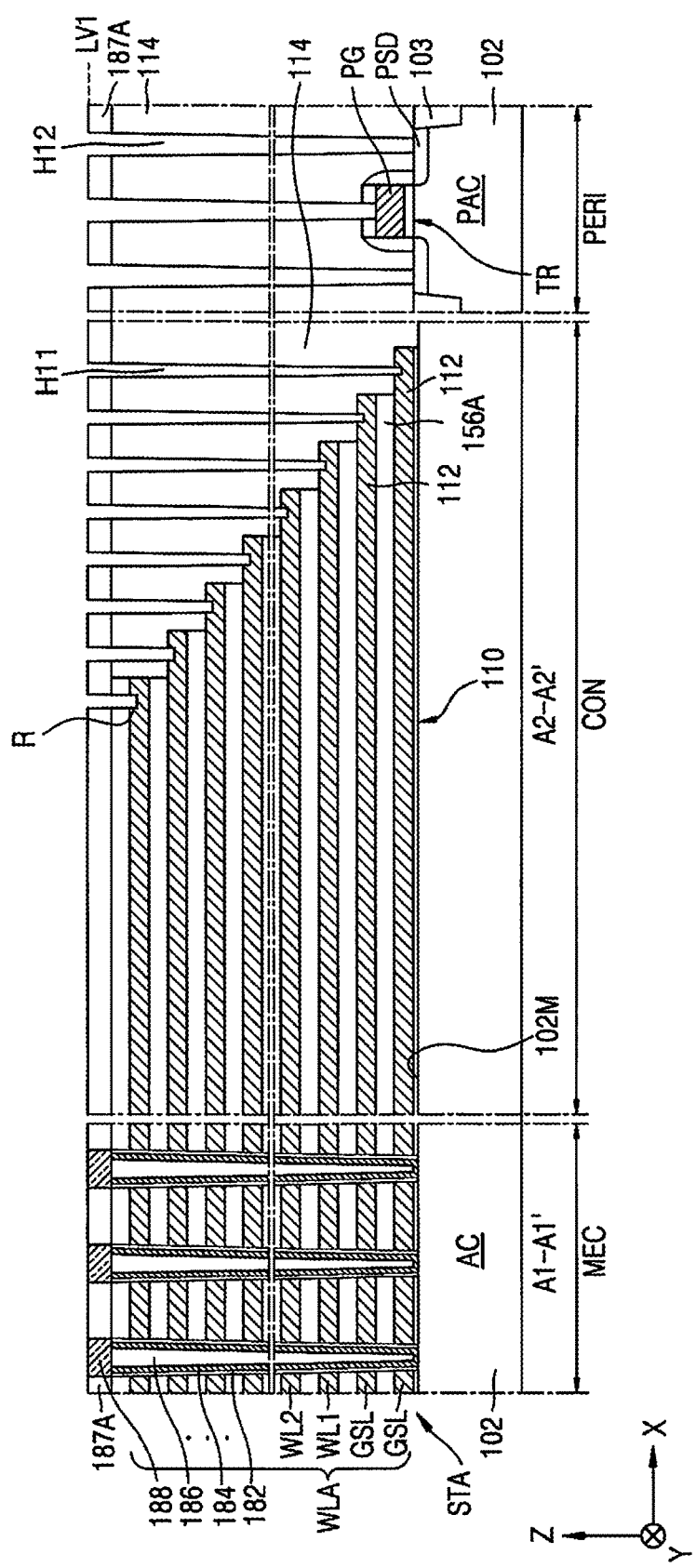

Referring to FIG. 21D, by using a mask pattern (not shown) as an etching mask, the lower intermediate insulating film 187A and the lower insulating film 114 are anisotropically etched, for example anisotropically etched with a RIE process, on the connection region CON and the peripheral circuit region PERI to form a plurality of lower contact holes H11 exposing the lower pad regions 112 on the connection region CON, and a plurality of peripheral lower contact holes H12 exposing the peripheral gate PG and peripheral source/drain region PSD are formed on the peripheral circuit region PERI. The lower contact holes H11 and the peripheral lower contact holes H12 may be formed at the same time. Regarding the formation of the lower contact holes H11 and the peripheral lower contact holes H12, after the lower memory stack STA is formed and before the upper memory stack STB (see FIG. 2A) is formed, an etching process such as a RIE process for forming the lower contact holes H11 and the peripheral lower contact holes H12 is performed. Thus, unlike the case in which after the upper memory stack STB (see FIG. 2A) is formed, an etching process for forming a plurality of contact holes exposing the lower pad regions 112 is performed, the lower contact holes H11 and the peripheral lower contact holes H12 may be formed to have a relatively small aspect ratio. For example, a difference in aspect ratios between different lower contact holes H11 may be reduced and a range therein reduced. Therefore, the degree of process difficulty may be reduced. During the lower contact holes H11 formation, portions of the lower word lines WLA exposed to lower surfaces of the lower contact holes H11 may be excessively etched, resulting in the formation of a recess R on an upper surface of each of the lower word lines WLA corresponding to the lower contact holes H11. In some cases, the recess R may not be formed on the upper surface of each of the plurality of lower word lines WLA. Likewise, on the peripheral circuit region PERI, a recess (not shown) may be formed or may not be formed on portions of the upper surfaces of the peripheral gate PG and the peripheral source/drain region PSD which correspond to the peripheral lower contact holes H12.

Figure 21E:
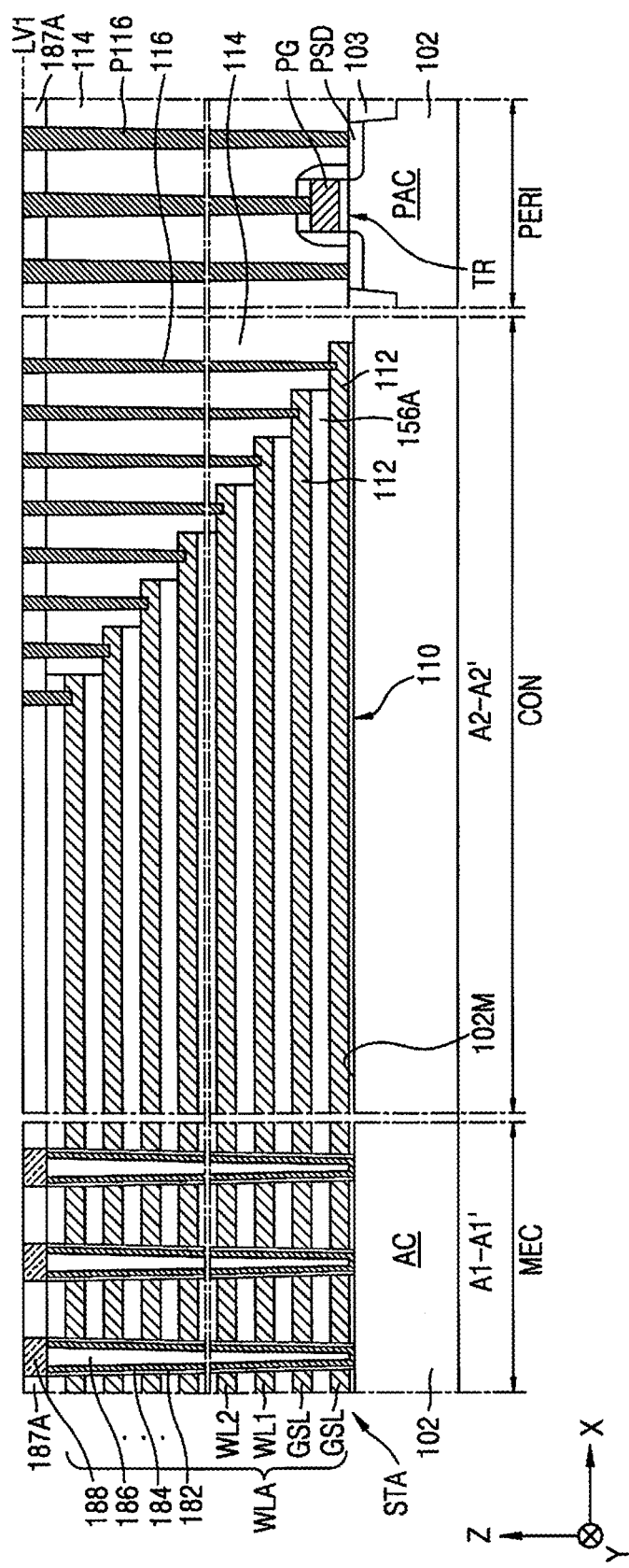

Referring to FIG. 21E, the lower contact holes H11 and the peripheral lower contact holes H12 are filled with a conductive material to form the lower contact plugs 116 and the lower peripheral contact plugs P116. The lower contact plugs 116 and the lower peripheral contact plugs P116 may be formed at the same, or at different, times. The lower contact plugs 116 and the lower peripheral contact plugs P116 may be formed with a CVD process and/or with a physical vapor deposition (PVD) process such as a sputter process. A planarization process such as a CMP process may be included in the formation of the lower contact plugs 116 and the lower peripheral contact plugs P116.

Figure 21F:
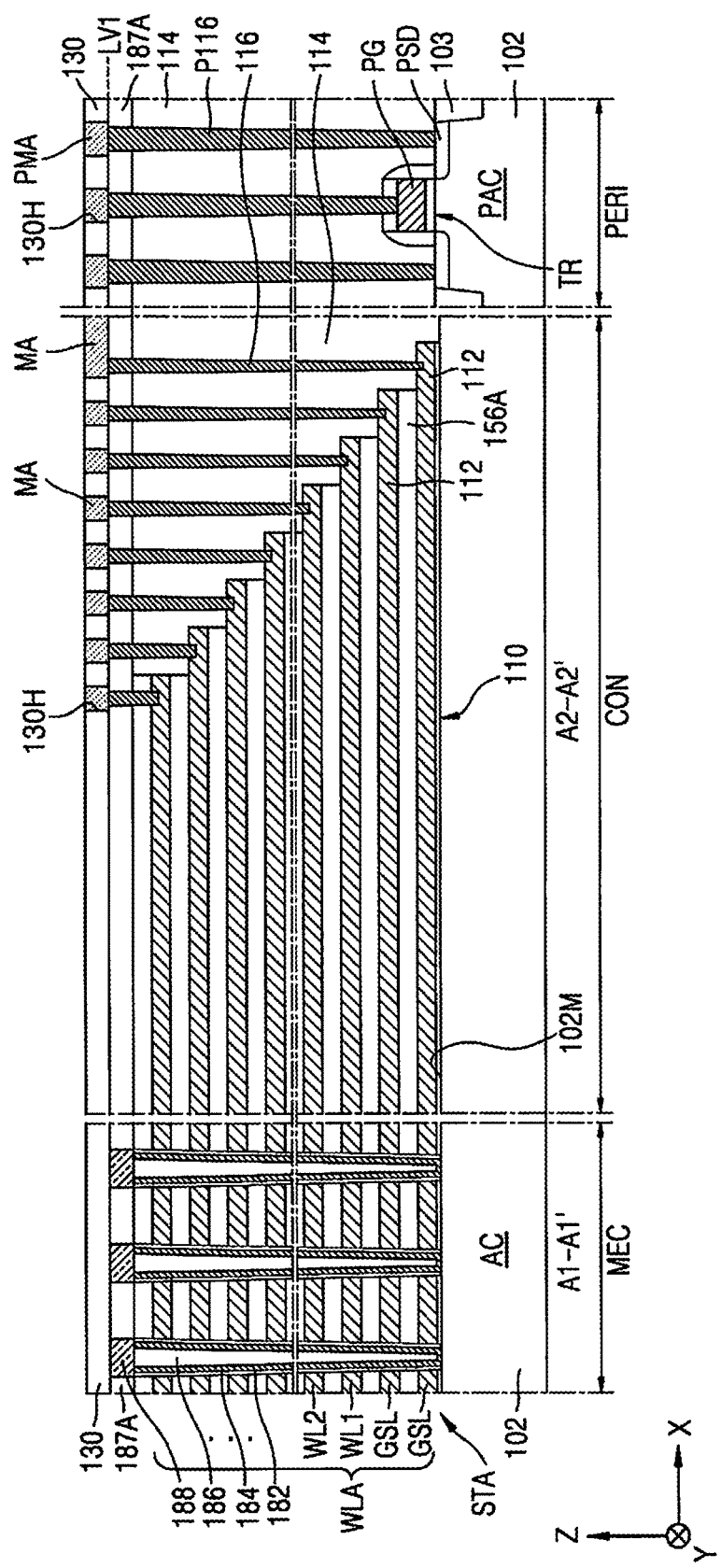

Referring to FIG. 21F, on the result of FIG. 21E, the interlayer insulating film 130 is formed for example with a CVD process, and a portion of the interlayer insulating film 130 is etched to form a plurality of interconnection holes 130H exposing the lower contact plugs 116 and the lower peripheral contact plugs P116, and then, the interconnection holes 130H are filled with a conductive material to form the lower interconnection layers MA and the lower peripheral interconnection layers PMA. The interconnection holes 130H may be filled by a CVD process and/or a PVD process. A planarization process such as a CMP process may be included in the forming of the lower interconnection layers MA and the lower peripheral interconnection layers PMA.

Figure 21G:
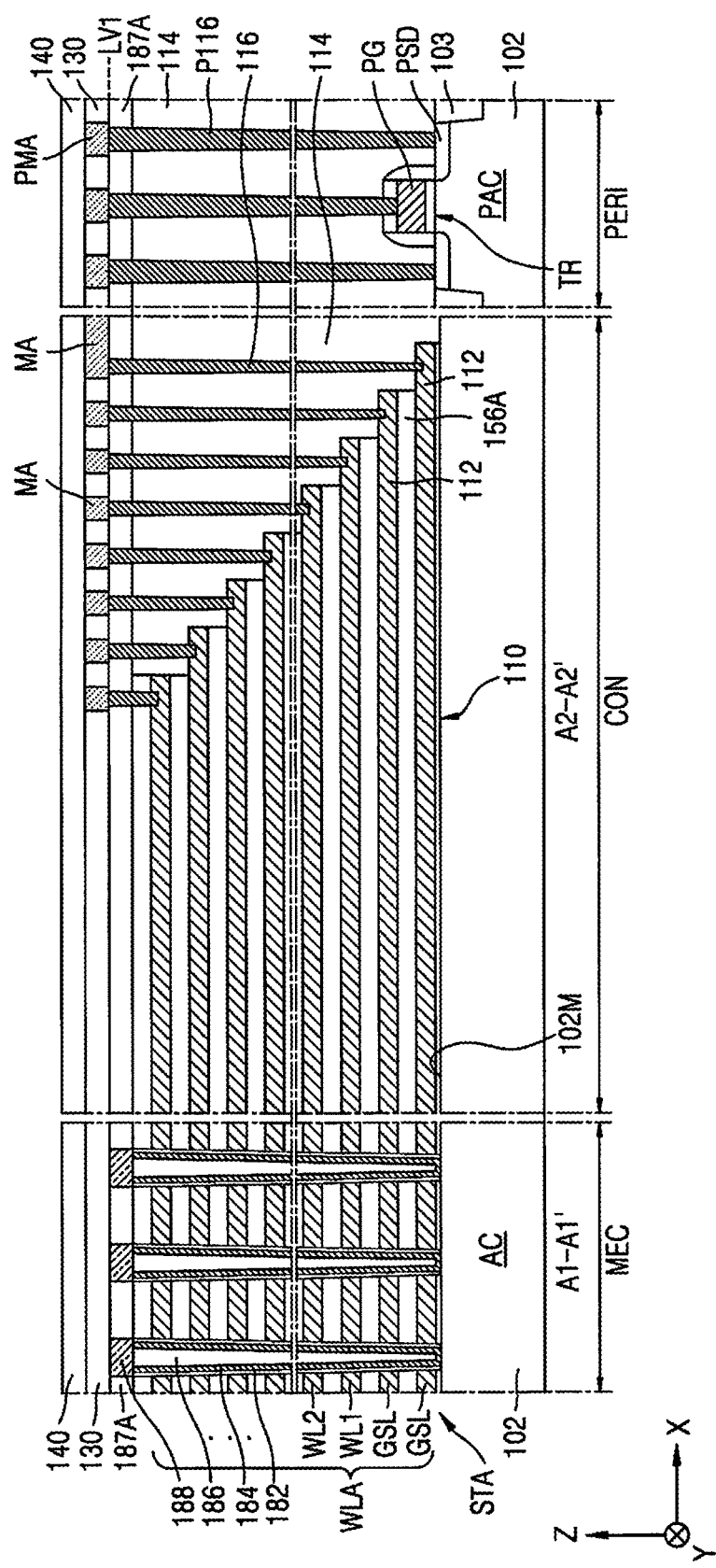

Referring to FIG. 21G, on the result of FIG. 21F, the separate insulating film 140 is formed, e.g. formed with a CVD process, to cover the lower interconnection layers MA and the lower peripheral interconnection layers PMA.

Figure 21H:
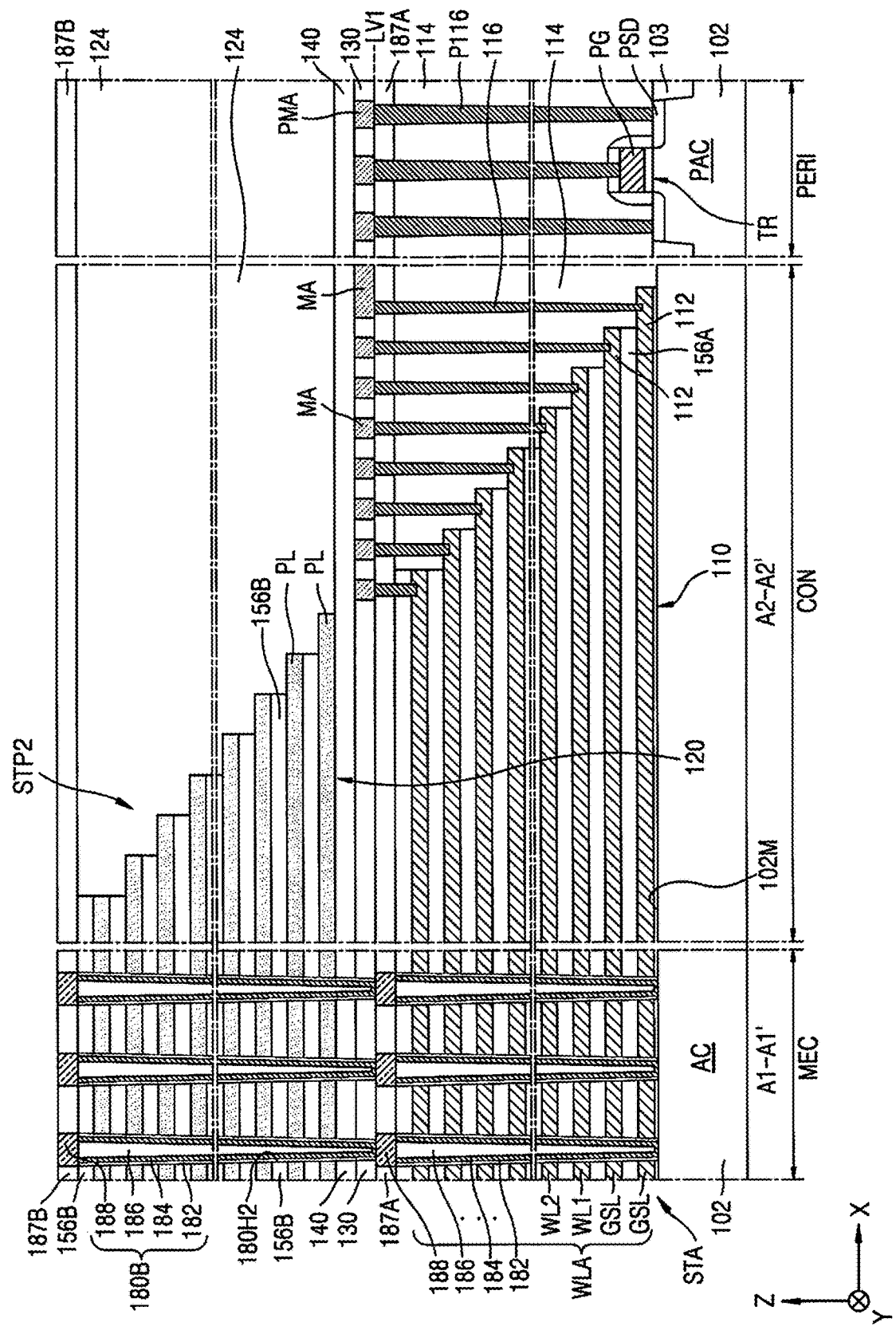

Referring to FIG. 21H, on the result of FIG. 21G, the sacrificial films PL and the insulating film 156B are alternately stacked one by one, and then, a portion of each of the sacrificial films PL and the insulating films 156B is removed so that the sacrificial films PL and the insulating films 156B form an upper stepped structure STP2. Then, the upper insulating film 124 covering the upper stepped structure STP2 and the separate insulating film 140 on the connection region CON, and the separate insulating film 140 on the peripheral circuit region PERI are formed.

On the memory cell region MEC, a plurality of upper channel holes 180H2 extending in the vertical direction (Z direction) through the insulating film 156B, the sacrificial films PL, the separate insulating film 140, and the interlayer insulating film 130, and the gate dielectric film 182, the channel region 184, and the buried insulating film 186 are formed in each of the upper channel holes 180H2 to form a plurality of upper channel hole-filling structures. A method for forming the sacrificial films PL, the upper insulating film 156B, the gate dielectric film 182, the channel region 184, and the buried insulating film 186 may be the same as, or similar to, the process for forming the sacrificial film PL, the lower insulating film 156A, the gate dielectric film 182, the channel region 184, and the buried insulating film 186 described above with reference to FIG. 21B.

Thereafter, in a method the same as, or similar to, those described to form the lower intermediate insulating film 187A and the drain regions 188 described in connection with FIG. 21B, the drain regions 188 contacting the upper channel hole-filling structures through the upper intermediate insulating film 187B and the upper intermediate insulating film 187B are formed to form the upper channel structure 180B.

Figure 21I:
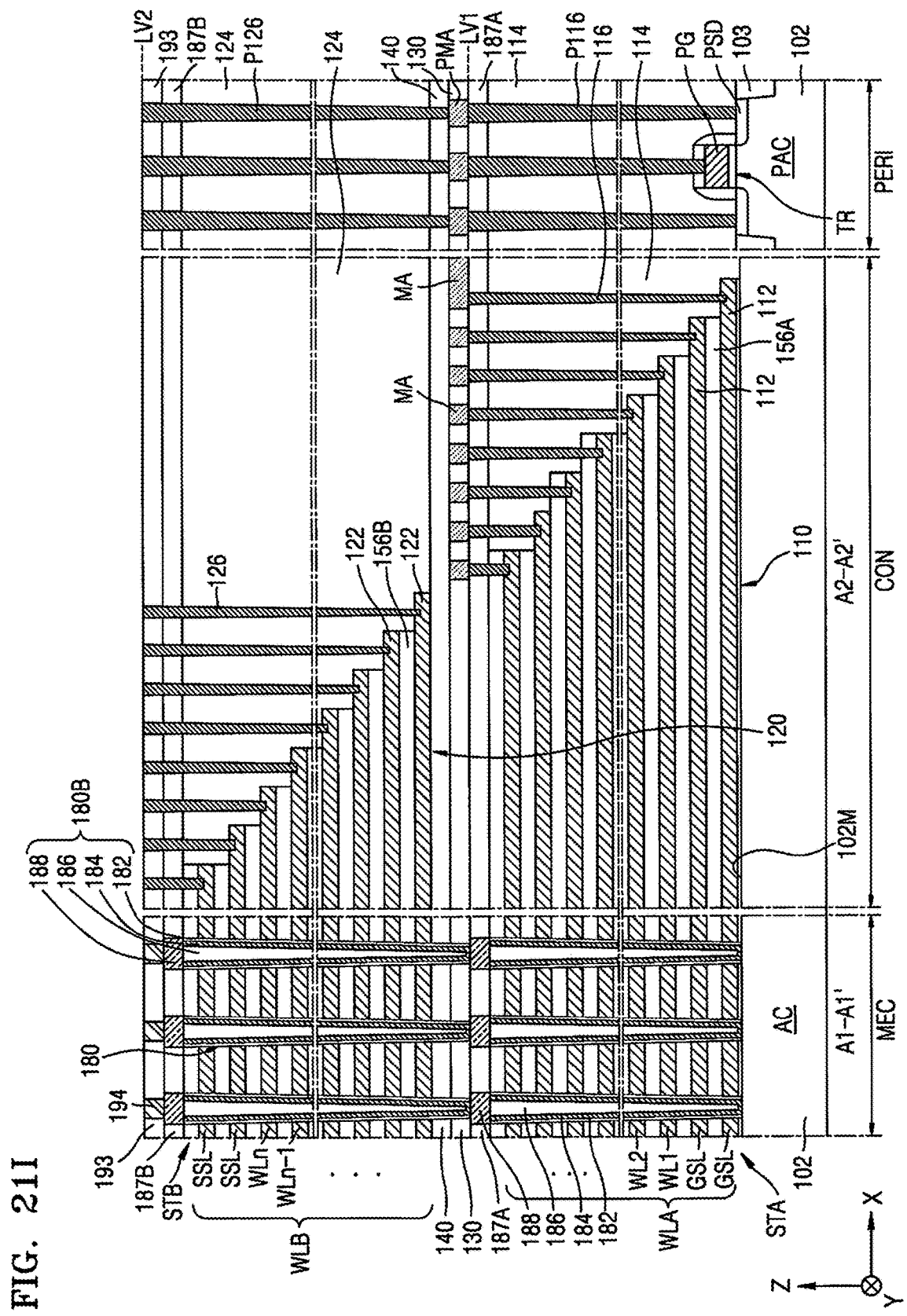

Referring to FIG. 21I, the word line cut regions WLC (see FIGS. 1 and 2B) exposing the lower word line cut structure WCA through the insulating films 156B and the sacrificial films PL (see FIG. 21H) are formed on the lower word line cut structure WCA, and then, according to a method similar to the method used to form the lower word lines WLA described in connection with FIG. 21C, the sacrificial films PL (see FIG. 21H) are replaced with the upper word lines WLB through the word line cut regions WLC. Then, in a method similar to or the same as the method as described to form the lower word line cut structure WCA in connection with FIG. 21C, the upper insulating spacer 192B and the upper common source line CSLB are formed on the lower word line cut structure WCA to form the upper word line cut structure WCB (see FIG. 2B). Materials for forming the upper insulating spacer 192B and the upper common source line CSLB may be the same, or substantially the same as described with the lower insulating spacer 192A and the lower common source line CSLA in connection with FIG. 21C.

Then, the insulating film 193 for covering the drain regions 188 and the upper intermediate insulating film 187B is formed, and the bit line contact pads 194, the upper contact plugs 126, and the upper peripheral contact plugs P126 are formed.

In some example embodiments, the lower contact plugs 116 and the upper peripheral contact plugs P126 may be formed by using a method which is similar to the method used to form the lower contact plugs 116 and the lower peripheral contact plugs P116 in connection with FIGS. 21D and 21E. In some example embodiments, before the bit line contact pads 194 are formed, a lower portion of each of the upper contact plugs 126 and the upper peripheral contact plugs P126 is formed and then, an upper portion of each of the upper contact plugs 126 and the upper peripheral contact plugs P126 and the bit line contact pads 194 may be formed at the same time.

Figure 21J:
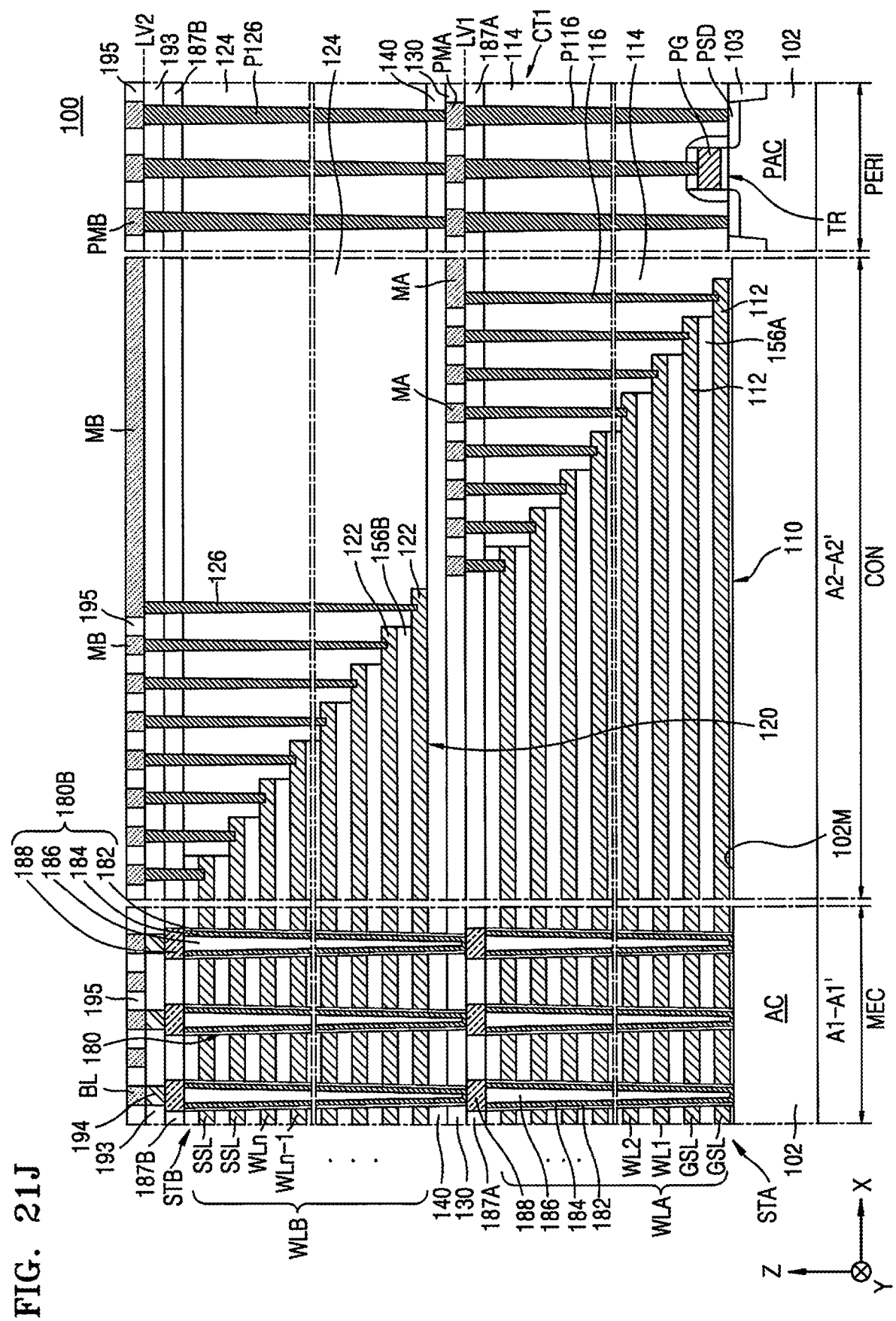

Referring to FIG. 21J, on the memory cell region MEC, the connection region CON, and the peripheral circuit region PERI, the upper interlayer insulating film 195 covering the result of FIG. 21I is formed, and then, the bit lines BL, the upper interconnection layers MB, and the upper peripheral interconnection layers PMB passing through portions of the upper interlayer insulating film 195 are formed.

The method of fabricating the integrated circuit device 100 illustrated in FIGS. 1, 2A, and 2B has been described with reference to FIGS. 21A to 21J. However, it will be understood by those of ordinary skill in the art that various changes and modifications may be made, within the scope of inventive concepts, to produce the integrated circuit devices 200, 300, 400, 500, 600, 700, 800, 900, 1100, 1200, 1300, 1400, and 1500 illustrated in FIGS. 8-20, and integrated circuit devices having various structures with various changes and modifications made thereto within inventive concepts.

For example, in order to form the integrated circuit device 700 illustrated in FIG. 13, the peripheral circuit region PERI7, on which the circuits CT2 are formed on the peripheral circuit board 702, may be formed. The circuits CT2 may include at least one of the transistors TR7, the peripheral circuit interconnection layers 708, and the peripheral circuit contacts 709. The transistors TR7, the peripheral circuit interconnection layers 708, and the peripheral circuit contacts 709 may be covered by the peripheral interlayer insulating film 710.

The substrate 102 is formed on the peripheral circuit region PERI7, and then the through-holes 102H are formed on the substrate 102 and then, the through-holes 102H are filled by the substrate-buried insulating film 712. Then, according to a method which is similar to the method described in connection with FIGS. 21A to 21E, on the memory cell region MEC and connection region CON of the substrate 102, the lower memory stack STA including the stepped lower connection portion 110 is formed, and the lower memory stack through-hole SAH passing through the lower memory stack STA is formed, and then, the lower memory stack through-hole SAH may be filled with the stack-burying insulating film 714. Then, at least one through contact plug P718, the lower contact plugs 116, and the lower peripheral contact plug P716 may be formed at the same time. At least one through contact plug P718 may be formed to be connected to the peripheral circuit interconnection layer 708 through the stack-burying insulating film 714, the substrate-buried insulating film 712, and the peripheral interlayer insulating film 710. The lower peripheral contact plug P716 may be formed to be connected to the peripheral circuit interconnection layer 708 through the lower insulating film 114, the substrate-buried insulating film 712, and the peripheral interlayer insulating film 710.

The interlayer insulating film 130 may be formed on the result in which at least one through contact plug P718, the lower contact plugs 116, and the lower peripheral contact plug P716 are formed. Thereafter, the lower interconnection layers MA7 and the lower peripheral interconnection layer PMA7, each passing through the interlayer insulating film 130, may be formed at the same time. Next, the processes as described with reference to FIGS. 21G to 21J may be performed on the memory cell region MEC and the connection region CON of the substrate 102. Herein, the upper peripheral contact plug P726 and the upper contact plugs 126 may be formed at the same time, and the upper peripheral interconnection layer PMB7 and the upper interconnection layers MB may be formed at the same time.

Figure 22A:
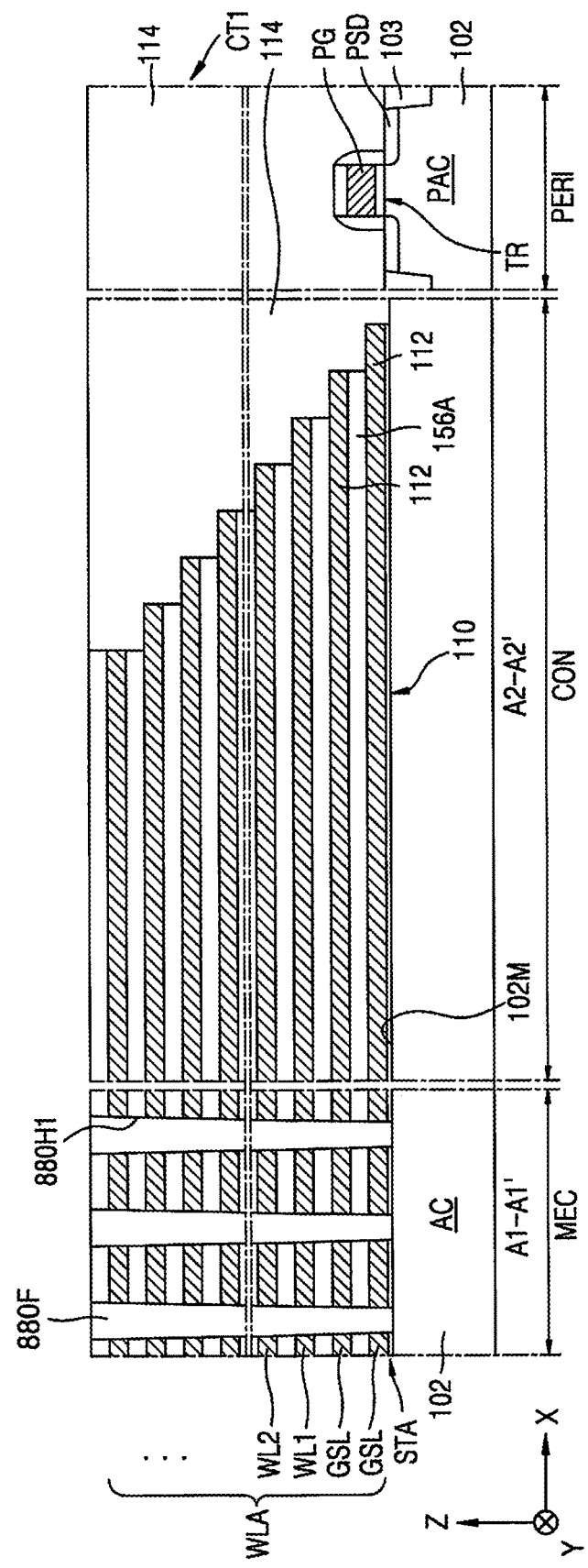
FIGS. 22A and 22B show cross-sectional views illustrated according to a process order to explain a method of fabricating an integrated circuit device according to some example embodiments of inventive concepts.
Figure 22B:
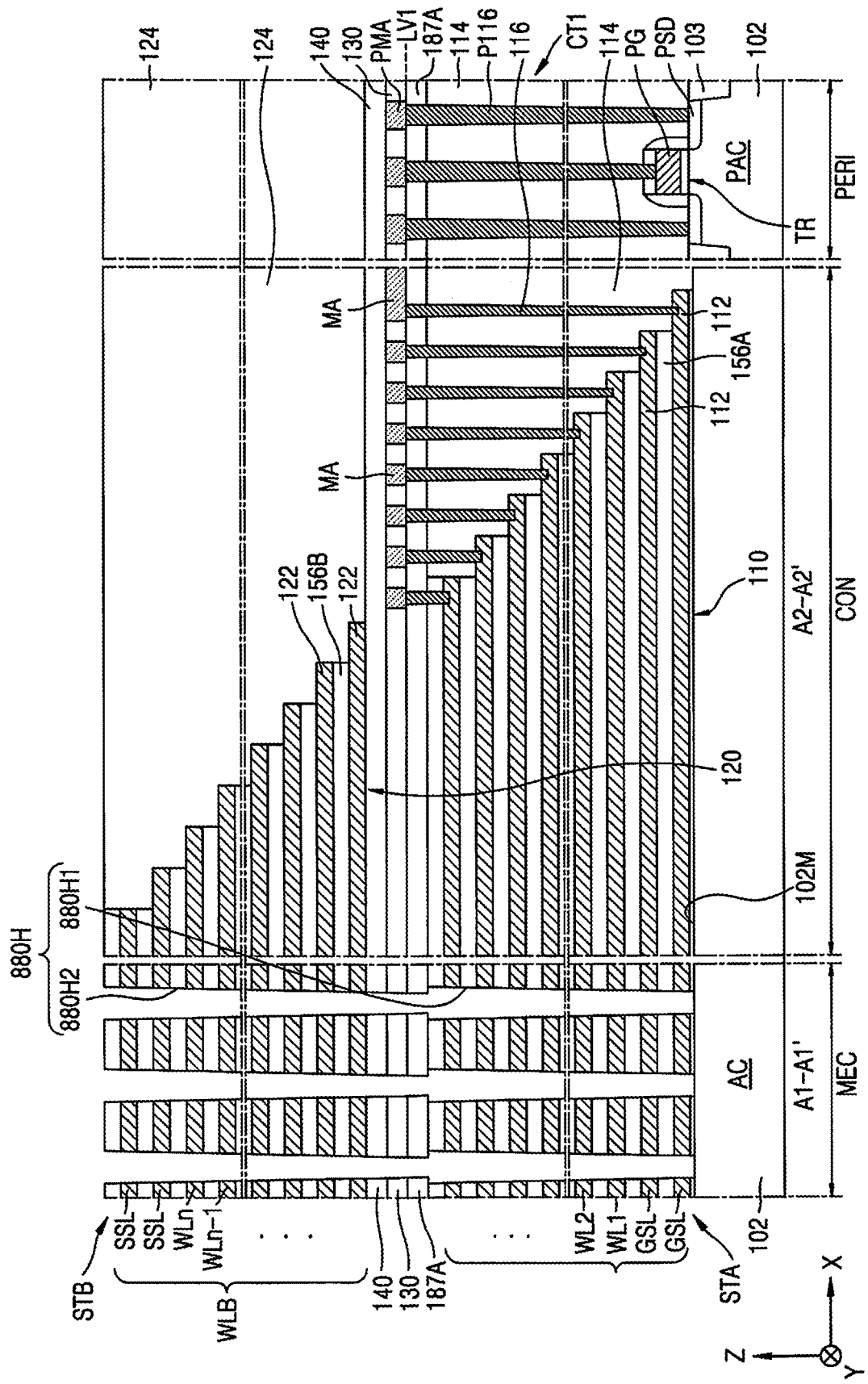

FIGS. 22A and 22B show cross-sectional views sequentially illustrated according to a process order to explain a method of fabricating an integrated circuit device according to some example embodiments of inventive concepts. In this embodiment, the method of fabricating the integrated circuit device 800 illustrated in FIG. 14 will be described as an example.

Referring to FIG. 22A, the active area AC is defined on the memory cell region MEC of the substrate 102 and the peripheral active region PAC is defined on the peripheral circuit region PERI, and then, the lower memory stack STA including the stepped lower connection portion 110 is formed on the connection region CON of the substrate 102, and the peripheral transistor TR is formed on the peripheral circuit region PERI, and the lower insulating film 114 covering the lower memory stack STA and the peripheral transistor TR may be formed.

On the memory cell region MEC, a plurality of lower channel holes 880H1 passing through the lower memory stack STA are formed, and the lower channel holes 880H1 may be filled with a sacrificial layer 880F. In some example embodiments, the sacrificial layer 880F may include silicon oxide, but is not limited thereto. In some example embodiments, the lower word lines WLA constituting, or included in, the lower memory stack STA may include a metal silicide film. To form such a structure, after the lower channel holes 880H1 is formed and before the lower channel holes 880H1 is filled with the sacrificial layer 880F, a silicidation process for forming a metal silicide film may be additionally performed.

Referring to FIG. 22B, after the lower intermediate insulating film 187A is formed on the result of FIG. 22A, the lower contact plugs 116, the lower peripheral contact plugs P116, the lower interconnection layers MA, and the lower peripheral interconnection layers PMA may be formed by using a method which is similar to the method described in connection with FIGS. 21D to 21F. Thereafter, by using a method which is similar to the method described in connection with FIG. 21G, the separate insulating film 140 covering the lower interconnection layers MA and the lower peripheral interconnection layers PMA may be formed.

Then, on the separate insulating film 140, the upper memory stack STB including the stepped upper connection portion 120 and the upper insulating film 124 covering the stepped upper connection portion 120 may be formed. On the memory cell region MEC, a plurality of upper channel holes 880H2 passing through the upper memory stack STB, the separate insulating film 140, the interlayer insulating film 130, and the lower intermediate insulating film 187A are formed, and the sacrificial layer 880F is removed through the upper channel holes 180H2 to form a plurality of channel holes 880H including the lower channel holes 880H1 and the upper channel holes 880H2. The horizontal width of each of the lower channel holes 880H1 and the upper channel holes 880H2 may be increased further away from the substrate 102. The horizontal width of the lowermost portion of each of the upper channel holes 880H2 may be smaller than the horizontal width of the lowermost portion of each of the lower channel holes 880H1.

The gate dielectric film 182, the channel region 184, and the buried insulating film 186 are formed in each of the channel holes 880H, and the process described in connection with FIGS. 21H to 21J may be performed thereon to manufacture the integrated circuit device 800 illustrated in FIG. 14.

Processes similar to those described with reference to FIGS. 21A to 21J may be performed to fabricate the integrated circuit device 900 illustrated in FIG. 15. For example, a lower structure including the lower memory stack STA, the lower contact plugs 116, and the lower interconnection layers MA may be formed on the substrate 102. In order to form the lower structure, after the processes described with reference to FIGS. 21A to 21E are performed, the interlayer insulating film 130, and the lower interconnection layers MA and the lower peripheral interconnection layers PMA passing through the interlayer insulating film 130 may be formed by using the method described in connection with FIG. 21F. Accordingly, during the lower interconnection layers MA and the lower peripheral interconnection layers PMA are formed, the contact pads 194C passing through the interlayer insulating film 130 may be formed on the memory cell region MEC. Then, the separate insulating film 140 covering the contact pads 194C may be formed by using a method that is similar to the method described with reference to FIG. 21G, and then, the conductive lines 990 passing through the separate insulating film 140 may be formed on the memory cell region MEC.

Alternatively or additionally, the through-hole 902H is formed on the bonding substrate 902, and the through-hole 902H is filled with the buried insulating film 912, and then, an upper structure including the upper memory stack STB may be formed on the bonding substrate 902. To form the upper structure, after the upper base insulating film 940 is formed on the bonding substrate 902, the processes described with reference to FIGS. 21H to 21J may be performed on the result in which the upper base insulating film 940 is formed. In this case, however, before the bit line contact pads 194, the upper contact plugs 126, and the upper peripheral contact plugs P126 are formed, the lower structure on the substrate 102 may be bonded on the bonding substrate 902 by using the bonding layer BDL. After the bit line contact pads 194, the upper contact plugs 126, and the upper peripheral contact plugs P126 are formed on the result in which the lower structure is bonded on the bonding substrate 902, the processes described in connection with FIG. 21J are performed thereon to complete the manufacture of the integrated circuit device 900 illustrated in FIG. 15.

In some example embodiments, the process for forming the upper peripheral contact plugs P126 through the bonding substrate 902 and the bonding layer BDL on the peripheral circuit region PERI may be skipped. In this case, the process for bonding the upper structure formed on the substrate 102 on the bonding substrate 902 by using the bonding layer BDL may be performed after the upper interconnection layers MB are formed.

According to the methods of manufacturing the integrated circuit devices according to inventive concepts described with reference to FIGS. 21A to 22B, since lower and upper memory stacks STA and STB are separated along the vertical direction, and a contact plug and interconnection connected to the lower memory stack STA and a contact plug and interconnection connected to the upper memory stack STB are formed at a plurality of different vertical levels, even when the number of lower word lines WLA and the number of upper word lines WLB are increased to manufacture a highly-integrated vertical memory device, an appropriate aspect ratio, and/or an appropriate range heights of lower contact plugs 116 and/or an appropriate range of heights of upper contact plugs 126, may be maintained during the etching process for forming a contact hole, so the process difficulty is not increased, and the process for forming contact plugs and the process for forming interconnections may be performed in a simple and/or efficient method. Alternatively or additionally, problems caused by the collapse of lower word lines WLA and upper word lines WLB during the manufacture of an integrated circuit device may be prevented or reduced in likelihood of occurrence, leading to higher manufacturing efficiency and lower manufacturing costs of integrated circuit devices.

While inventive concepts has been particularly shown and described with reference to embodiments thereof, it will be understood that various changes in form and details may be made therein without departing from the spirit and scope of the following claims.

What is claimed is:

1. An integrated circuit device comprising:
    a substrate including a memory cell region and a connection region;
    a lower memory stack including a plurality of lower word lines on the memory cell region and the connection region, the plurality of lower word lines extending in a horizontal direction parallel to a main surface of the substrate, the plurality of lower word lines overlapping each other in a vertical direction;
    an upper memory stack on the lower memory stack, the upper memory stack comprising a plurality of upper word lines overlapping each other in the vertical direction;
    at least one first lower interconnection layer on the connection region at a first vertical level between the lower memory stack and the upper memory stack, the at least one first lower interconnection layer extending in the horizontal direction, and configured to electrically connect to at least one lower word line selected from the plurality of lower word lines;
    a separate insulating film covering at least one first lower interconnection layer such that an upper surface of the at least one first lower interconnection layer does not contact other conductors on the connection region; and
    at least one first upper interconnection layer on the connection region at a second vertical level higher than that of the upper memory stack, the at least one first upper interconnection layer extending, in the horizontal direction, the at least one first upper interconnection layer configured to be electrically connected to at least one upper word line selected from the plurality of upper word lines.

2. The integrated circuit device of claim 1, wherein the separate insulating film extends continuously in the horizontal direction in a local region, the local region including the separate insulating film overlapping vertically with the at least one first lower interconnection layer.

3. The integrated circuit device of claim 1, further comprising:
    at least one second upper interconnection layer extending on the connection region in the horizontal direction at the second vertical level, the at least one second upper interconnection layer configured to connect to the at least one lower word line selected from the plurality of lower word lines.

4. The integrated circuit device of claim 1, wherein,
    the lower memory stack includes a stepped lower connection portion connected to the plurality of lower word lines,
    the upper memory stack includes a stepped upper connection portion connected to the plurality of upper word lines, and
    at least a portion of the stepped upper connection portion is between the at least one first lower interconnection layer and the at least one first upper interconnection layer.

5. The integrated circuit device of claim 1, wherein,
    in the horizontal direction, a first area of a first region occupied by the lower memory stack is greater than a second area of a second region occupied by the upper memory stack.

6. The integrated circuit device of claim 1, wherein,
    in the horizontal direction, a first area of a first region occupied by the lower memory stack is substantially less than a second area of a second region occupied by the upper memory stack.

7. The integrated circuit device of claim 1, wherein,
    the upper memory stack includes a portion protruding further from the memory cell region than the lower memory stack, and
    the upper memory stack includes a portion overlapping vertically with the at least one first lower interconnection layer.

8. The integrated circuit device of claim 1, wherein,
    the substrate further includes a peripheral circuit region, and
    the at least one first lower interconnection layer comprises,
    a first local portion connected to at least one lower word line of the plurality of lower word lines through a first lower contact plug on the connection region, and
    a second local portion connected to one of a plurality of circuits formed on the peripheral circuit region.

9. The integrated circuit device of claim 1, further comprising:

a peripheral circuit region including a peripheral circuit interconnection layer, the peripheral circuit region facing the lower memory stack with the substrate therebetween;

a through contact plug extending in the vertical direction through the lower memory stack and the substrate to the peripheral circuit interconnection layer; and a second lower interconnection layer extending in the horizontal direction between the lower memory stack and the upper memory stack at the first vertical level, the second lower interconnection layer contacting an upper surface of the through contact plug.

10. An integrated circuit device comprising:

a substrate including a memory cell region and a connection region;

a peripheral circuit region spaced apart from the memory cell region and including a plurality of circuits;

a lower memory stack including (i) a plurality of lower word lines on the memory cell region extending in a horizontal direction parallel to a main surface of the substrate, the plurality of lower word lines overlapping each other in a vertical direction, and (ii) a plurality of lower pad regions connected to the plurality of lower word lines and corresponding to a stepped lower connection portion on the connection region;

an upper memory stack located above the lower memory stack on the memory cell region and including (i) a plurality of upper word lines extending in the horizontal direction and overlapping each other in the vertical direction, and (ii) a plurality of upper pad regions connected to the plurality of upper word lines and corresponding to a stepped upper connection portion on the connection region;

a lower insulating film on the connection region, the lower insulating film covering the stepped lower connection portion;

a plurality of lower contact plugs extending through the lower insulating film from the plurality of lower pad regions to a first vertical level, the first vertical level lower than the upper memory stack; and a plurality of first lower interconnection layers between the lower memory stack and the upper memory stack, wherein at least one first lower interconnection layer selected from the plurality of first lower interconnection layers includes (i) a first local portion connected to at least one of the plurality of lower contact plugs and (ii) a second local portion connected to at least one of the plurality of circuits.

11. The integrated circuit device of claim 10, further comprising:

a separate insulating film between the lower memory stack and the upper memory stack, the separate insulating film covering an upper surface of each of the plurality of first lower interconnection layers;

an upper insulating film on the connection region, the upper insulating film covering the separate insulating film, a plurality of upper contact plugs in the connection region, the plurality of upper contact plugs passing through the upper insulating film; and a plurality of first upper interconnection layers connected to the plurality of upper contact plugs and extending in the horizontal direction at a second vertical level, wherein the plurality of upper contact plugs connect to at least one of the plurality of upper pad regions, and wherein, in the connection region, the plurality of upper contact plugs do not pass through the separate insulating film and are not connected to the plurality of first lower interconnection layers.

12. The integrated circuit device of claim 10, wherein, at least a portion of the stepped lower connection portion is between the substrate and the stepped upper connection portion, and at least one of the plurality of first lower interconnection layers overlaps vertically with the stepped upper connection portion.

13. The integrated circuit device of claim 10, wherein, the plurality of circuits are formed at a level which is higher than or equal to than that of the substrate, and one circuit selected from the plurality of circuits includes, (i) a lower peripheral contact plug extending to the first vertical level through the lower insulating film on the peripheral circuit region, and (ii) a lower peripheral interconnection layer located at the first vertical level and connected to the lower peripheral contact plug on the peripheral circuit region, wherein the lower peripheral interconnection layer includes a first local portion connected to the lower peripheral contact plug and a second local portion connected to another circuit selected from the plurality of circuits.

14. The integrated circuit device of claim 10, wherein, the plurality of circuits includes a peripheral circuit interconnection layer facing the lower memory stack with the substrate therebetween, and the integrated circuit device further comprises a through contact plug extending in the vertical direction through each of the lower memory stack and the substrate, the through contact plug connected between (i) at least one first lower interconnection layer selected from the plurality of first lower interconnection layers and (ii) the peripheral circuit interconnection layer.

15. The integrated circuit device of claim 10, further comprising:

a channel structure extending in the vertical direction through the plurality of lower word lines and the plurality of upper word lines on the memory cell region, wherein the channel structure includes a lower channel structure passing through the plurality of lower word lines and a upper channel structure passing through the plurality of upper word lines, wherein a lower surface of the upper channel structure contacts an upper surface of the lower channel structure, and in the horizontal direction, a width of the lower surface of the upper channel structure is smaller than a width of the upper surface of the lower channel structure.

16. The integrated circuit device of claim 10, further comprising:

a plurality of word line cut regions extending in a first horizontal direction, the plurality of word line cut regions defining a width of each of the plurality of lower word lines and the plurality of upper word lines in a second horizontal direction perpendicular to the first horizontal direction; and a plurality of word line cut structures filling the plurality of word line cut regions, wherein the plurality of word line cut structures include a lower word line cut structure passing through the lower memory stack and an upper word line cut structure overlapping vertically with the lower word line cut region and passing through the upper memory stack, and in the second horizontal direction, a width of a lower surface of the upper word line cut structure is less than a width of an upper surface of the lower word line cut structure.

17. An integrated circuit device comprising:
a first substrate including a memory cell region and a connection region;
a lower memory stack including (i) a plurality of lower word lines extending in a horizontal direction parallel to a main surface of the first substrate on the memory cell region, the plurality of lower word lines overlapping each other in a vertical direction, and (ii) a plurality of lower pad regions on the connection region, the plurality of lower pad regions connected to the plurality of lower word lines; and
an upper memory stack on the lower memory stack, the upper memory stack including (i) a plurality of upper word lines on the memory cell region and overlapping each other in the vertical direction, and (ii) a plurality of upper pad regions connected to the plurality of upper word lines and located on the connection region, wherein
at least one first lower interconnection layer extends in the horizontal direction at a first vertical level between the lower memory stack and the upper memory stack on the connection region,
at least one lower contact plug connects between at least one lower pad region selected from the plurality of lower pad regions and the at least one first lower interconnection layer, and
a separate insulating film covers the at least one first lower interconnection layer such that an upper surface of the at least one first lower interconnection layer does not contact other conductors on the connection region.

18. The integrated circuit device of claim 17, further comprising:
an upper insulating film covering the separate insulating film and the plurality of upper pad regions on the connection region;
at least one upper interconnection layer on the connection region extending in the horizontal direction at a second vertical level higher than the upper memory stack; and
at least one upper contact plug passing through the upper insulating film and connecting between at least one upper pad region selected from the plurality of upper pad regions and the at least one upper interconnection layer,
wherein the upper insulating film includes a local region vertically overlapping the at least one lower interconnection layer, and the local region includes an insulating region through which the at least one upper interconnection layer does not pass.

19. The integrated circuit device of claim 17, further comprising:
a peripheral circuit region spaced apart from the memory cell region and including a plurality of circuits,
wherein the at least one first lower interconnection layer includes,
a first local portion connecting to the at least one lower contact plug on the connection region, and
a second local portion connecting to one circuit of the plurality of circuits.

20. The integrated circuit device of claim 17, wherein,
an area occupied by the upper memory stack is substantially greater than or equal to an area occupied by the lower memory stack.

* * * * *